(12) United States Patent
Lim et al.

(10) Patent No.: US 12,534,518 B2
(45) Date of Patent: Jan. 27, 2026

(54) FUSION PROTEIN COMPRISING ANTI-MESOTHELIN ANTIBODY, ANTI-CD3 ANTIBODY OR ANTI-EGFR ANTIBODY, BISPECIFIC OR TRISPECIFIC ANTIBODY COMPRISING SAME, AND USES THEREOF

(71) Applicants: GREEN CROSS CORPORATION, Yongin-si (KR); MOGAM INSTITUTE FOR BIOMEDICAL RESEARCH, Yongin-si (KR)

(72) Inventors: Yangmi Lim, Yongin-si (KR); Shinai Lee, Yongin-si (KR); Jonghwa Won, Yongin-si (KR); Yong-Yea Park, Yongin-si (KR); Aerin Yoon, Yongin-si (KR); Sua Lee, Yongin-si (KR); Okjae Lim, Yongin-si (KR); Sojung Lim, Yongin-si (KR); Munkyung Kim, Yongin-si (KR)

(73) Assignees: GREEN CROSS CORPORATION, Yongin-si (KR); MOGAM INSTITUTE FOR BIOMEDICAL RESEARCH, Yongin-si (KR)

( * ) Notice: Subject to any disclaimer, the term of this patent is extended or adjusted under 35 U.S.C. 154(b) by 1139 days.

(21) Appl. No.: 17/439,974

(22) PCT Filed: Dec. 16, 2019

(86) PCT No.: PCT/KR2019/017809
§ 371 (c)(1),
(2) Date: Sep. 16, 2021

(87) PCT Pub. No.: WO2020/204305
PCT Pub. Date: Oct. 8, 2020

(65) Prior Publication Data
US 2022/0251176 A1    Aug. 11, 2022

Related U.S. Application Data

(60) Provisional application No. 62/826,442, filed on Mar. 29, 2019.

(51) Int. Cl.
*C07K 16/18* (2006.01)
*A61K 39/00* (2006.01)
*A61P 35/00* (2006.01)
*C07K 16/28* (2006.01)

(52) U.S. Cl.
CPC ............. *C07K 16/18* (2013.01); *A61P 35/00* (2018.01); *C07K 16/2809* (2013.01); *C07K 16/2863* (2013.01); *A61K 2039/505* (2013.01); *C07K 2317/31* (2013.01); *C07K 2317/522* (2013.01); *C07K 2317/565* (2013.01); *C07K 2317/73* (2013.01); *C07K 2317/92* (2013.01); *C07K 2319/30* (2013.01)

(58) Field of Classification Search
CPC .......................... A61P 35/00; C07K 2317/31
See application file for complete search history.

(56) References Cited

U.S. PATENT DOCUMENTS

| | | | |
|---|---|---|---|
| 9,416,190 B2 | 8/2016 | Ho et al. | |
| 9,708,412 B2 | 7/2017 | Baeuerle et al. | |
| 2013/0078249 A1* | 3/2013 | Ast | C07K 16/3007 435/69.6 |
| 2014/0242080 A1 | 8/2014 | Jaeger et al. | |
| 2017/0096485 A1* | 4/2017 | Bacac | C07K 16/2809 |
| 2018/0072809 A1 | 3/2018 | Hemminki et al. | |
| 2019/0119383 A1 | 4/2019 | Bruenker et al. | |
| 2020/0148757 A1 | 5/2020 | Kim et al. | |
| 2020/0262928 A1* | 8/2020 | Kim | C07K 16/3076 |

FOREIGN PATENT DOCUMENTS

| | | |
|---|---|---|
| CA | 3 012 422 A1 | 9/2017 |
| JP | 2015-531751 A | 11/2015 |
| JP | 2017-529067 A | 10/2017 |
| JP | 2018-532401 A | 11/2018 |
| KR | 10-2008-0077261 A | 8/2008 |
| KR | 10-2018-0037950 A | 4/2018 |
| MX | 2018011542 A | 2/2019 |
| WO | 96/40210 A1 | 12/1996 |
| WO | 2014/018572 A2 | 1/2014 |
| WO | 2016/020444 A1 | 2/2016 |
| WO | 2017/021356 A1 | 2/2017 |
| WO | 2017/052241 A1 | 3/2017 |

(Continued)

OTHER PUBLICATIONS

Lutterbuese, Ralf, et al. "T cell-engaging BiTE antibodies specific for EGFR potently eliminate KRAS-and BRAF-mutated colorectal cancer cells." Proceedings of the National Academy of Sciences 107(28) (2010): 12605-12610. (Year: 2010).*
DrugBank ID: DB00002; Cetuximab; URL: https://go.drugbank.com/drugs/DB00002; first available Jun. 13, 2005; Accessed Apr. 2, 2025. (Year: 2005).*
https://www.novoprolabs.com/support/articles/commonly-used-leader-peptide-sequences-for-efficient-secretion-of-a-recombinant-protein-expressed-in-mammalian-cells-2018042113; first available Apr. 21, 2018; Accessed Apr. 1, 2025. (Year: 2018).*
Poteet, Ethan, et al. "Mesothelin and TGF-Î± predict pancreatic cancer cell sensitivity to EGFR inhibitors and effective combination treatment with trametinib." PloS one 14.3 (2019): e0213294. (Year: 2019).*

(Continued)

*Primary Examiner* — Julie Wu
*Assistant Examiner* — Bryan William Heck
(74) *Attorney, Agent, or Firm* — Sughrue Mion, PLLC

(57) ABSTRACT

A fusion protein including a fragment of an anti-mesothelin antibody, an anti-CD3 antibody or an anti-EGFR antibody; a bispecific antibody that is specific to mesothelin and CD3; a trispecific antibody that is specific to mesothelin, CD3 and EGFR are provided. The fusion protein is effective in treating cancer. The bispecific or trispecific antibody can be prepared in a high yield and with high purity, and has excellent tumor killing and growth inhibitory effects, and thus can be effectively used in cancer treatment.

5 Claims, 15 Drawing Sheets

Specification includes a Sequence Listing.

(56) References Cited

FOREIGN PATENT DOCUMENTS

| WO | 2017/125897 A1 | 7/2017 | |
| WO | 2018/045090 A1 | 3/2018 | |
| WO | WO-2018199593 A1 * | 11/2018 | ............. A61K 47/68 |
| WO | 2019/004799 A1 | 1/2019 | |
| WO | WO-2019078698 A2 * | 4/2019 | ........... A61K 39/395 |

OTHER PUBLICATIONS

Sequence Listing corresponding to WO 2018/199593 A1 (Year: 2018).*
Machine Translation of WO 2018/199593 A1; Generated Apr. 2, 2025 with WIPO Translate. (Year: 2018).*
Brinkmann et al., "The making of bispecific antibodies", MABS, 2017, vol. 9, No. 2, pp. 182-212 (31 pages).
Ji-Hee Ha et al., "Immunoglobulin Fc Heterodimer Platform Technology: From Design to Applications in Therapeutic Antibodies and Proteins", Frontiers in Immunology, Oct. 2016, vol. 7, Article 394, pp. 1-16 (16 pages).
International Search Report for PCT/KR2019/017809 dated Apr. 21, 2020.
Written Opinion for PCT/KR2019/017809 dated Apr. 21, 2020.
Reusch et al., "Anti-CD3 Anti-Epidermal Growth Factor Receptor (EGFR) Bispecific Antibody Redirects T-Cell Cytolytic Activity to EGFR-Positive Cancers In vitro and in an Animal Model", Clin Cancer Res., 2006, 183, 12(1), Jan. 1, 2006, 183-190.

* cited by examiner

[FIG. 1]
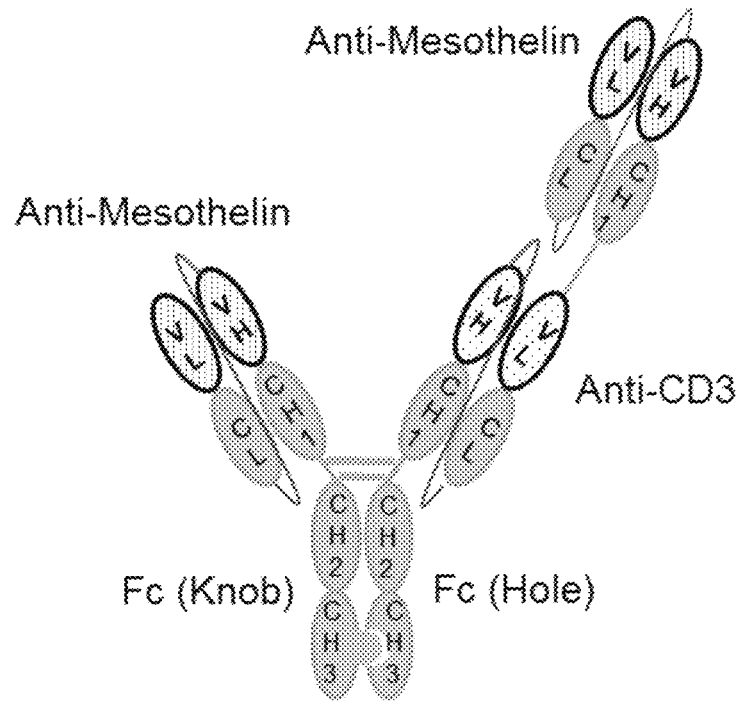
[FIG. 2]
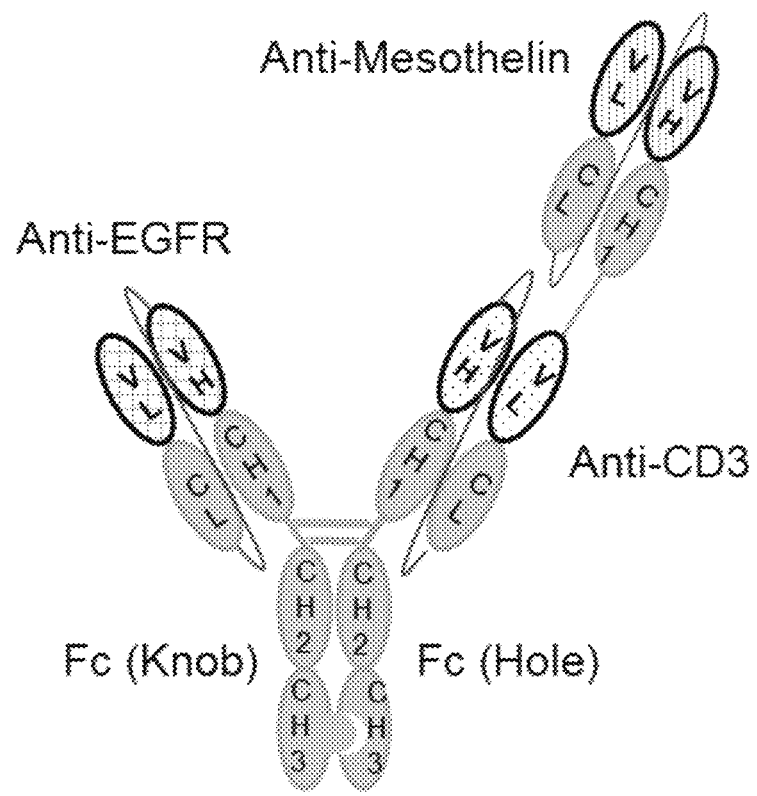

[FIG. 3]
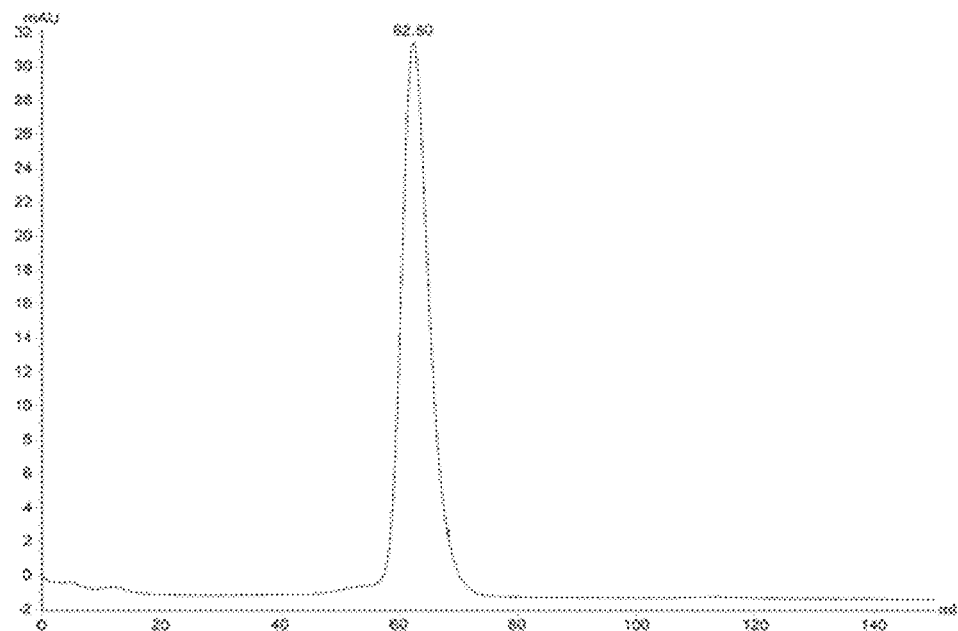
[FIG. 4]
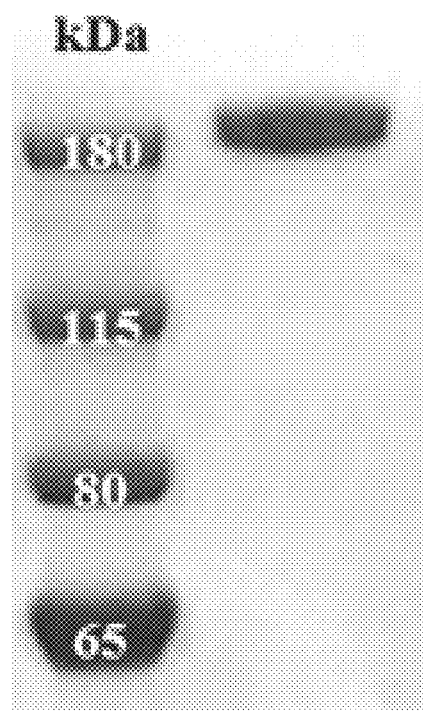

[FIG. 5]
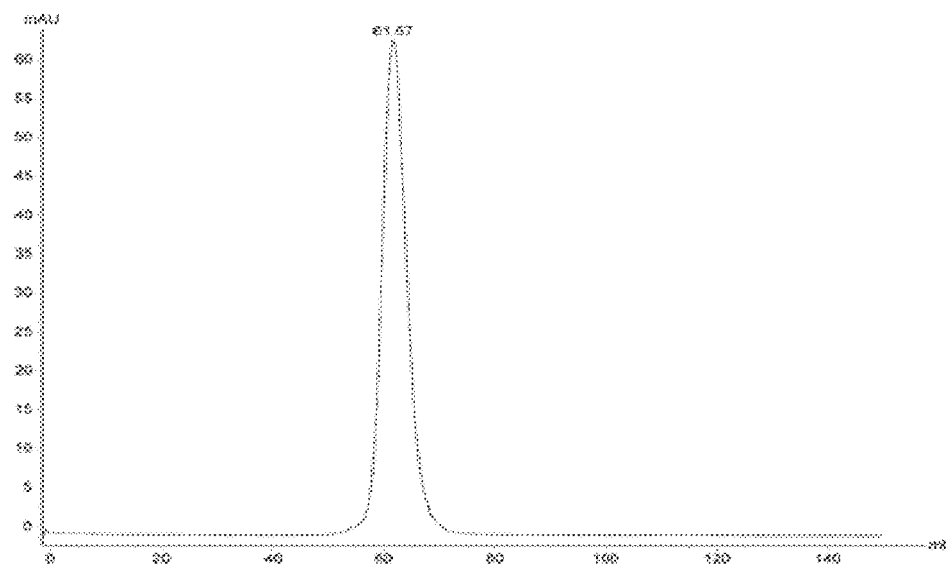
[FIG. 6]
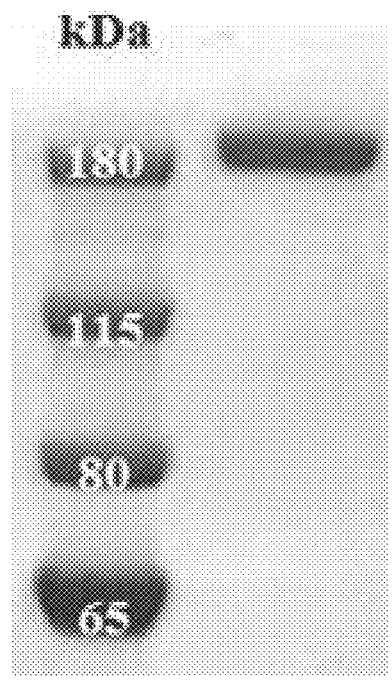

[FIG. 7]
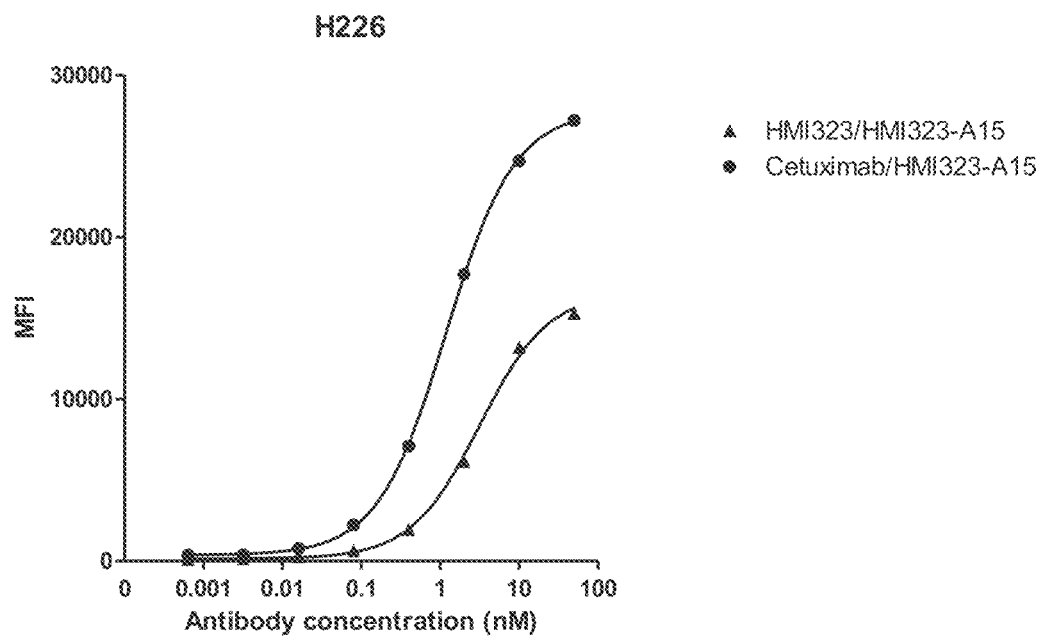
[FIG. 8]
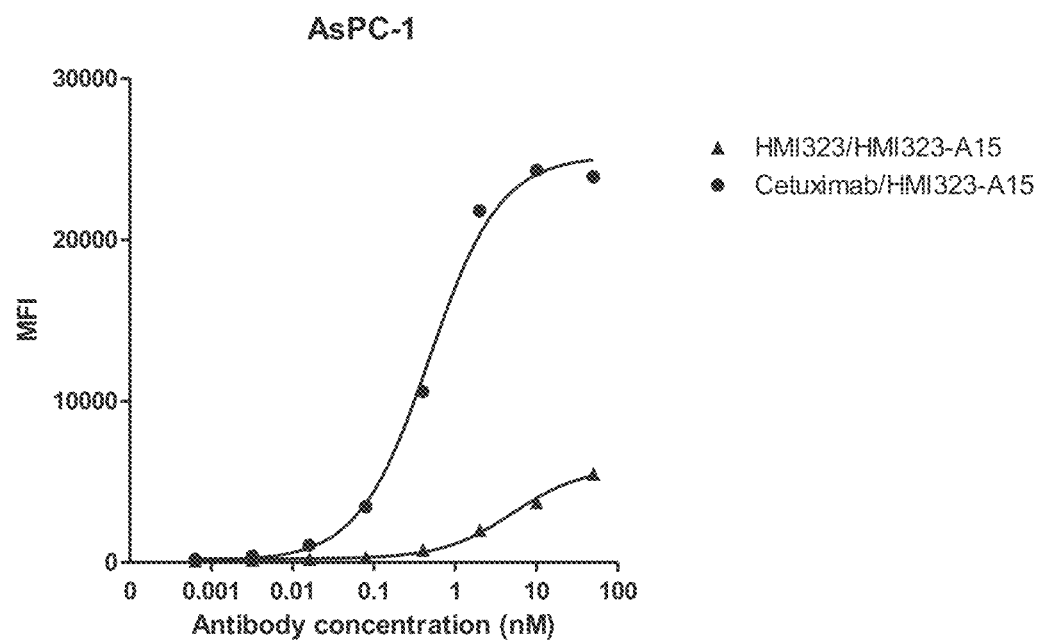

[FIG. 9]
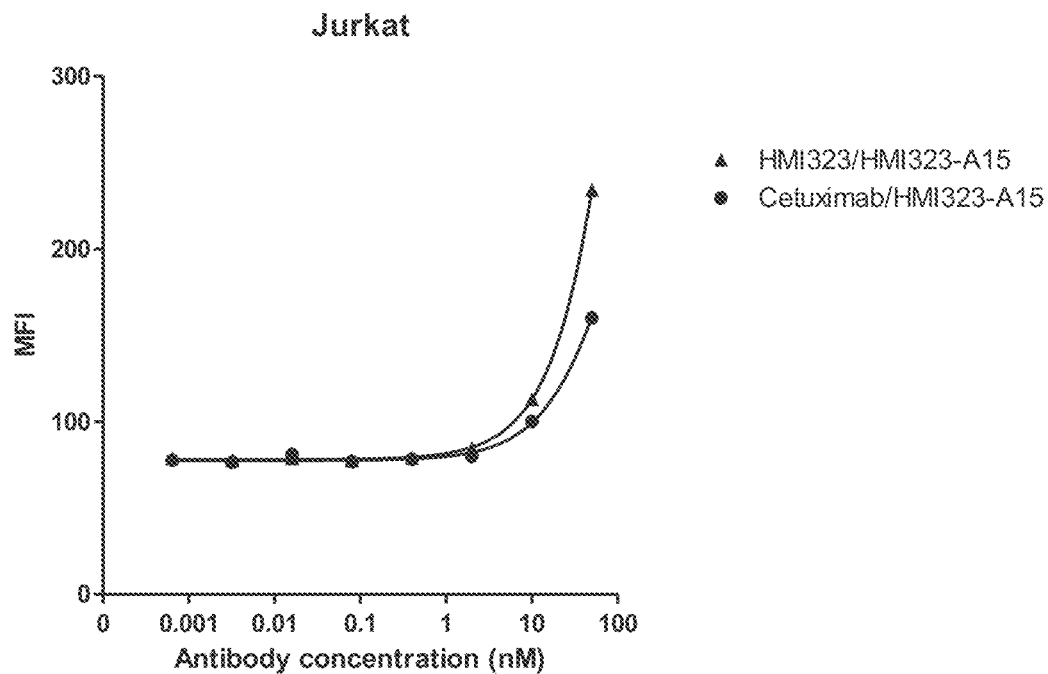
[FIG. 10]
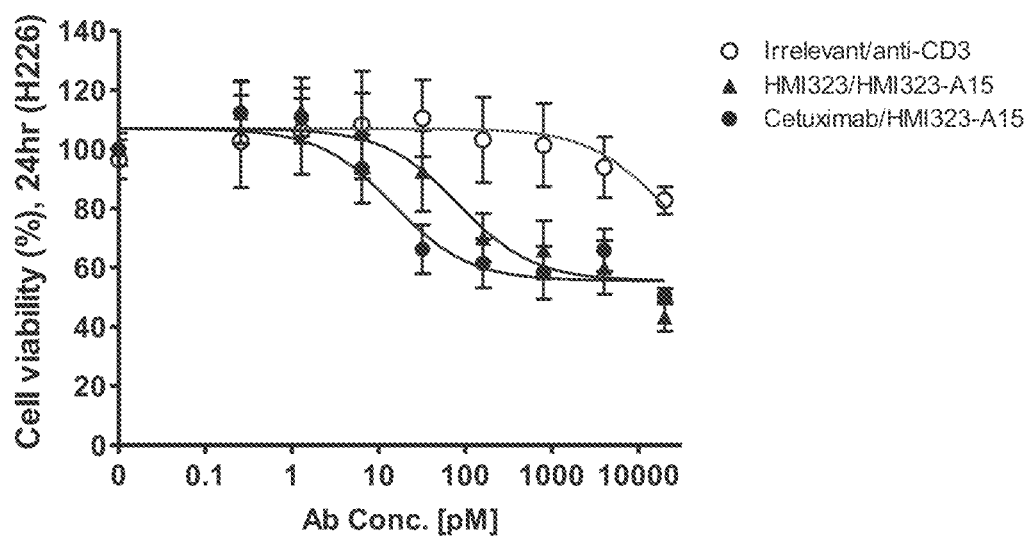

[FIG. 11]
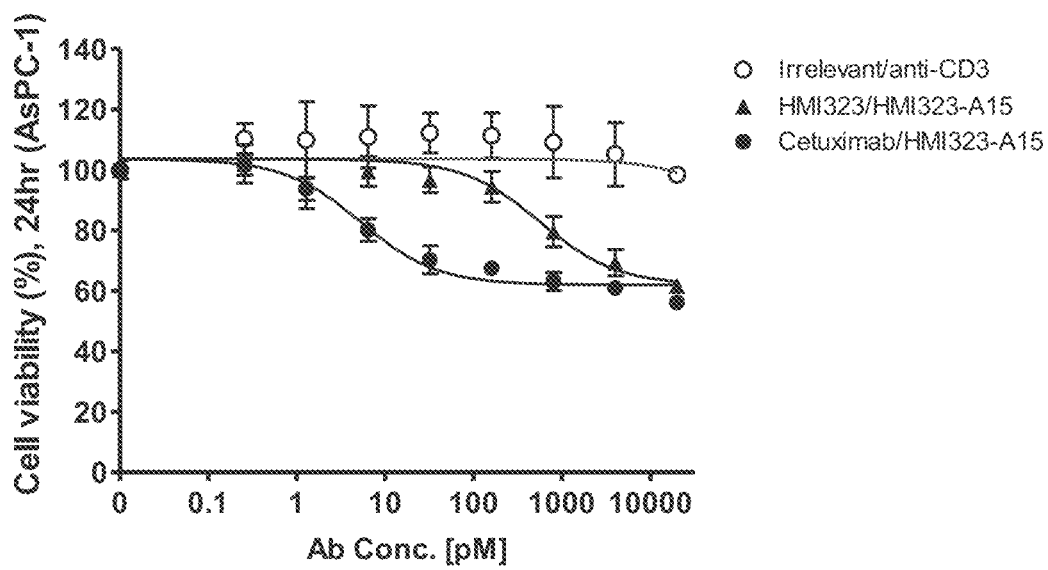
[FIG. 12]
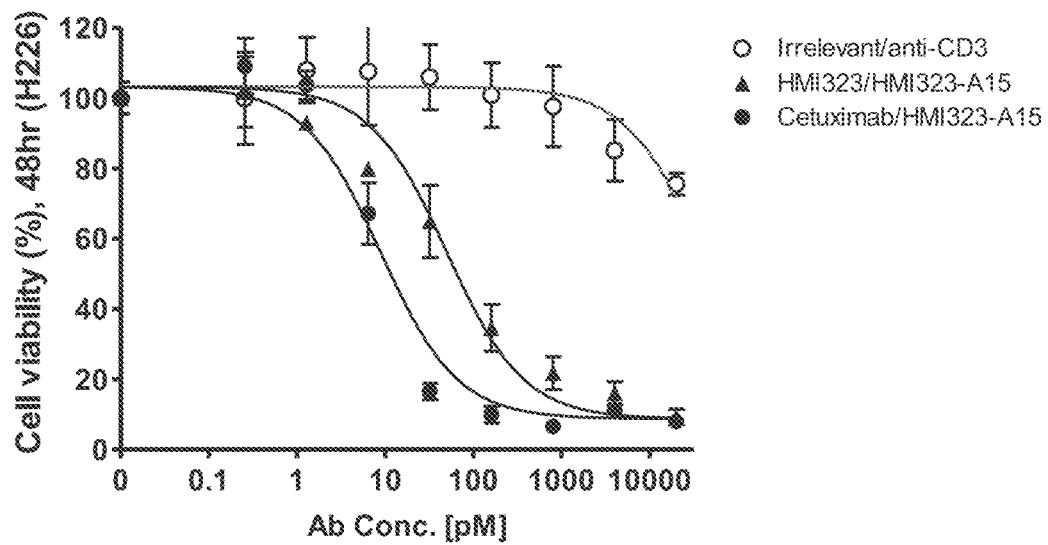

[FIG. 13]
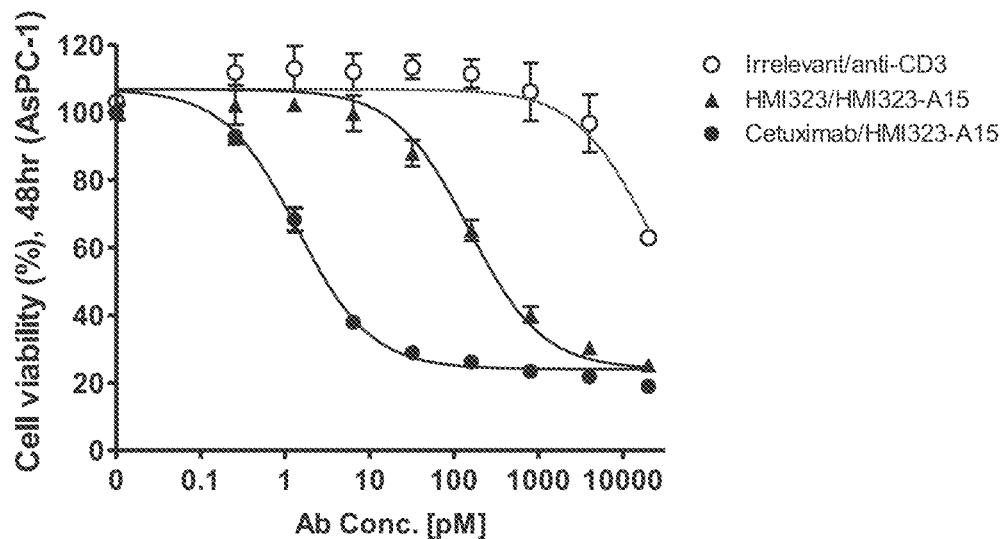
[FIG. 14]
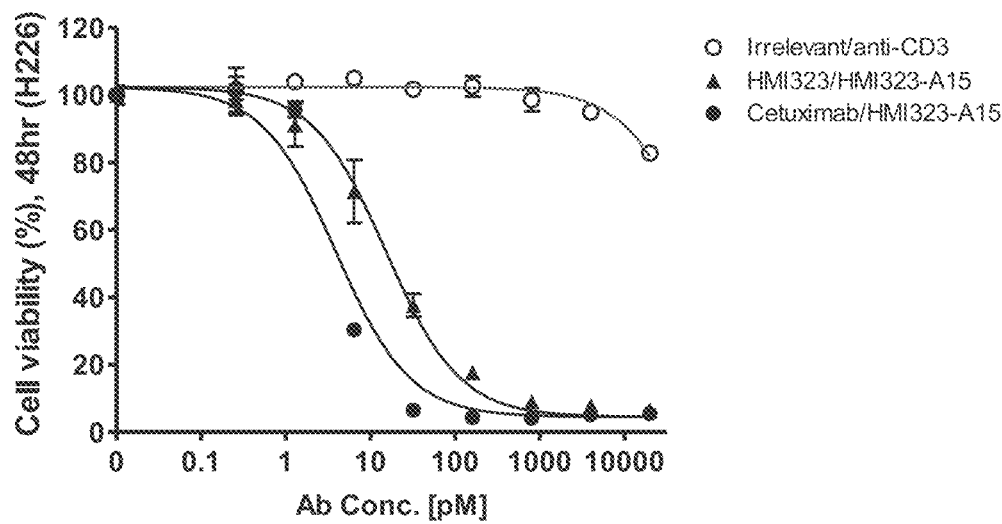

[FIG. 15]
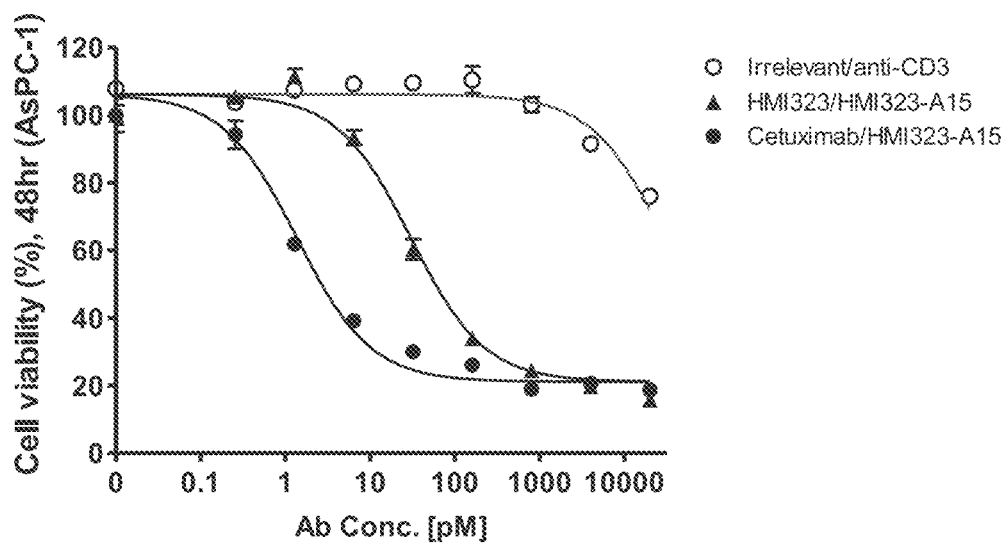
[FIG. 16]
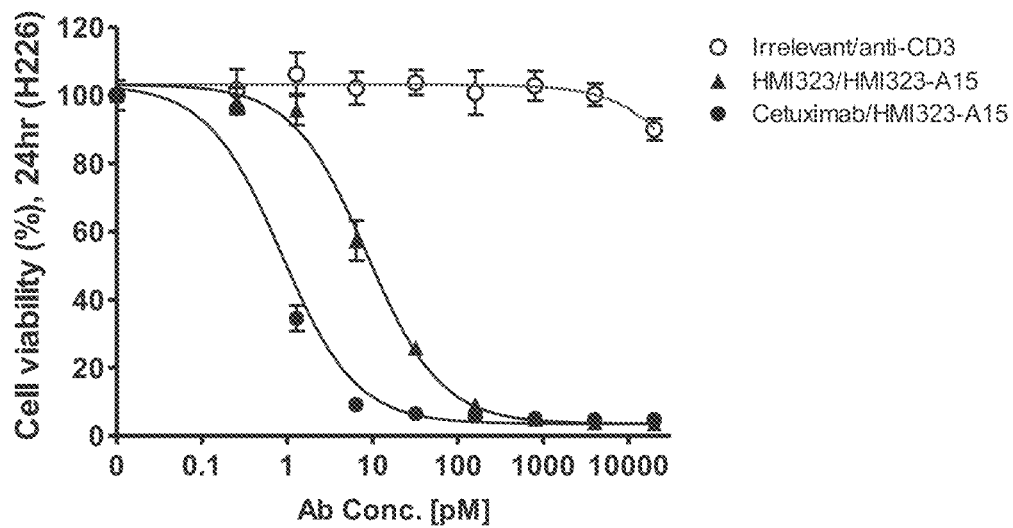

[FIG. 17]
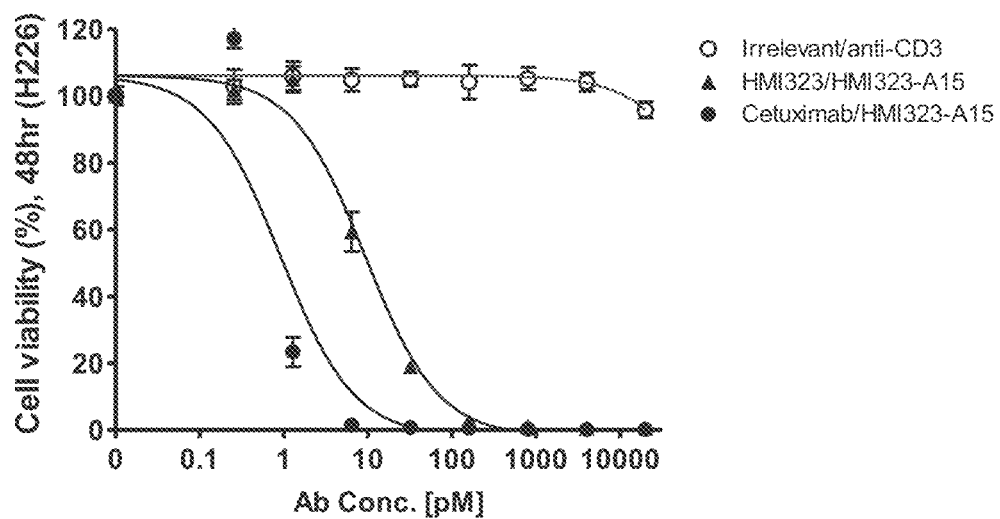
[FIG. 18]
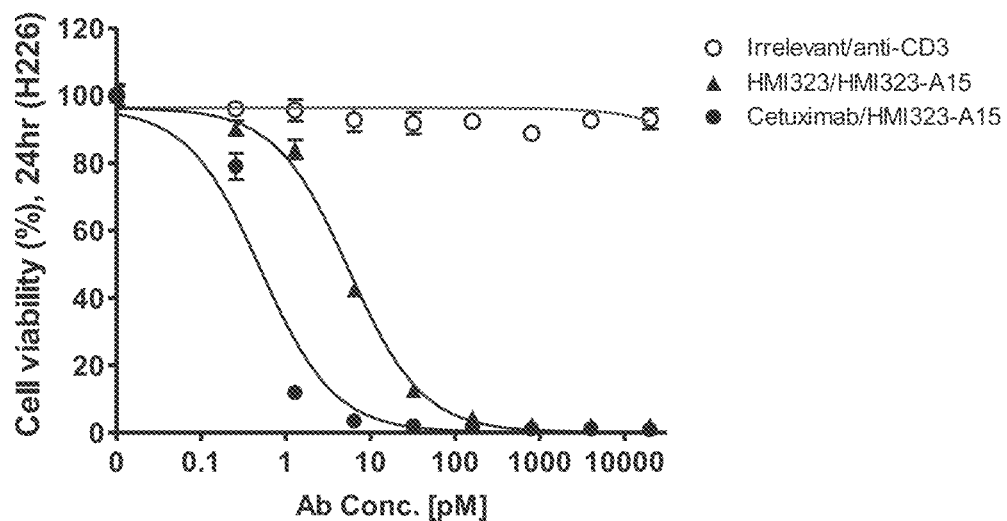

[FIG. 19]
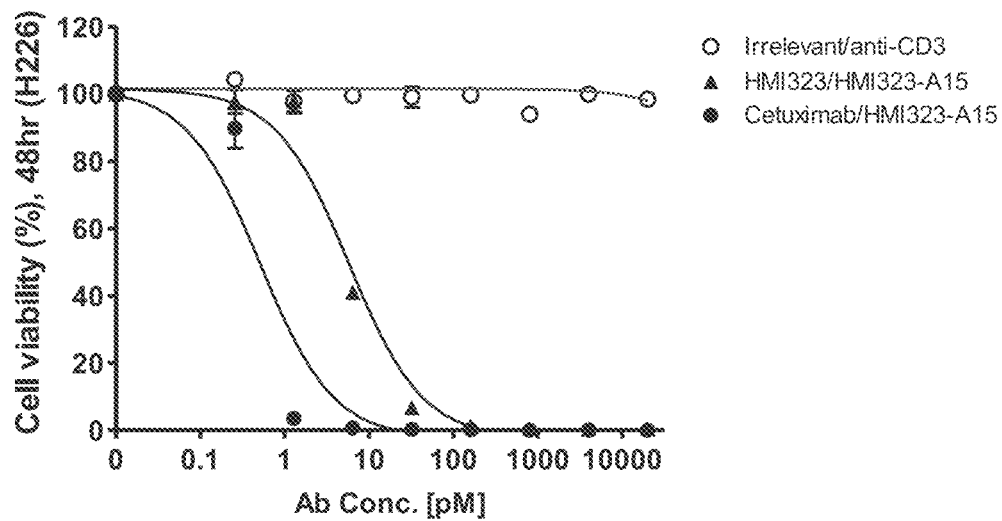
[FIG. 20]
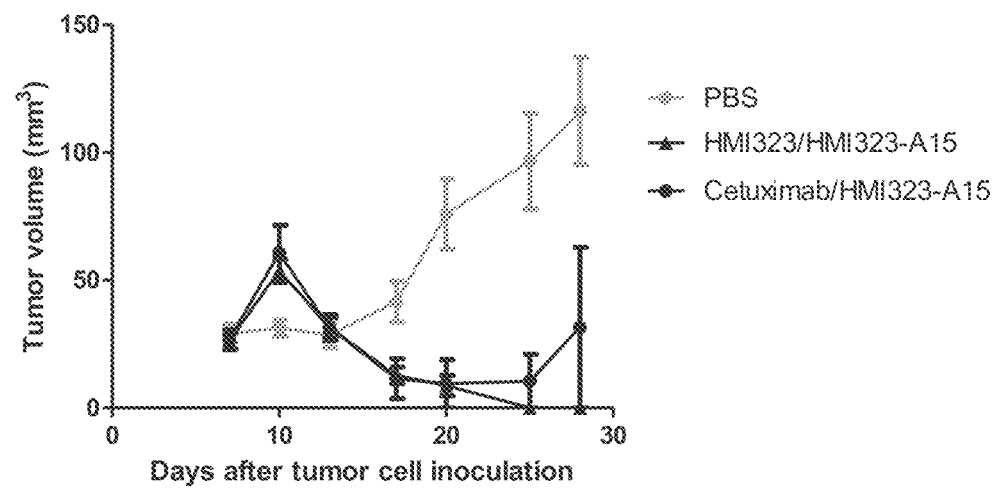

[FIG. 21]
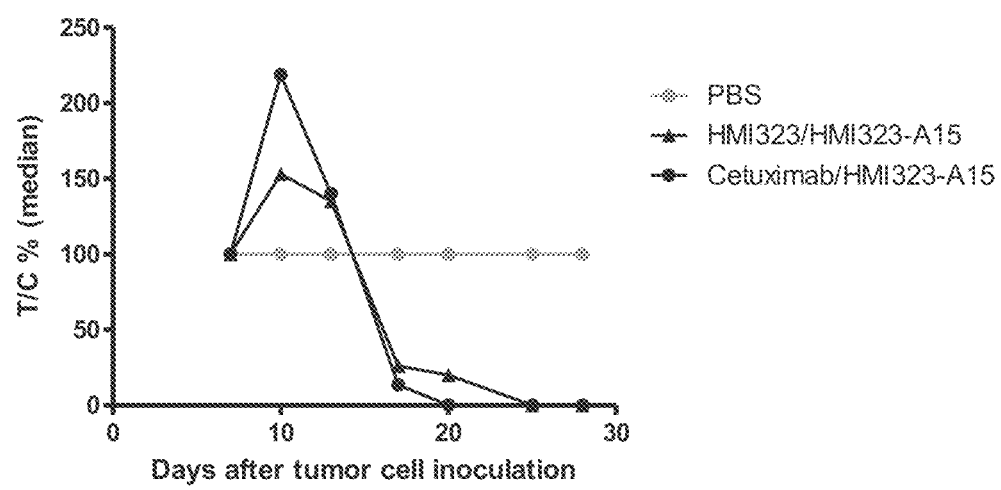

[FIG. 22]
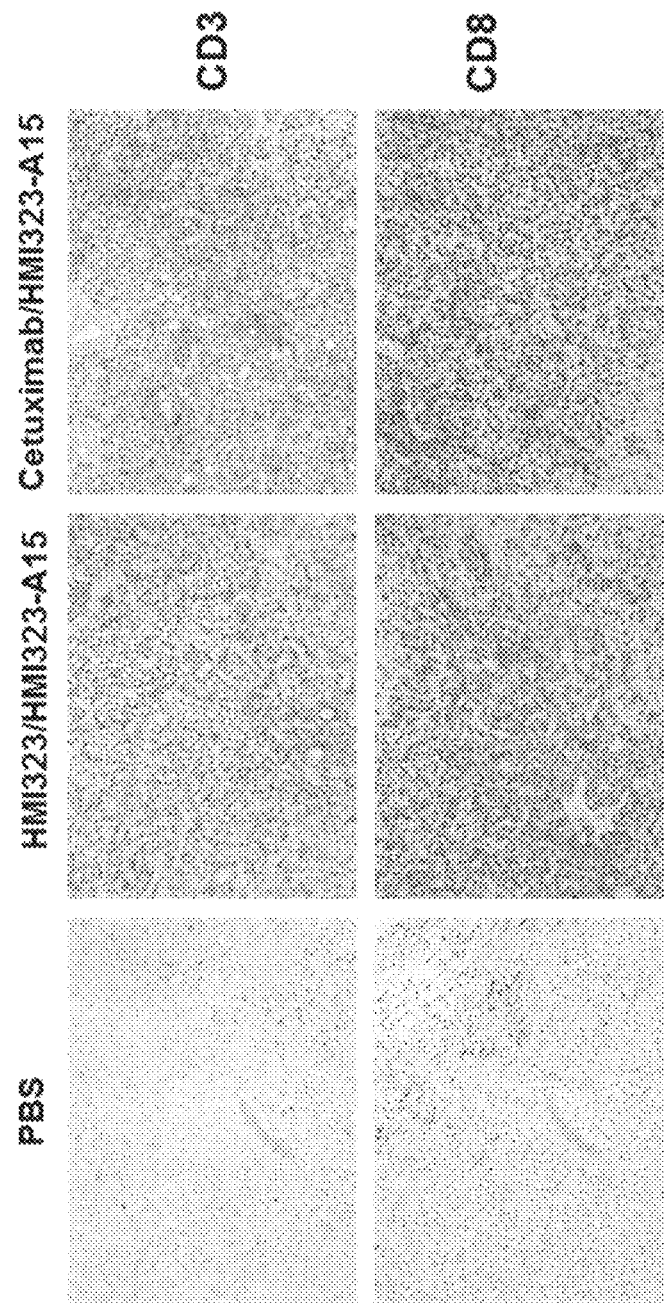

[FIG. 23]
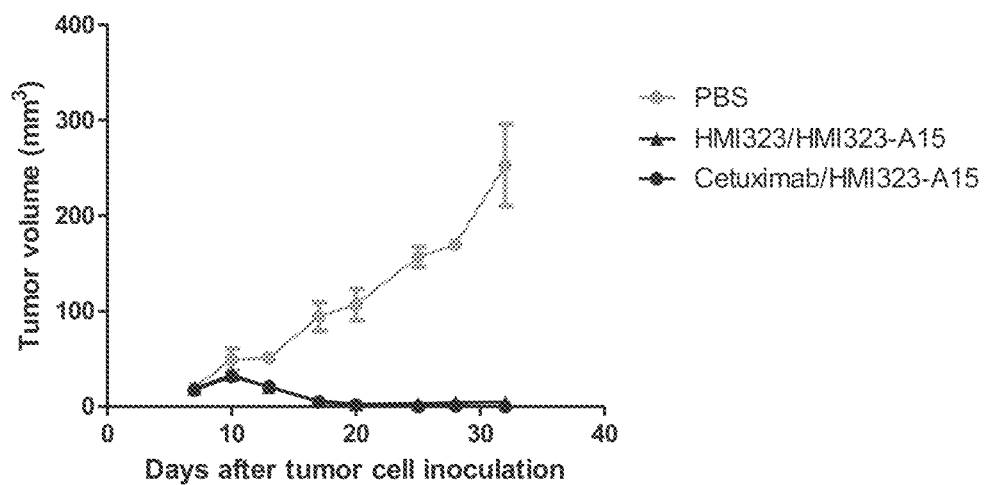
[FIG. 24]
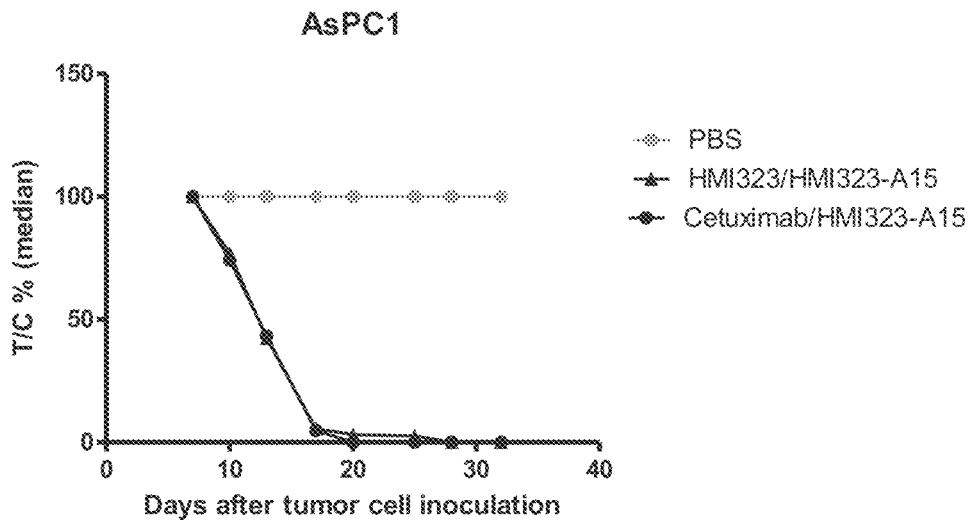

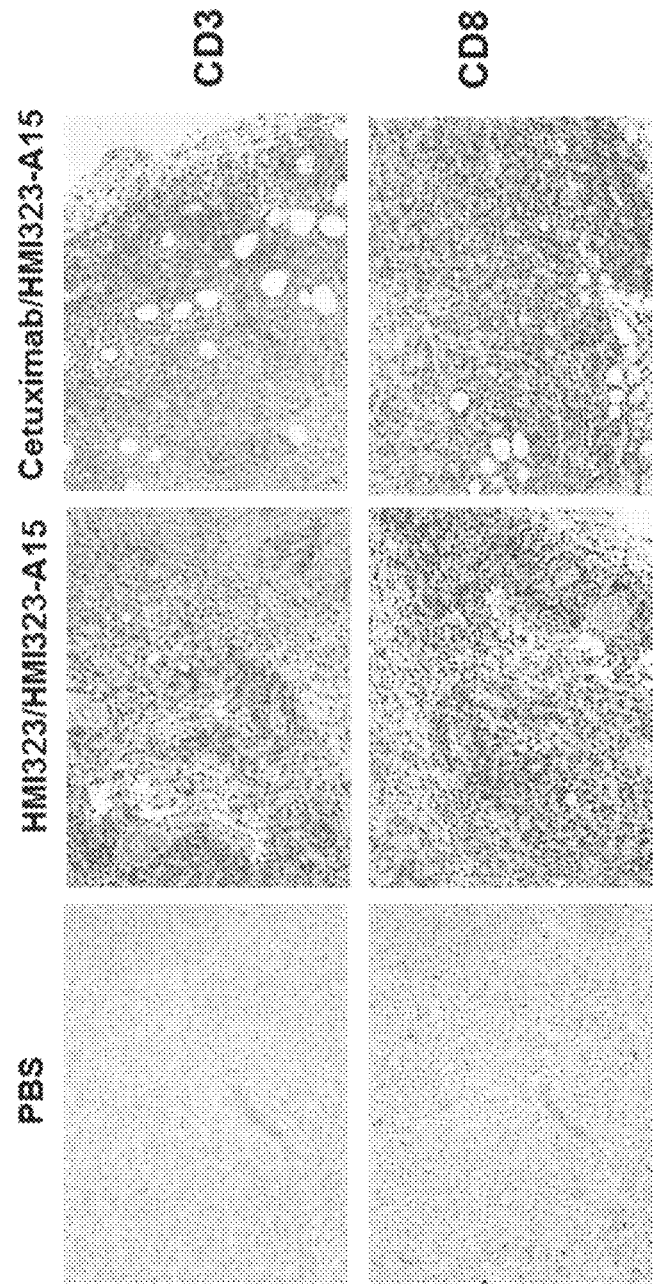
[FIG. 25]

[FIG. 26]
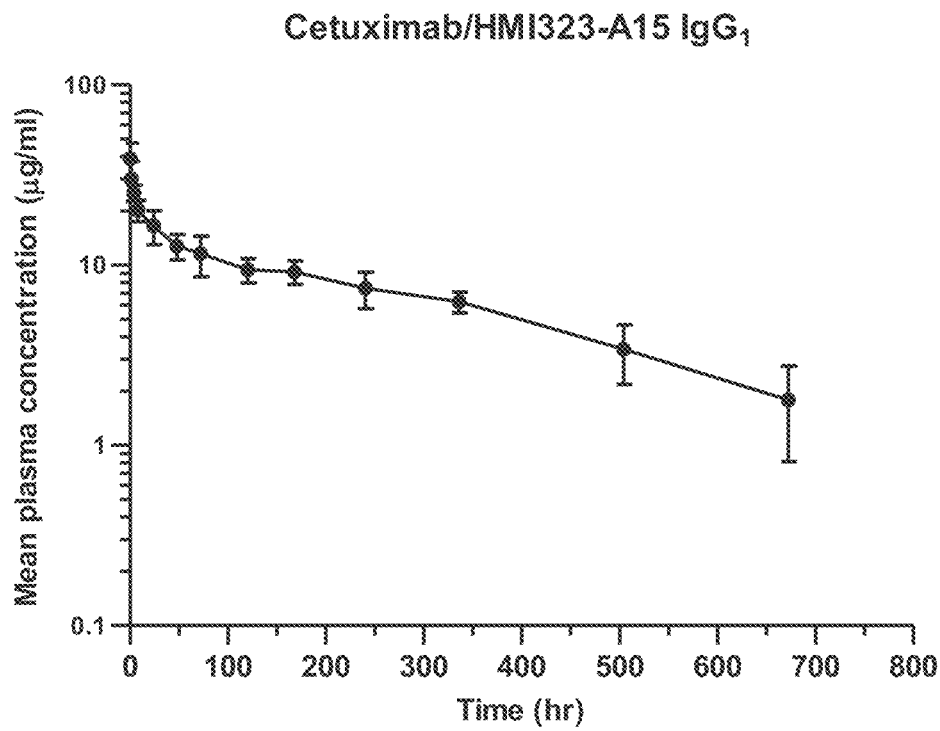
[FIG. 27]
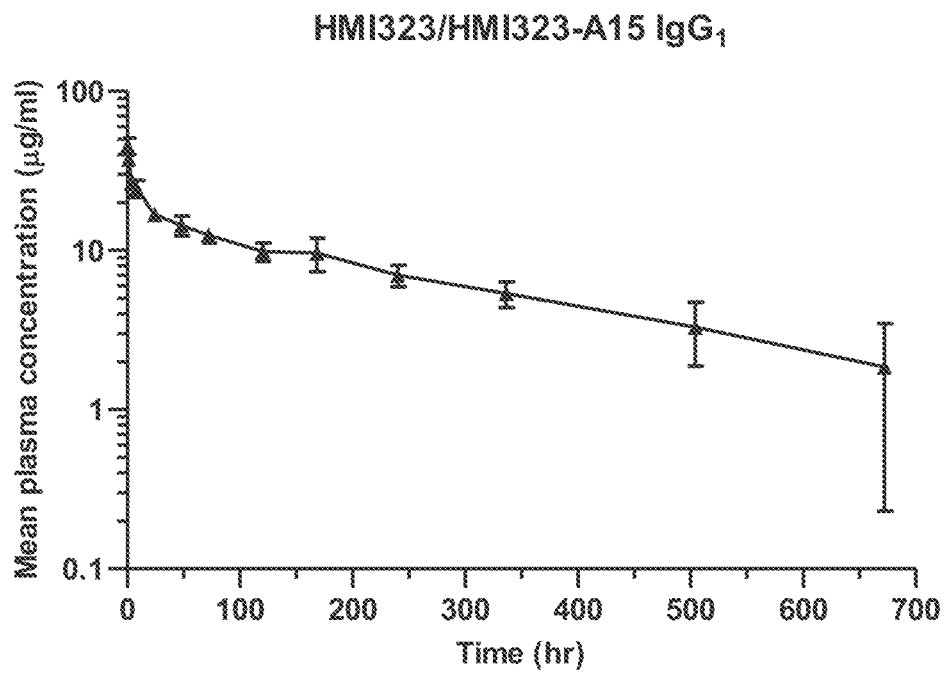

SEQUENCE LISTING

<160> NUMBER OF SEQ ID NOS: 48

<210> SEQ ID NO 1
<211> LENGTH: 1202
<212> TYPE: PRT
<213> ORGANISM: Artificial Sequence
<220> FEATURE:
<223> OTHER INFORMATION: First fusion protein

<400> SEQUENCE: 1

Met Asp Ser Gln Ala Gln Val Leu Met Leu Leu Leu Trp Val Ser
1               5                   10                  15

Gly Thr Cys Gly Asp Ile Gln Met Thr Gln Ser Pro Ser Ser Leu Ser
            20                  25                  30

Ala Ser Val Gly Asp Arg Val Thr Ile Thr Cys Arg Ala Ser Gln Asp
        35                  40                  45

Val Ser Thr Ala Val Ala Trp Tyr Gln Gln Lys Pro Gly Lys Ala Pro
    50                  55                  60

Lys Leu Leu Ile Tyr Ser Ala Ser Tyr Arg Tyr Pro Gly Val Pro Ser
65                  70                  75                  80

Arg Phe Ser Gly Ser Gly Ser Gly Thr Asp Phe Thr Leu Thr Ile Ser
                85                  90                  95

Ser Leu Gln Pro Glu Asp Phe Ala Thr Tyr Tyr Cys Gln Gln His Tyr
            100                 105                 110

Ser Thr Pro Trp Thr Phe Gly Gly Gly Thr Lys Leu Glu Ile Lys Arg
        115                 120                 125

Thr Val Ala Ala Pro Ser Val Phe Ile Phe Pro Pro Ser Asp Glu Gln
    130                 135                 140

Leu Lys Ser Gly Thr Ala Ser Val Val Cys Leu Leu Asn Asn Phe Tyr
145                 150                 155                 160

Pro Arg Glu Ala Lys Val Gln Trp Lys Val Asp Asn Ala Leu Gln Ser
                165                 170                 175

Gly Asn Ser Gln Glu Ser Val Thr Glu Gln Asp Ser Lys Asp Ser Thr
            180                 185                 190

Tyr Ser Leu Ser Ser Thr Leu Thr Leu Ser Lys Ala Asp Tyr Glu Lys
        195                 200                 205

His Lys Val Tyr Ala Cys Glu Val Thr His Gln Gly Leu Ser Ser Pro
    210                 215                 220

Val Thr Lys Ser Phe Asn Arg Gly Glu Cys Ser Gly Gly Gly Ser Gly
225                 230                 235                 240

Gly Gly Ser Glu Gly Gly Gly Ser Gly Gly Gly Ser Glu Gly Gly Gly
                245                 250                 255

Gly Ser Glu Gly Gly Gly Ser Gly Gly Gly Ser Gly Glu Val Gln Leu
            260                 265                 270

Val Gln Ser Gly Ala Glu Val Lys Lys Pro Gly Thr Ser Val Lys Val
        275                 280                 285

Ser Cys Lys Ala Ser Gly Tyr Ser Phe Thr Ser Tyr Phe Ile Gln Trp
    290                 295                 300

Val Arg Gln Ala Pro Gly Gln Gly Leu Glu Trp Ile Gly Trp Ile Phe
305                 310                 315                 320

Pro Gly Ser Gly Asn Thr Lys Tyr Ser Gln Lys Phe Gln Gly Arg Val
                325                 330                 335

Thr Ile Thr Arg Asp Thr Ser Thr Ser Thr Ala Tyr Met Glu Leu Ser
            340                 345                 350

```
Ser Leu Arg Ser Glu Asp Thr Ala Val Tyr Tyr Cys Ala Arg Ser Gly
            355                 360                 365

Gly Tyr Gln Tyr Tyr Phe Asp Tyr Trp Gly Gln Gly Thr Leu Val Thr
        370                 375                 380

Val Ser Ser Ala Ser Thr Lys Gly Pro Ser Val Phe Pro Leu Ala Pro
385                 390                 395                 400

Ser Ser Lys Ser Thr Ser Gly Gly Thr Ala Ala Leu Gly Cys Leu Val
                405                 410                 415

Lys Asp Tyr Phe Pro Glu Pro Val Thr Val Ser Trp Asn Ser Gly Ala
            420                 425                 430

Leu Thr Ser Gly Val His Thr Phe Pro Ala Val Leu Gln Ser Ser Gly
        435                 440                 445

Leu Tyr Ser Leu Ser Ser Val Val Thr Val Pro Ser Ser Ser Leu Gly
        450                 455                 460

Thr Gln Thr Tyr Ile Cys Asn Val Asn His Lys Pro Ser Asn Thr Lys
465                 470                 475                 480

Val Asp Lys Lys Val Gly Gly Gly Ser Gly Gly Gly Ser Gly
                485                 490                 495

Gly Gly Gly Ser Gln Ala Val Val Thr Gln Glu Pro Ser Leu Thr Val
                500                 505                 510

Ser Pro Gly Gly Thr Val Thr Leu Thr Cys Arg Ser Ser Thr Gly Ala
            515                 520                 525

Val Thr Thr Ser Asn Tyr Ala Asn Trp Val Gln Gln Lys Pro Gly Gln
        530                 535                 540

Ala Pro Arg Gly Leu Ile Gly Gly Thr Asn Lys Arg Ala Pro Trp Thr
545                 550                 555                 560

Pro Ala Arg Phe Ser Gly Ser Leu Leu Gly Gly Lys Ala Ala Leu Thr
                565                 570                 575

Leu Ser Gly Ala Gln Pro Glu Asp Glu Ala Glu Tyr Tyr Cys Ala Leu
            580                 585                 590

Trp Tyr Ser Asn Leu Trp Val Phe Gly Gly Gly Thr Lys Leu Thr Val
        595                 600                 605

Leu Gly Gln Pro Lys Ala Asn Pro Thr Val Thr Leu Phe Pro Pro Ser
        610                 615                 620

Ser Glu Glu Leu Gln Ala Asn Lys Ala Thr Leu Val Cys Leu Ile Ser
625                 630                 635                 640

Asp Phe Tyr Pro Gly Ala Val Thr Val Ala Trp Lys Ala Asp Gly Ser
                645                 650                 655

Pro Val Lys Ala Gly Val Glu Thr Thr Lys Pro Ser Lys Gln Ser Asn
                660                 665                 670

Asn Lys Tyr Ala Ala Ser Ser Tyr Leu Ser Leu Thr Pro Glu Gln Trp
            675                 680                 685

Lys Ser His Arg Ser Tyr Ser Cys Gln Val Thr His Glu Gly Ser Thr
        690                 695                 700

Val Glu Lys Thr Val Ala Pro Thr Glu Cys Ser Gly Gly Gly Ser Gly
705                 710                 715                 720

Gly Gly Ser Glu Gly Gly Ser Glu Gly Gly Ser Glu Gly Gly
                725                 730                 735

Gly Ser Glu Gly Gly Ser Gly Gly Gly Ser Gly Glu Val Gln Leu
            740                 745                 750

Val Glu Ser Gly Gly Gly Leu Val Gln Pro Gly Gly Ser Leu Lys Leu
        755                 760                 765
```

```
Ser Cys Ala Ala Ser Gly Phe Thr Phe Asn Thr Tyr Ala Met Asn Trp
770                 775                 780

Val Arg Gln Ala Ser Gly Lys Gly Leu Glu Trp Val Gly Arg Ile Arg
785                 790                 795                 800

Ser Lys Tyr Asn Asn Tyr Ala Thr Tyr Tyr Ala Asp Ser Val Lys Asp
            805                 810                 815

Arg Phe Thr Ile Ser Arg Asp Asp Ser Lys Asn Thr Ala Tyr Leu Gln
        820                 825                 830

Met Asn Ser Leu Lys Thr Glu Asp Thr Ala Val Tyr Tyr Cys Val Arg
            835                 840                 845

His Gly Asn Phe Gly Asn Ser Tyr Val Ser Trp Phe Ala Tyr Trp Gly
850                 855                 860

Gln Gly Thr Leu Val Thr Val Ser Ser Ala Ser Thr Lys Gly Pro Ser
865                 870                 875                 880

Val Phe Pro Leu Ala Pro Ser Ser Lys Ser Thr Ser Gly Gly Thr Ala
                885                 890                 895

Ala Leu Gly Cys Leu Val Lys Asp Tyr Phe Pro Glu Pro Val Thr Val
            900                 905                 910

Ser Trp Asn Ser Gly Ala Leu Thr Ser Gly Val His Thr Phe Pro Ala
        915                 920                 925

Val Leu Gln Ser Ser Gly Leu Tyr Ser Leu Ser Ser Val Val Thr Val
    930                 935                 940

Pro Ser Ser Ser Leu Gly Thr Gln Thr Tyr Ile Cys Asn Val Asn His
945                 950                 955                 960

Lys Pro Ser Asn Thr Lys Val Asp Lys Val Glu Pro Lys Ser Cys
                965                 970                 975

Asp Lys Thr His Thr Cys Pro Pro Cys Pro Ala Pro Glu Ala Ala Gly
            980                 985                 990

Gly Pro Ser Val Phe Leu Phe Pro Pro Lys Pro Lys Asp Thr Leu Met
        995                 1000                1005

Ile Ser Arg Thr Pro Glu Val Thr Cys Val Val Val Asp Val Ser His
    1010                1015                1020

Glu Asp Pro Glu Val Lys Phe Asn Trp Tyr Val Asp Gly Val Glu Val
1025                1030                1035                1040

His Asn Ala Lys Thr Lys Pro Arg Glu Glu Gln Tyr Asn Ser Thr Tyr
                1045                1050                1055

Arg Val Val Ser Val Leu Thr Val Leu His Gln Asp Trp Leu Asn Gly
            1060                1065                1070

Lys Glu Tyr Lys Cys Lys Val Ser Asn Lys Ala Leu Pro Ala Pro Ile
        1075                1080                1085

Glu Lys Thr Ile Ser Lys Ala Lys Gly Gln Pro Arg Glu Pro Arg Val
    1090                1095                1100

Tyr Thr Leu Pro Pro Cys Arg Asp Glu Leu Thr Lys Asn Gln Val Ser
1105                1110                1115                1120

Leu Thr Cys Leu Val Lys Gly Phe Tyr Pro Ser Asp Ile Ala Val Glu
                1125                1130                1135

Trp Glu Ser Asn Gly Gln Pro Glu Asn Asn Tyr Lys Thr Thr Pro Pro
            1140                1145                1150

Val Leu Val Ser Asp Gly Ser Phe Thr Leu Tyr Ser Lys Leu Thr Val
        1155                1160                1165

Asp Lys Ser Arg Trp Gln Gln Gly Asn Val Phe Ser Cys Ser Val Met
    1170                1175                1180
```

His Glu Ala Leu His Asn His Tyr Thr Gln Lys Ser Leu Ser Leu Ser
1185                1190                1195                1200

Pro Gly

<210> SEQ ID NO 2
<211> LENGTH: 2668
<212> TYPE: DNA
<213> ORGANISM: Artificial Sequence
<220> FEATURE:
<223> OTHER INFORMATION: DNA encoding First fusion protein

<400> SEQUENCE: 2

```
ggtgtccagg cggccgccat ggattctcag gcccaagtcc tcatgctcct gctcctttgg      60
gtgtcaggga cttgtggtga catccaaatg acgcagagtc cttcctcact gtctgcatct     120
gtaggagacc gggtgaccat aacgtgccgg gcgtcacagg acgttagtac cgcggttgca     180
tggtaccaac aaaagcccgg gaaggcccct aagctcttga tttacagtgc tagctacagg     240
tatccagggg tgccgagccg attctctgga tctggaagtg gcacggattt cactctgacc     300
atttcatcac ttcagcctga ggatttcgcg acatactact gccaacaaca ctatagtaca     360
ccctggactt ttggcggcgg gactaaactc gagataaaaa gaacggtcgc ggcaccgtcc     420
gtgttcatct ttccgcctag tgatgagcag ctcaaatcag gtaccgccag tgtagtatgc     480
cttctcaaca atttctatcc cagggaggct aaagtacaat ggaaggtgga taacgcgttg     540
cagagcggca acagtcaaga gagcgtgact gagcaggatt caaaagatag tacttacagc     600
ctgtctagca cgctgactct gagcaaagcg actatgaga agcataaagt gtatgcgtgt     660
gaagtgacac atcagggtct gagtagccca gtcacaaaat catttaatag aggagagtgc     720
tctggcggag gctctggagg tggaagtgaa ggaggtgggc tgaaggtgg cggcagtgag     780
ggaggaggca gcgaaggtgg cggatcaggc gggggttctg agaggtccaa actggtccaa     840
agtggtgccg aggtgaagaa acccggcact tcagtaaagg tgagttgcaa ggcttctggg     900
tactctttta cttcctactt catccagtgg gtgcgacaag cccccgggca gggtcttgag     960
tggatcggat ggattttttcc aggatctggc aacacaaaat attctcagaa gttccaaggt    1020
cgagtcacga taacacgaga caccagtaca agtaccgcat acatggagct ctctagcttg    1080
cgaagtgaag acactgcagt gtactattgt gctcgcagcg gcggatatca gtactatttt    1140
gattactggg gccagggcac gttggtgaca gtgagttccg ctagtacgaa aggtccctca    1200
gtattcccac tggcgcccag ctctaaaagt accagtgggg gacggctgc tttgggttgc    1260
cttgtcaaag actattttcc agaacccgtc acggtgagct ggaattctgg tgctctgacc    1320
agcggagtac acacattccc cgcagtcttg caaagcagtg gctttactc cctctcttct    1380
gttgtcacag tcccgagttc atcacttgga actcaaacat atatttgtaa tgtcaatcac    1440
aagccgtcca atacgaaagt ggacaagaag gtcggaggcg gtggatctgg tggaggaggg    1500
tctgggggtg gcggttcaca agccgtcgtg actcaagaac ccagccttac cgtatctccc    1560
gggggaacag tcaccctgac gtgtcggagt tcaaccggcg ccgtaacgac gagcaattac    1620
gctaactggg tgcaacaaaa accgggtcaa gctccccgag gactgatcgg cggaaccaat    1680
aaacgagctc cttggactcc agcaaggttc agtggcagcc tccttggagg caaggcggca    1740
ctcacgctta gcgggcaca gcagaggat gaagcagagt attactgcgc attgtggtac    1800
tcaaacttgt gggttttcgg tggggggact aagctgactg tcctcggtca gcctaaagca    1860
aaccccactg ttacactctt tcccccgtct tcagaggagt tgcaagctaa caaggctacc    1920
```

```
ttggtttgtt tgattagtga ttttttaccca ggcgccgtaa ccgtagcatg gaaggccgac    1980
ggatcaccag tgaaagcagg agtagaaacc actaaaccct caaaacaaag caacaacaaa    2040
tatgccgcat cctcctattt gtcccttacc ccggagcagt ggaaaagtca tcgatcatat    2100
tcctgtcagg tcacgcacga gggctccacc gttgagaaga ctgtagctcc cacagaatgc    2160
agtggcggcg ggtccggggg gggtagcgaa gggggaggaa gcgaggggg cggatctgaa     2220 ggagggggct cagaaggagg cggatctgga ggtgggagtg gagaggtcca attggtggag    2280
tcaggaggcg gattggtgca gccgggaggc tccttgaaac tgagttgcgc cgctagtggt    2340
tttacattta atacctatgc tatgaactgg gtacggcagg ccagcggcaa aggtctggag    2400
tgggtgggta gaataaggtc aaaatacaat aactacgcaa catattacgc agactccgtt    2460
aaagaccgat ttaccatatc acgcgacgat tctaagaaca ctgcatatct ccagatgaat    2520
tccttgaaaa ccgaagatac ggcagtttat tactgcgtca ggcatggcaa cttcggtaac    2580
tcttatgtat cttggtttgc gtactggggc cagggaactc tcgtcaccgt ttcatcagcc    2640
tccaccaagg gcccaagcgt ctttcccct                                      2668
```

<210> SEQ ID NO 3
<211> LENGTH: 716
<212> TYPE: PRT
<213> ORGANISM: Artificial Sequence
<220> FEATURE:
<223> OTHER INFORMATION: Second fusion protein

<400> SEQUENCE: 3

```
Met Asp Ser Gln Ala Gln Val Leu Met Leu Leu Leu Trp Val Ser
1               5                   10                  15

Gly Thr Cys Gly Asp Ile Gln Met Thr Gln Ser Pro Ser Ser Leu Ser
            20                  25                  30

Ala Ser Val Gly Asp Arg Val Thr Ile Thr Cys Arg Ala Ser Gln Asp
        35                  40                  45

Val Ser Thr Ala Val Ala Trp Tyr Gln Gln Lys Pro Gly Lys Ala Pro
    50                  55                  60

Lys Leu Leu Ile Tyr Ser Ala Ser Tyr Arg Tyr Pro Gly Val Pro Ser
65                  70                  75                  80

Arg Phe Ser Gly Ser Gly Ser Gly Thr Asp Phe Thr Leu Thr Ile Ser
                85                  90                  95

Ser Leu Gln Pro Glu Asp Phe Ala Thr Tyr Tyr Cys Gln Gln His Tyr
            100                 105                 110

Ser Thr Pro Trp Thr Phe Gly Gly Gly Thr Lys Leu Glu Ile Lys Arg
        115                 120                 125

Thr Val Ala Ala Pro Ser Val Phe Ile Phe Pro Pro Ser Asp Glu Gln
    130                 135                 140

Leu Lys Ser Gly Thr Ala Ser Val Val Cys Leu Leu Asn Asn Phe Tyr
145                 150                 155                 160

Pro Arg Glu Ala Lys Val Gln Trp Lys Val Asp Asn Ala Leu Gln Ser
                165                 170                 175

Gly Asn Ser Gln Glu Ser Val Thr Glu Gln Asp Ser Lys Asp Ser Thr
            180                 185                 190

Tyr Ser Leu Ser Ser Thr Leu Thr Leu Ser Lys Ala Asp Tyr Glu Lys
        195                 200                 205

His Lys Val Tyr Ala Cys Glu Val Thr His Gln Gly Leu Ser Ser Pro
    210                 215                 220
```

-continued

```
Val Thr Lys Ser Phe Asn Arg Gly Glu Cys Ser Gly Gly Ser Gly
225                 230                 235                 240

Gly Gly Ser Glu Gly Gly Ser Glu Gly Gly Ser Glu Gly Gly
            245                 250                 255

Gly Ser Glu Gly Gly Ser Gly Gly Ser Gly Glu Val Gln Leu
            260                 265                 270

Val Gln Ser Gly Ala Glu Val Lys Lys Pro Gly Thr Ser Val Lys Val
        275                 280                 285

Ser Cys Lys Ala Ser Gly Tyr Ser Phe Thr Ser Tyr Phe Ile Gln Trp
    290                 295                 300

Val Arg Gln Ala Pro Gly Gln Gly Leu Glu Trp Ile Gly Trp Ile Phe
305                 310                 315                 320

Pro Gly Ser Gly Asn Thr Lys Tyr Ser Gln Lys Phe Gln Gly Arg Val
                325                 330                 335

Thr Ile Thr Arg Asp Thr Ser Thr Ser Thr Ala Tyr Met Glu Leu Ser
                340                 345                 350

Ser Leu Arg Ser Glu Asp Thr Ala Val Tyr Tyr Cys Ala Arg Ser Gly
            355                 360                 365

Gly Tyr Gln Tyr Tyr Phe Asp Tyr Trp Gly Gln Gly Thr Leu Val Thr
    370                 375                 380

Val Ser Ser Ala Ser Thr Lys Gly Pro Ser Val Phe Pro Leu Ala Pro
385                 390                 395                 400

Ser Ser Lys Ser Thr Ser Gly Gly Thr Ala Ala Leu Gly Cys Leu Val
                405                 410                 415

Lys Asp Tyr Phe Pro Glu Pro Val Thr Val Ser Trp Asn Ser Gly Ala
            420                 425                 430

Leu Thr Ser Gly Val His Thr Phe Pro Ala Val Leu Gln Ser Ser Gly
            435                 440                 445

Leu Tyr Ser Leu Ser Ser Val Val Thr Val Pro Ser Ser Ser Leu Gly
    450                 455                 460

Thr Gln Thr Tyr Ile Cys Asn Val Asn His Lys Pro Ser Asn Thr Lys
465                 470                 475                 480

Val Asp Lys Lys Val Glu Pro Lys Ser Cys Asp Lys Thr His Thr Cys
                485                 490                 495

Pro Pro Cys Pro Ala Pro Glu Ala Ala Gly Gly Pro Ser Val Phe Leu
            500                 505                 510

Phe Pro Pro Lys Pro Lys Asp Thr Leu Met Ile Ser Arg Thr Pro Glu
    515                 520                 525

Val Thr Cys Val Val Val Asp Val Ser His Glu Asp Pro Glu Val Lys
530                 535                 540

Phe Asn Trp Tyr Val Asp Gly Val Glu Val His Asn Ala Lys Thr Lys
545                 550                 555                 560

Pro Arg Glu Glu Gln Tyr Asn Ser Thr Tyr Arg Val Val Ser Val Leu
                565                 570                 575

Thr Val Leu His Gln Asp Trp Leu Asn Gly Lys Glu Tyr Lys Cys Lys
            580                 585                 590

Val Ser Asn Lys Ala Leu Pro Ala Pro Ile Glu Lys Thr Ile Ser Lys
    595                 600                 605

Ala Lys Gly Gln Pro Arg Glu Pro Gln Val Cys Thr Leu Pro Pro Ser
610                 615                 620

Arg Asp Glu Leu Thr Glu Asn Gln Val Ser Leu Thr Cys Leu Val Lys
625                 630                 635                 640
```

```
Gly Phe Tyr Pro Ser Asp Ile Ala Val Glu Trp Glu Ser Asn Gly Gln
                645                 650                 655

Pro Glu Asn Asn Tyr Lys Thr Thr Pro Pro Val Leu Asp Ser Asp Gly
            660                 665                 670

Ser Phe Phe Leu Tyr Ser Trp Leu Thr Val Asp Lys Ser Arg Trp Gln
        675                 680                 685

Gln Gly Asn Val Phe Ser Cys Ser Val Met His Glu Ala Leu His Asn
    690                 695                 700

His Tyr Thr Gln Lys Ser Leu Ser Leu Ser Pro Gly
705                 710                 715

<210> SEQ ID NO 4
<211> LENGTH: 2148
<212> TYPE: DNA
<213> ORGANISM: Artificial Sequence
<220> FEATURE:
<223> OTHER INFORMATION: DNA encoding Second fusion protein

<400> SEQUENCE: 4
```

| | | |
|---|---|---|
| atggattctc aggcacaagt gctgatgctt ctcctgctgt gggtatccgg gacatgcgga | 60 |
| gacattcaga tgacacagag cccgagtagc cttagtgcca cgtcggcga tagagttaca | 120 |
| attacttgta gagcgtcaca agacgtctcc actgcagtgg cctggtatca gcagaaacca | 180 |
| gggaaggctc ctaagttgct gatctactca gcatcatata gtatcctgg ggtgccttca | 240 |
| aggttttctg gtccggatc aggcacagac tttacactca cgattagctc tttgcaacct | 300 |
| gaagatttcg caacttacta ttgtcagcag cactacagta cgccctggac gtttggtggg | 360 |
| ggtaccaaat ggaaatcaa gcgaactgtt gcggcgccca gtgtatttat atttccgcct | 420 |
| tcagatgaac aactgaaatc agggacggcg tccgttgttt gcctcttgaa caacttttac | 480 |
| ccgcgcgagg caaaagttca gtggaaggtt gataacgcat gcaatccgg caattcacag | 540 |
| gaatcagtga ctgagcagga cagtaaagac tccacttatt ctctcagttc caccctcact | 600 |
| ctctcaaagg ccgactacga aagcacaag gtctacgcat gtgaagtcac tcatcaggga | 660 |
| ctctcctccc cggtcaccaa gagcttcaac cgaggcgaat gctcaggtgg cggctctggc | 720 |
| ggcggctctg agggggggcgg ttccgaaggc ggagggtcag aaggcggcgg atctgaaggt | 780 |
| ggtggtagtg gcggaggatc aggggaagtg cagttggtgc agtccggagc agaggtgaag | 840 |
| aagcccggaa cctcagtcaa ggttagttgt aaggcatccg gtactccttc acaagttac | 900 |
| ttcatccagt gggtacgcca ggcaccaggt caaggactcg agtggatagg atggatttc | 960 |
| cccggctcag gaaatactaa gtattcacaa aagttccagg gtcgagtgac tattacacga | 1020 |
| gatactagta ccagtaccgc ctatatggaa ctttctagtc ttaggagcga agacaccgct | 1080 |
| gtctattact gtgcgaggag cggggggtat cagtattact ttgactactg ggggcagggg | 1140 |
| acattggtaa cggtgtcatc tgcctccacc aagggcccaa gtgtgttccc acttgccccc | 1200 |
| agcagcaagt ctacaagcgg cgggacagct gctctaggtt gcctggttaa ggactatttc | 1260 |
| cctgagccag ttacagtaag ttggaatagc ggcgcccta caagtgggt ccatactttt | 1320 |
| ccagcagtac tgcagtcgtc gggtctctat agtctgagct ctgtggtaac ggtgccatct | 1380 |
| agctcacttg gcactcagac ctacatctgc aacgtgaacc ataaaccag caacaccaaa | 1440 |
| gtcgacaaga agttgaacc caagtcctgc gataaaactc acacgtgtcc tccatgtcct | 1500 |
| gctcccgagg ccgcaggcgg acccagtgtg tttctgtttc ctccgaaacc taaggatacc | 1560 |
| ctaatgattt cacggacccc agaggtgacg tgcgtggtgg tggatgtgtc acatgaggac | 1620 |

-continued

```
ccggaggtca aattcaattg gtacgtggac ggcgtggaag ttcacaacgc taaaaccaaa    1680
cccagggaag aacagtacaa tagcacatat agagttgtgt cagtcctgac agtgctgcac    1740
caggattggc tgaatggcaa ggagtacaag tgcaaggtga gcaacaaggc cttgcctgca    1800
ccaatcgaga aaaccatttc taaggccaag gccaacccc gcgaacccca agtgtgtacc     1860 ctgccccct ctagagacga gctcactgaa aaccaggtga gcttaacttg tctggtgaag     1920
ggattctacc caagcgacat agccgtagaa tgggagagca atggtcaacc cgaaaataac    1980
tataaaacaa ctcctcctgt gctggatagc gacggcagtt ttttcctgta tagctggctg    2040
accgtggata gtctagatg gcagcagggg aatgtcttta gctgttctgt gatgcacgag     2100
gcgctccata accactacac ccagaagagc ttgagcttga gcccagga                  2148
```

<210> SEQ ID NO 5
<211> LENGTH: 715
<212> TYPE: PRT
<213> ORGANISM: Artificial Sequence
<220> FEATURE:
<223> OTHER INFORMATION: Third fusion protein

<400> SEQUENCE: 5

```
Met Gly Trp Ser Cys Ile Ile Leu Phe Leu Val Ala Thr Ala Thr Gly
1               5                   10                  15

Val His Ser Asp Ile Leu Leu Thr Gln Ser Pro Val Ile Leu Ser Val
            20                  25                  30

Ser Pro Gly Glu Arg Val Ser Phe Ser Cys Arg Ala Ser Gln Ser Ile
        35                  40                  45

Gly Thr Asn Ile His Trp Tyr Gln Gln Arg Thr Asn Gly Ser Pro Arg
    50                  55                  60

Leu Leu Ile Lys Tyr Ala Ser Glu Ser Ile Ser Gly Ile Pro Ser Arg
65                  70                  75                  80

Phe Ser Gly Ser Gly Ser Gly Thr Asp Phe Thr Leu Ser Ile Asn Ser
                85                  90                  95

Val Glu Ser Glu Asp Ile Ala Asp Tyr Tyr Cys Gln Gln Asn Asn Asn
            100                 105                 110

Trp Pro Thr Thr Phe Gly Ala Gly Thr Lys Leu Glu Leu Lys Arg Thr
        115                 120                 125

Val Ala Ala Pro Ser Val Phe Ile Phe Pro Pro Ser Asp Glu Gln Leu
    130                 135                 140

Lys Ser Gly Thr Ala Ser Val Val Cys Leu Leu Asn Asn Phe Tyr Pro
145                 150                 155                 160

Arg Glu Ala Lys Val Gln Trp Lys Val Asp Asn Ala Leu Gln Ser Gly
                165                 170                 175

Asn Ser Gln Glu Ser Val Thr Glu Gln Asp Ser Lys Asp Ser Thr Tyr
            180                 185                 190

Ser Leu Ser Ser Thr Leu Thr Leu Ser Lys Ala Asp Tyr Glu Lys His
        195                 200                 205

Lys Val Tyr Ala Cys Glu Val Thr His Gln Gly Leu Ser Ser Pro Val
    210                 215                 220

Thr Lys Ser Phe Asn Arg Gly Glu Cys Ser Gly Gly Gly Ser Gly Gly
225                 230                 235                 240

Gly Ser Glu Gly Gly Gly Ser Glu Gly Gly Gly Ser Glu Gly Gly Gly
                245                 250                 255

Ser Glu Gly Gly Gly Ser Gly Gly Gly Ser Gly Gln Val Gln Leu Lys
            260                 265                 270
```

```
Gln Ser Gly Pro Gly Leu Val Gln Pro Ser Gln Ser Leu Ser Ile Thr
            275                 280                 285

Cys Thr Val Ser Gly Phe Ser Leu Thr Asn Tyr Gly Val His Trp Val
        290                 295                 300

Arg Gln Ser Pro Gly Lys Gly Leu Glu Trp Leu Gly Val Ile Trp Ser
305                 310                 315                 320

Gly Gly Asn Thr Asp Tyr Asn Thr Pro Phe Thr Ser Arg Leu Ser Ile
                325                 330                 335

Asn Lys Asp Asn Ser Lys Ser Gln Val Phe Phe Lys Met Asn Ser Leu
            340                 345                 350

Gln Ser Asn Asp Thr Ala Ile Tyr Tyr Cys Ala Arg Ala Leu Thr Tyr
        355                 360                 365

Tyr Asp Tyr Glu Phe Ala Tyr Trp Gly Gln Gly Thr Leu Val Thr Val
    370                 375                 380

Ser Ala Ala Ser Thr Lys Gly Pro Ser Val Phe Pro Leu Ala Pro Ser
385                 390                 395                 400

Ser Lys Ser Thr Ser Gly Gly Thr Ala Ala Leu Gly Cys Leu Val Lys
                405                 410                 415

Asp Tyr Phe Pro Glu Pro Val Thr Val Ser Trp Asn Ser Gly Ala Leu
            420                 425                 430

Thr Ser Gly Val His Thr Phe Pro Ala Val Leu Gln Ser Ser Gly Leu
        435                 440                 445

Tyr Ser Leu Ser Ser Val Val Thr Val Pro Ser Ser Ser Leu Gly Thr
    450                 455                 460

Gln Thr Tyr Ile Cys Asn Val Asn His Lys Pro Ser Asn Thr Lys Val
465                 470                 475                 480

Asp Lys Lys Val Glu Pro Lys Ser Cys Asp Lys Thr His Thr Cys Pro
                485                 490                 495

Pro Cys Pro Ala Pro Glu Ala Ala Gly Gly Pro Ser Val Phe Leu Phe
            500                 505                 510

Pro Pro Lys Pro Lys Asp Thr Leu Met Ile Ser Arg Thr Pro Glu Val
        515                 520                 525

Thr Cys Val Val Val Asp Val Ser His Glu Asp Pro Glu Val Lys Phe
    530                 535                 540

Asn Trp Tyr Val Asp Gly Val Glu Val His Asn Ala Lys Thr Lys Pro
545                 550                 555                 560

Arg Glu Glu Gln Tyr Asn Ser Thr Tyr Arg Val Val Ser Val Leu Thr
                565                 570                 575

Val Leu His Gln Asp Trp Leu Asn Gly Lys Glu Tyr Lys Cys Lys Val
            580                 585                 590

Ser Asn Lys Ala Leu Pro Ala Pro Ile Glu Lys Thr Ile Ser Lys Ala
        595                 600                 605

Lys Gly Gln Pro Arg Glu Pro Gln Val Cys Thr Leu Pro Pro Ser Arg
    610                 615                 620

Asp Glu Leu Thr Glu Asn Gln Val Ser Leu Thr Cys Leu Val Lys Gly
625                 630                 635                 640

Phe Tyr Pro Ser Asp Ile Ala Val Glu Trp Glu Ser Asn Gly Gln Pro
                645                 650                 655

Glu Asn Asn Tyr Lys Thr Thr Pro Pro Val Leu Asp Ser Asp Gly Ser
            660                 665                 670

Phe Phe Leu Tyr Ser Trp Leu Thr Val Asp Lys Ser Arg Trp Gln Gln
        675                 680                 685
```

```
Gly Asn Val Phe Ser Cys Ser Val Met His Glu Ala Leu His Asn His
        690                 695                 700
Tyr Thr Gln Lys Ser Leu Ser Leu Ser Pro Gly
705                 710                 715
```

<210> SEQ ID NO 6
<211> LENGTH: 2145
<212> TYPE: DNA
<213> ORGANISM: Artificial Sequence
<220> FEATURE:
<223> OTHER INFORMATION: DNA encoding Third fusion protein

<400> SEQUENCE: 6

| | | |
|---|---|---|
| atgggctgga gctgtatcat acttttcctc gttgccaccg ccaccggagt gcattccgac | 60 |
| atcctgttga ctcaaagccc cgttatactg agtgtatctc cgggagaaag agtatctttc | 120 |
| agctgcagag caagtcagag tattggtacc aacattcact ggtatcagca gagaaccaac | 180 |
| gggagcccaa ggctgcttat taagtacgcc agtgaatcta tcagcggcat cccatcaaga | 240 |
| tttagcggtt caggtagcgg cactgacttt acactctcta tcaacagcgt ggagtctgaa | 300 |
| gatattgcag attactattg tcagcaaaat aataattggc ccaccacatt tggagccgga | 360 |
| acaaagctag agctgaagag aacagtcgct gctccatcgg tcttcatctt tcctcctagc | 420 |
| gacgagcagt taaagtccgg gaccgcctct gtggtgtgtc tgctcaataa cttctatcct | 480 |
| agagaggcta aagtgcagtg gaaggtggat aacgcactgc aatcgggcaa ctcacaggag | 540 |
| agcgtgacag agcaggacag caaagacagt acatactctc tgagcagcac gttgacgctc | 600 |
| agcaaagcgg attatgagaa acataaggtg tacgcttgcg aggttactca ccagggactg | 660 |
| agcagccccg tgactaaaag ctttaataga ggcgaatgct ctggcggagg atcaggtggg | 720 |
| ggctcagaag ggggggggcag cgagggcggc gggagcgaag gcggggggtag tgaaggcgga | 780 |
| gggagtggcg gaggtagcgg gcaagtgcag cttaaacagt ctggcccagg actggtacag | 840 |
| cctagccaga gcctgtccat tacttgtacc gtctctggct tttcactgac caactacggt | 900 |
| gtgcactggg tgagacagag tcctggcaaa gggcttgaat ggctcggggt tatctggtcc | 960 |
| ggtggcaata cagattacaa tacacctttc acatcccggc tcagtatcaa taaggataac | 1020 |
| tctaaatctc aggtgttctt taaaatgaac tcgctgcaaa gcaatgacac cgccatctat | 1080 |
| tactgcgctc gcgcactgac ttattacgac tatgagtttg cttattgggg acaaggaact | 1140 |
| ctggtgacag tctctgccgc ctccaccaag ggcccaagtg tgttcccact tgccccagc | 1200 |
| agcaagtcta caagcggcgg gacagctgct ctaggttgcc tggttaagga ctatttccct | 1260 |
| gagccagtta cagtaagttg gaatagcggc gcccttacaa gtggggtcca cttttcca | 1320 |
| gcagtactgc agtcgtcggg tctctatagt ctgagctctg tggtaacggt gccatctagc | 1380 |
| tcacttggca ctcagaccta catctgcaac gtgaaccata aacccagcaa caccaaagtc | 1440 |
| gacaagaaag ttgaacccaa gtcctgcgat aaaactcaca cgtgtcctcc atgtcctgct | 1500 |
| cccgaggccg caggcggacc cagtgtgttt ctgtttcctc cgaaacctaa ggataccta | 1560 |
| atgatttcac ggaccccaga ggtgacgtgc gtggtggtgg atgtgtcaca tgaggaccg | 1620 |
| gaggtcaaat tcaattggta cgtggacggc gtggaagttc acaacgctaa accaaaccc | 1680 |
| agggaagaac agtacaatag cacatataga gttgtgtcag tcctgacagt gctgcaccag | 1740 |
| gattggctga atggcaagga gtacaagtgc aaggtgagca caaggccttt gcctgcacca | 1800 |
| atcgagaaaa ccatttctaa ggccaagggc caaccccgcg aaccccaagt gtgtaccctg | 1860 |
| cccccctcta gagacgagct cactgaaaac caggtgagct aacttgtct ggtgaaggga | 1920 |

| | | |
|---|---|---|
| ttctacccaa gcgacatagc cgtagaatgg gagagcaatg gtcaacccga aaataactat | | 1980 |
| aaaacaactc ctcctgtgct ggatagcgac ggcagttttt tcctgtatag ctggctgacc | | 2040 |
| gtggataagt ctagatggca gcagggaat gtctttagct gttctgtgat gcacgaggcg | | 2100 |
| ctccataacc actacaccca gaagagcttg agcttgagcc cagga | | 2145 |

<210> SEQ ID NO 7
<211> LENGTH: 108
<212> TYPE: PRT
<213> ORGANISM: Artificial Sequence
<220> FEATURE:
<223> OTHER INFORMATION: Anti-MSLN Antibody VL

<400> SEQUENCE: 7

Asp Ile Gln Met Thr Gln Ser Pro Ser Ser Leu Ser Ala Ser Val Gly
1               5                   10                  15

Asp Arg Val Thr Ile Thr Cys Arg Ala Ser Gln Asp Val Ser Thr Ala
            20                  25                  30

Val Ala Trp Tyr Gln Gln Lys Pro Gly Lys Ala Pro Lys Leu Leu Ile
        35                  40                  45

Tyr Ser Ala Ser Tyr Arg Tyr Pro Gly Val Pro Ser Arg Phe Ser Gly
    50                  55                  60

Ser Gly Ser Gly Thr Asp Phe Thr Leu Thr Ile Ser Ser Leu Gln Pro
65                  70                  75                  80

Glu Asp Phe Ala Thr Tyr Tyr Cys Gln Gln His Tyr Ser Thr Pro Trp
                85                  90                  95

Thr Phe Gly Gly Gly Thr Lys Leu Glu Ile Lys Arg
            100                 105

<210> SEQ ID NO 8
<211> LENGTH: 324
<212> TYPE: DNA
<213> ORGANISM: Artificial Sequence
<220> FEATURE:
<223> OTHER INFORMATION: DNA encoding Anti-MSLN Antibody VL

<400> SEQUENCE: 8

| | | |
|---|---|---|
| gacattcaga tgacacagag cccgagtagc cttagtgcca gcgtcggcga tagagttaca | | 60 |
| attacttgta gacgtcaca agacgtctcc actgcagtgg cctggtatca gcagaaacca | | 120 |
| gggaaggctc ctaagttgct gatctactca gcatcatata ggtatcctgg ggtgccttca | | 180 |
| aggttttctg gtccggatc aggcacagac tttacactca cgattagctc tttgcaacct | | 240 |
| gaagatttcg caacttacta ttgtcagcag cactacagta cgccctggac gtttggtggg | | 300 |
| ggtaccaaat tggaaatcaa gcga | | 324 |

<210> SEQ ID NO 9
<211> LENGTH: 119
<212> TYPE: PRT
<213> ORGANISM: Artificial Sequence
<220> FEATURE:
<223> OTHER INFORMATION: Anti-MSLN Antibody VH

<400> SEQUENCE: 9

Glu Val Gln Leu Val Gln Ser Gly Ala Glu Val Lys Lys Pro Gly Thr
1               5                   10                  15

Ser Val Lys Val Ser Cys Lys Ala Ser Gly Tyr Ser Phe Thr Ser Tyr
            20                  25                  30

Phe Ile Gln Trp Val Arg Gln Ala Pro Gly Gln Gly Leu Glu Trp Ile
        35                  40                  45

Gly Trp Ile Phe Pro Gly Ser Gly Asn Thr Lys Tyr Ser Gln Lys Phe
    50                  55                  60

Gln Gly Arg Val Thr Ile Thr Arg Asp Thr Ser Thr Ser Thr Ala Tyr
65                  70                  75                  80

Met Glu Leu Ser Ser Leu Arg Ser Glu Asp Thr Ala Val Tyr Tyr Cys
                85                  90                  95

Ala Arg Ser Gly Gly Tyr Gln Tyr Tyr Phe Asp Tyr Trp Gly Gln Gly
            100                 105                 110

Thr Leu Val Thr Val Ser Ser
            115

<210> SEQ ID NO 10
<211> LENGTH: 357
<212> TYPE: DNA
<213> ORGANISM: Artificial Sequence
<220> FEATURE:
<223> OTHER INFORMATION: DNA encoding Anti-MSLN Antibody VH

<400> SEQUENCE: 10
gaagtgcagt tggtgcagtc cggagcagag gtgaagaagc ccggaacctc agtcaaggtt      60
agttgtaagg catccgggta ctccttcaca agttacttca tccagtgggt acgccaggca     120
ccaggtcaag gactcgagtg gataggatgg atttttcccg gctcaggaaa tactaagtat     180
tcacaaaagt tccagggtcg agtgactatt acacgagata ctagtaccag taccgcctat     240
atggaacttt ctagtcttag gagcgaagac accgctgtct attactgtgc gaggagcggg     300
gggtatcagt attactttga ctactggggg caggggacat tggtaacggt gtcatct       357

<210> SEQ ID NO 11
<211> LENGTH: 722
<212> TYPE: PRT
<213> ORGANISM: Artificial Sequence
<220> FEATURE:
<223> OTHER INFORMATION: Anti-CD3 Antibody(A15)

<400> SEQUENCE: 11

Met Asp Ser Gln Ala Gln Val Leu Met Leu Leu Leu Leu Trp Val Ser
1               5                   10                  15

Gly Thr Cys Gly Gln Ala Val Val Thr Gln Glu Pro Ser Leu Thr Val
            20                  25                  30

Ser Pro Gly Gly Thr Val Thr Leu Thr Cys Arg Ser Ser Thr Gly Ala
        35                  40                  45

Val Thr Thr Ser Asn Tyr Ala Asn Trp Val Gln Gln Lys Pro Gly Gln
    50                  55                  60

Ala Pro Arg Gly Leu Ile Gly Gly Thr Asn Lys Arg Ala Pro Trp Thr
65                  70                  75                  80

Pro Ala Arg Phe Ser Gly Ser Leu Leu Gly Gly Lys Ala Ala Leu Thr
                85                  90                  95

Leu Ser Gly Ala Gln Pro Glu Asp Glu Ala Glu Tyr Tyr Cys Ala Leu
            100                 105                 110

Trp Tyr Ser Asn Leu Trp Val Phe Gly Gly Gly Thr Lys Leu Thr Val
        115                 120                 125

Leu Gly Gln Pro Lys Ala Asn Pro Thr Val Thr Leu Phe Pro Pro Ser
    130                 135                 140

```
Ser Glu Glu Leu Gln Ala Asn Lys Ala Thr Leu Val Cys Leu Ile Ser
145                 150                 155                 160

Asp Phe Tyr Pro Gly Ala Val Thr Val Ala Trp Lys Ala Asp Gly Ser
                165                 170                 175

Pro Val Lys Ala Gly Val Glu Thr Thr Lys Pro Ser Lys Gln Ser Asn
            180                 185                 190

Asn Lys Tyr Ala Ala Ser Ser Tyr Leu Ser Leu Thr Pro Glu Gln Trp
        195                 200                 205

Lys Ser His Arg Ser Tyr Ser Cys Gln Val Thr His Glu Gly Ser Thr
    210                 215                 220

Val Glu Lys Thr Val Ala Pro Thr Glu Cys Ser Gly Gly Gly Ser Gly
225                 230                 235                 240

Gly Gly Ser Glu Gly Gly Ser Glu Gly Gly Ser Glu Gly Gly Ser Glu Gly Gly
            245                 250                 255

Gly Ser Glu Gly Gly Ser Gly Gly Gly Ser Gly Glu Val Gln Leu
            260                 265                 270

Val Glu Ser Gly Gly Gly Leu Val Gln Pro Gly Gly Ser Leu Lys Leu
    275                 280                 285

Ser Cys Ala Ala Ser Gly Phe Thr Phe Asn Thr Tyr Ala Met Asn Trp
    290                 295                 300

Val Arg Gln Ala Ser Gly Lys Gly Leu Glu Trp Val Gly Arg Ile Arg
305                 310                 315                 320

Ser Lys Tyr Asn Asn Tyr Ala Thr Tyr Tyr Ala Asp Ser Val Lys Asp
                325                 330                 335

Arg Phe Thr Ile Ser Arg Asp Asp Ser Lys Asn Thr Ala Tyr Leu Gln
                340                 345                 350

Met Asn Ser Leu Lys Thr Glu Asp Thr Ala Val Tyr Tyr Cys Val Arg
            355                 360                 365

His Gly Asn Phe Gly Asn Ser Tyr Val Ser Trp Phe Ala Tyr Trp Gly
        370                 375                 380

Gln Gly Thr Leu Val Thr Val Ser Ser Ala Ser Thr Lys Gly Pro Ser
385                 390                 395                 400

Val Phe Pro Leu Ala Pro Ser Ser Lys Ser Thr Ser Gly Gly Thr Ala
                405                 410                 415

Ala Leu Gly Cys Leu Val Lys Asp Tyr Phe Pro Glu Pro Val Thr Val
            420                 425                 430

Ser Trp Asn Ser Gly Ala Leu Thr Ser Gly Val His Thr Phe Pro Ala
        435                 440                 445

Val Leu Gln Ser Ser Gly Leu Tyr Ser Leu Ser Ser Val Val Thr Val
    450                 455                 460

Pro Ser Ser Ser Leu Gly Thr Gln Thr Tyr Ile Cys Asn Val Asn His
465                 470                 475                 480

Lys Pro Ser Asn Thr Lys Val Asp Lys Val Glu Pro Lys Ser Cys
                485                 490                 495

Asp Lys Thr His Thr Cys Pro Pro Cys Pro Ala Pro Glu Ala Ala Gly
            500                 505                 510

Gly Pro Ser Val Phe Leu Phe Pro Pro Lys Pro Lys Asp Thr Leu Met
        515                 520                 525

Ile Ser Arg Thr Pro Glu Val Thr Cys Val Val Val Asp Val Ser His
    530                 535                 540

Glu Asp Pro Glu Val Lys Phe Asn Trp Tyr Val Asp Gly Val Glu Val
545                 550                 555                 560
```

```
His Asn Ala Lys Thr Lys Pro Arg Glu Glu Gln Tyr Asn Ser Thr Tyr
            565                 570                 575

Arg Val Val Ser Val Leu Thr Val Leu His Gln Asp Trp Leu Asn Gly
        580                 585                 590

Lys Glu Tyr Lys Cys Lys Val Ser Asn Lys Ala Leu Pro Ala Pro Ile
            595                 600                 605

Glu Lys Thr Ile Ser Lys Ala Lys Gly Gln Pro Arg Glu Pro Arg Val
        610                 615                 620

Tyr Thr Leu Pro Pro Cys Arg Asp Glu Leu Thr Lys Asn Gln Val Ser
625                 630                 635                 640

Leu Thr Cys Leu Val Lys Gly Phe Tyr Pro Ser Asp Ile Ala Val Glu
                645                 650                 655

Trp Glu Ser Asn Gly Gln Pro Glu Asn Asn Tyr Lys Thr Thr Pro Pro
                660                 665                 670

Val Leu Val Ser Asp Gly Ser Phe Thr Leu Tyr Ser Lys Leu Thr Val
            675                 680                 685

Asp Lys Ser Arg Trp Gln Gln Gly Asn Val Phe Ser Cys Ser Val Met
        690                 695                 700

His Glu Ala Leu His Asn His Tyr Thr Gln Lys Ser Leu Ser Leu Ser
705                 710                 715                 720

Pro Gly
```

<210> SEQ ID NO 12
<211> LENGTH: 2166
<212> TYPE: DNA
<213> ORGANISM: Artificial Sequence
<220> FEATURE:
<223> OTHER INFORMATION: DNA encoding Anti-CD3 Antibody(A15)

<400> SEQUENCE: 12

```
atggacagtc aggcccaagt gctgatgctg cttctgctgt gggtgagcgg cacctgcggt      60
caggccgtgg ttacgcagga gcctcccctc acagtgagtc caggagggac agttacactg     120
acatgtagaa gctctactgg agccgtgact acctcaaatt acgcaaactg ggttcagcag     180
aagccaggcc aggcacctag aggcctgatc ggcggcacca taaaagagc ccctggact      240 cccgctagat tttccggcag cctgctgggc ggcaaagccg ctctgacact ttctggcgct     300
cagcccgaag acgaggccga atactattgc gcgctgtggt atagcaatct gtgggtcttt     360
ggcggtggca ccaaactgac cgtgttgggt cagccaaaag ctaaccctac agtaacattg     420
tttcctccaa gttccgaaga attgcaggcc aataaagcaa ctctggtgtg tctgattagc     480
gatttctatc caggcgccgt gaccgtggcc tggaaagcag atggaagccc tgtgaaagct     540
ggagttgaga ctactaagcc cagcaaacag agcaacaaca gtacgcagc gagtagctac      600 cttagcttaa ctccggagca gtggaagagc catgaagct attcttgcca ggtgacccac      660
gagggaagta ctgtagagaa aaccgttgct cctaccgaat gttcgggtgg cggtagtggc     720
ggaggcagcg agggcggcgg aagcgagggc ggggtagcg agggtggcgg cagcgagggc      780
ggcggcagcg aggcggctc aggcgaagtg caactggtgg aaagcggcgg cggcctcgtg     840
cagcccggtg atcgcttaa gttaagttgt gccgccagtg ggttcacctt caacacctat      900
gcaatgaact gggttagaca agccagcggc aaaggactag aatgggtagg cagaatacga      960
tctaaataca acaattatgc tacctattac gctgactctg tcaaggatag atttacaatc    1020
tcacgcgatg actctaagaa cacagcatac ctccaaatga attcattgaa accgaggac    1080 accgctgtgt actactgcgt gagacacgga aatttcggca atagctatgt tagctggttc   1140
```

```
gcatactggg gccaaggtac cctagtgact gtgtcatcag cctccaccaa gggcccaagc    1200
gtctttccct tagcaccctc gagcaaatcc actagcgggg gcaccgccgc actcggatgt    1260
ctggtgaagg attattttcc tgaacctgtg accgtaagtt ggaatagcgg cgccctgacc    1320
agcggtgttc atacgttccc cgctgtattg caatccagcg gcctctactc actgagcagt    1380
gtggtgacag tgccatcaag cagccttgga acgcagacta tatatgtaa cgttaaccac    1440 aagccatcta acactaaagt ggacaaaaag gtcgagccta agagctgtga taagacccac    1500
acatgccccc cctgcccagc ccccgaggcg gctggtggcc ccagtgtttt cctgtttcct    1560
cctaagccta aagacaccct gatgatctca aggacaccgg aggtcacctg tgttgtggtg    1620
gacgtgtccc acgaggaccc agaggtcaag tttaactggt acgtggacgg tgtggaagtt    1680
cataacgcaa aaacaaagcc acgcgaggaa cagtacaatt caacatacag agtggtgtct    1740
gtgctgacag tgctgcacca ggattggctg aatgggaaag agtacaagtg caaggtgtcc    1800
aataaagccc tccccgcccc gattgagaag acaattagca aagctaaagg acagccaaga    1860
gaacctagag tatacaccct ccctcccgc cgggatgagt tgacaaagaa tcaagtgtct    1920
ttaacctgtc tggttaaagg cttctacccc tcggacatcg ctgtggaatg ggaaagcaat    1980
gggcagcccg aaaacaacta taagaccact cctcccgtcc tggtatcaga tggctccttc    2040
accctgtata gcaaactgac tgtggataaa agcagatggc agcagggaaa cgttttcagc    2100
tgctccgtga tgcacgaggc ccttcataat cattataccc agaaaagcct tagtctgagt    2160
cccggc                                                              2166
```

<210> SEQ ID NO 13
<211> LENGTH: 110
<212> TYPE: PRT
<213> ORGANISM: Artificial Sequence
<220> FEATURE:
<223> OTHER INFORMATION: Anti-CD3 Antibody(A15) VL

<400> SEQUENCE: 13

Gln Ala Val Val Thr Gln Glu Pro Ser Leu Thr Val Ser Pro Gly Gly
1               5                   10                  15

Thr Val Thr Leu Thr Cys Arg Ser Ser Thr Gly Ala Val Thr Thr Ser
            20                  25                  30

Asn Tyr Ala Asn Trp Val Gln Gln Lys Pro Gly Gln Ala Pro Arg Gly
        35                  40                  45

Leu Ile Gly Gly Thr Asn Lys Arg Ala Pro Trp Thr Pro Ala Arg Phe
    50                  55                  60

Ser Gly Ser Leu Leu Gly Gly Lys Ala Ala Leu Thr Leu Ser Gly Ala
65                  70                  75                  80

Gln Pro Glu Asp Glu Ala Glu Tyr Tyr Cys Ala Leu Trp Tyr Ser Asn
                85                  90                  95

Leu Trp Val Phe Gly Gly Gly Thr Lys Leu Thr Val Leu Gly
            100                 105                 110

<210> SEQ ID NO 14
<211> LENGTH: 330
<212> TYPE: DNA
<213> ORGANISM: Artificial Sequence
<220> FEATURE:
<223> OTHER INFORMATION: DNA encoding Anti-CD3 Antibody(A15) VL

<400> SEQUENCE: 14

```
caggccgtgg ttacgcagga gccctccctc acagtgagtc caggagggac agttacactg      60
acatgtagaa gctctactgg agccgtgact acctcaaatt acgcaaactg ggttcagcag     120
aagccaggcc aggcacctag aggcctgatc ggcggcacca ataaaagagc cccctggact     180
cccgctagat tttccggcag cctgctgggc ggcaaagccg ctctgacact ttctggcgct     240
cagcccgaag acgaggccga atactattgc gcgctgtggt atagcaatct gtgggtcttt     300
ggcggtggca ccaaactgac cgtgttgggt                                       330
```

<210> SEQ ID NO 15
<211> LENGTH: 125
<212> TYPE: PRT
<213> ORGANISM: Artificial Sequence
<220> FEATURE:
<223> OTHER INFORMATION: Anti-CD3 Antibody(A15) VH

<400> SEQUENCE: 15

```
Glu Val Gln Leu Val Glu Ser Gly Gly Gly Leu Val Gln Pro Gly Gly
1               5                   10                  15

Ser Leu Lys Leu Ser Cys Ala Ala Ser Gly Phe Thr Phe Asn Thr Tyr
            20                  25                  30

Ala Met Asn Trp Val Arg Gln Ala Ser Gly Lys Gly Leu Glu Trp Val
        35                  40                  45

Gly Arg Ile Arg Ser Lys Tyr Asn Asn Tyr Ala Thr Tyr Tyr Ala Asp
    50                  55                  60

Ser Val Lys Asp Arg Phe Thr Ile Ser Arg Asp Asp Ser Lys Asn Thr
65                  70                  75                  80

Ala Tyr Leu Gln Met Asn Ser Leu Lys Thr Glu Asp Thr Ala Val Tyr
                85                  90                  95

Tyr Cys Val Arg His Gly Asn Phe Gly Asn Ser Tyr Val Ser Trp Phe
            100                 105                 110

Ala Tyr Trp Gly Gln Gly Thr Leu Val Thr Val Ser Ser
        115                 120                 125
```

<210> SEQ ID NO 16
<211> LENGTH: 375
<212> TYPE: DNA
<213> ORGANISM: Artificial Sequence
<220> FEATURE:
<223> OTHER INFORMATION: DNA encoding Anti-CD3 Antibody(A15) VH

<400> SEQUENCE: 16

```
gaagtgcaac tggtggaaag cggcggcggc ctcgtgcagc ccggtggatc gcttaagtta      60
agttgtgccg ccagtgggtt caccttcaac acctatgcaa tgaactgggt tagacaagcc     120
agcggcaaag gactagaatg ggtaggcaga atacgatcta aatacaacaa ttatgctacc     180
tattacgctg actctgtcaa ggatagattt acaatctcac gcgatgactc taagaacaca     240
gcatacctcc aaatgaattc attgaaaacc gaggacaccg ctgtgtacta ctgcgtgaga     300
cacggaaatt tcggcaatag ctatgttagc tggttcgcat actggggcca aggtacccta     360
gtgactgtgt catca                                                       375
```

<210> SEQ ID NO 17
<211> LENGTH: 108
<212> TYPE: PRT
<213> ORGANISM: Artificial Sequence
<220> FEATURE:

<223> OTHER INFORMATION: Anti-EGFR Antibody VL

<400> SEQUENCE: 17

```
Asp Ile Leu Leu Thr Gln Ser Pro Val Ile Leu Ser Val Ser Pro Gly
1               5                   10                  15

Glu Arg Val Ser Phe Ser Cys Arg Ala Ser Gln Ser Ile Gly Thr Asn
            20                  25                  30

Ile His Trp Tyr Gln Gln Arg Thr Asn Gly Ser Pro Arg Leu Leu Ile
        35                  40                  45

Lys Tyr Ala Ser Glu Ser Ile Ser Gly Ile Pro Ser Arg Phe Ser Gly
    50                  55                  60

Ser Gly Ser Gly Thr Asp Phe Thr Leu Ser Ile Asn Ser Val Glu Ser
65                  70                  75                  80

Glu Asp Ile Ala Asp Tyr Tyr Cys Gln Gln Asn Asn Asn Trp Pro Thr
                85                  90                  95

Thr Phe Gly Ala Gly Thr Lys Leu Glu Leu Lys Arg
            100                 105
```

<210> SEQ ID NO 18
<211> LENGTH: 324
<212> TYPE: DNA
<213> ORGANISM: Artificial Sequence
<220> FEATURE:
<223> OTHER INFORMATION: DNA encoding Anti-EGFR Antibody VL

<400> SEQUENCE: 18

```
gacatcctgt tgactcaaag ccccgttata ctgagtgtat ctccgggaga aagagtatct    60
ttcagctgca gagcaagtca gagtattggt accaacattc actggtatca gcagagaacc   120
aacgggagcc caaggctgct tattaagtac gccagtgaat ctatcagcgg catcccatca   180
agatttagcg gttcaggtag cggcactgac tttacactct ctatcaacag cgtggagtct   240
gaagatattg cagattacta ttgtcagcaa aataataatt ggcccaccac atttggagcc   300
ggaacaaagc tagagctgaa gaga                                          324
```

<210> SEQ ID NO 19
<211> LENGTH: 119
<212> TYPE: PRT
<213> ORGANISM: Artificial Sequence
<220> FEATURE:
<223> OTHER INFORMATION: Anti-EGFR Antibody VH

<400> SEQUENCE: 19

```
Gln Val Gln Leu Lys Gln Ser Gly Pro Gly Leu Val Gln Pro Ser Gln
1               5                   10                  15

Ser Leu Ser Ile Thr Cys Thr Val Ser Gly Phe Ser Leu Thr Asn Tyr
            20                  25                  30

Gly Val His Trp Val Arg Gln Ser Pro Gly Lys Gly Leu Glu Trp Leu
        35                  40                  45

Gly Val Ile Trp Ser Gly Gly Asn Thr Asp Tyr Asn Thr Pro Phe Thr
    50                  55                  60

Ser Arg Leu Ser Ile Asn Lys Asp Asn Ser Lys Ser Gln Val Phe Phe
65                  70                  75                  80

Lys Met Asn Ser Leu Gln Ser Asn Asp Thr Ala Ile Tyr Tyr Cys Ala
                85                  90                  95

Arg Ala Leu Thr Tyr Tyr Asp Tyr Glu Phe Ala Tyr Trp Gly Gln Gly
            100                 105                 110
```

```
Thr Leu Val Thr Val Ser Ala
        115

<210> SEQ ID NO 20
<211> LENGTH: 357
<212> TYPE: DNA
<213> ORGANISM: Artificial Sequence
<220> FEATURE:
<223> OTHER INFORMATION: DNA encoding Anti-EGFR Antibody VH

<400> SEQUENCE: 20
caagtgcagc ttaaacagtc tggcccagga ctggtacagc ctagccagag cctgtccatt      60
acttgtaccg tctctggctt ttcactgacc aactacggtg tgcactgggt gagacagagt     120
cctggcaaag ggcttgaatg gctcggggtt atctggtccg gtggcaatac agattacaat     180
acacctttca catcccggct cagtatcaat aaggataact ctaaatctca ggtgttcttt     240
aaaatgaact cgctgcaaag caatgacacc gccatctatt actgcgctcg cgcactgact     300
tattacgact atgagtttgc ttattgggga caaggaactc tggtgacagt ctctgcc        357

<210> SEQ ID NO 21
<211> LENGTH: 722
<212> TYPE: PRT
<213> ORGANISM: Artificial Sequence
<220> FEATURE:
<223> OTHER INFORMATION: Anti-CD3 Antibody(A07)

<400> SEQUENCE: 21

Met Asp Ser Gln Ala Gln Val Leu Met Leu Leu Leu Leu Trp Val Ser
1               5                   10                  15

Gly Thr Cys Gly Gln Ala Val Val Thr Gln Glu Pro Ser Leu Thr Val
            20                  25                  30

Ser Pro Gly Gly Thr Val Thr Leu Thr Cys Arg Ser Ser Thr Gly Ala
        35                  40                  45

Val Thr Thr Ser Asn Tyr Ala Asn Trp Phe Gln Gln Lys Pro Gly Gln
    50                  55                  60

Ala Pro Arg Gly Leu Ile Gly Gly Thr Asn Lys Arg Ala Pro Trp Thr
65                  70                  75                  80

Pro Ala Arg Phe Ser Gly Ser Leu Leu Gly Gly Lys Ala Ala Leu Thr
                85                  90                  95

Leu Ser Gly Ala Gln Pro Glu Asp Glu Ala Glu Tyr Tyr Cys Ala Leu
            100                 105                 110

Trp Tyr Ser Asn Leu Trp Val Phe Gly Gly Gly Thr Lys Leu Thr Val
        115                 120                 125

Leu Gly Gln Pro Lys Ala Asn Pro Thr Val Thr Leu Phe Pro Pro Ser
    130                 135                 140

Ser Glu Glu Leu Gln Ala Asn Lys Ala Thr Leu Val Cys Leu Ile Ser
145                 150                 155                 160

Asp Phe Tyr Pro Gly Ala Val Thr Val Ala Trp Lys Ala Asp Gly Ser
                165                 170                 175

Pro Val Lys Ala Gly Val Glu Thr Thr Lys Pro Ser Lys Gln Ser Asn
            180                 185                 190

Asn Lys Tyr Ala Ala Ser Ser Tyr Leu Ser Leu Thr Pro Glu Gln Trp
        195                 200                 205

Lys Ser His Arg Ser Tyr Ser Cys Gln Val Thr His Glu Gly Ser Thr
    210                 215                 220
```

```
Val Glu Lys Thr Val Ala Pro Thr Glu Cys Ser Gly Gly Ser Gly
225                 230                 235                 240

Gly Gly Ser Glu Gly Gly Ser Glu Gly Gly Ser Glu Gly Gly
            245                 250                 255

Gly Ser Glu Gly Gly Ser Gly Gly Ser Gly Val Gln Leu
        260                 265                 270

Val Glu Ser Gly Gly Gly Leu Val Gln Pro Gly Gly Ser Leu Lys Leu
        275                 280                 285

Ser Cys Ala Ala Ser Gly Phe Thr Phe Asn Thr Tyr Ala Met Asn Trp
        290                 295                 300

Val Arg Gln Ala Ser Gly Lys Gly Leu Glu Trp Val Gly Arg Ile Arg
305                 310                 315                 320

Ser Lys Tyr Asn Asn Tyr Ala Thr Tyr Tyr Ala Asp Ser Val Lys Asp
                325                 330                 335

Arg Phe Thr Ile Ser Arg Asp Asp Ser Lys Asn Thr Ala Tyr Leu Gln
            340                 345                 350

Met Asn Ser Leu Lys Thr Glu Asp Thr Ala Val Tyr Tyr Cys Val Arg
        355                 360                 365

His Gly Asn Phe Gly Asn Ser Tyr Val Ser Trp Phe Ala Tyr Trp Gly
        370                 375                 380

Gln Gly Thr Leu Val Thr Val Ser Ser Ala Ser Thr Lys Gly Pro Ser
385                 390                 395                 400

Val Phe Pro Leu Ala Pro Ser Ser Lys Ser Thr Ser Gly Gly Thr Ala
            405                 410                 415

Ala Leu Gly Cys Leu Val Lys Asp Tyr Phe Pro Glu Pro Val Thr Val
            420                 425                 430

Ser Trp Asn Ser Gly Ala Leu Thr Ser Gly Val His Thr Phe Pro Ala
        435                 440                 445

Val Leu Gln Ser Ser Gly Leu Tyr Ser Leu Ser Ser Val Val Thr Val
        450                 455                 460

Pro Ser Ser Ser Leu Gly Thr Gln Thr Tyr Ile Cys Asn Val Asn His
465                 470                 475                 480

Lys Pro Ser Asn Thr Lys Val Asp Lys Val Glu Pro Lys Ser Cys
                485                 490                 495

Asp Lys Thr His Thr Cys Pro Pro Cys Pro Ala Pro Glu Ala Ala Gly
            500                 505                 510

Gly Pro Ser Val Phe Leu Phe Pro Pro Lys Pro Lys Asp Thr Leu Met
        515                 520                 525

Ile Ser Arg Thr Pro Glu Val Thr Cys Val Val Val Asp Val Ser His
        530                 535                 540

Glu Asp Pro Glu Val Lys Phe Asn Trp Tyr Val Asp Gly Val Glu Val
545                 550                 555                 560

His Asn Ala Lys Thr Lys Pro Arg Glu Glu Gln Tyr Asn Ser Thr Tyr
                565                 570                 575

Arg Val Val Ser Val Leu Thr Val Leu His Gln Asp Trp Leu Asn Gly
            580                 585                 590

Lys Glu Tyr Lys Cys Lys Val Ser Asn Lys Ala Leu Pro Ala Pro Ile
        595                 600                 605

Glu Lys Thr Ile Ser Lys Ala Lys Gly Gln Pro Arg Glu Pro Arg Val
        610                 615                 620

Tyr Thr Leu Pro Pro Cys Arg Asp Glu Leu Thr Lys Asn Gln Val Ser
625                 630                 635                 640
```

| | | | | | | | | | | | |
|---|---|---|---|---|---|---|---|---|---|---|---|
|Leu|Thr|Cys|Leu|Val|Lys|Gly|Phe|Tyr|Pro|Ser|Asp|Ile|Ala|Val|Glu|
| | | |645| | | |650| | | |655|

Leu Thr Cys Leu Val Lys Gly Phe Tyr Pro Ser Asp Ile Ala Val Glu
            645                 650                 655

Trp Glu Ser Asn Gly Gln Pro Glu Asn Asn Tyr Lys Thr Thr Pro Pro
            660                 665                 670

Val Leu Val Ser Asp Gly Ser Phe Thr Leu Tyr Ser Lys Leu Thr Val
            675                 680                 685

Asp Lys Ser Arg Trp Gln Gln Gly Asn Val Phe Ser Cys Ser Val Met
690                 695                 700

His Glu Ala Leu His Asn His Tyr Thr Gln Lys Ser Leu Ser Leu Ser
705                 710                 715                 720

Pro Gly

<210> SEQ ID NO 22
<211> LENGTH: 2166
<212> TYPE: DNA
<213> ORGANISM: Artificial Sequence
<220> FEATURE:
<223> OTHER INFORMATION: DNA encoding Anti-CD3 Antibody(A07)

<400> SEQUENCE: 22

```
atggacagcc aagcccaggt gctgatgctg ctccttcttt gggtgagcgg tacttgcggt      60
caggcggtgg tgacccagga accatctctc actgtatcac ctggaggaac cgtaacccttt   120
acctgcagat ccagcaccgg ggctgtcaca caagcaact acgctaattg gtttcagcag    180
aaaccgggcc aagcacctag aggtttaatc ggaggcacga ataaacgggc accttggacg    240
ccagccagat ttagtggttc acttctggga gggaaagcgg ctctgactct gagcggtgca    300
cagccagaag atgaggcgga gtattattgt gctctgtggt acagcaactt gtgggttttt    360
ggtggcggca caaagttgac tgtgctaggc cagccaaagg ctaatcccac tgtcacactg    420
tttcctccct cgagtgagga attgcaggcc aacaaggcta cactggtctg tctgattagc    480
gacttctacc ccggcgctgt gaccgtcgcc tggaaagccg acggttcacc cgtgaaggcc    540
ggagtggaga ccaccaagcc gagcaagcaa agcaataaca aatatgcagc aagcagctac    600
ttaagtctga ccccagaaca atggaagagc atcggtcttt atgctgcca agtgacccac    660
gagggctcta ccgtggaaaa gactgttgct cccactgaat gctcgggtgg cggtagtggc    720
ggaggcagcg agggcggcgg aagcgagggc ggggtagcg agggtggcgg cagcgagggc    780
ggcggcagcg aggcggctc aggcgaagtg cagctggtag agtctggcgg aggcctagtt    840
cagcctgggg gcagcctgaa gttgagctgt gctgccagcg gcttcacctt caacacatac    900
gccatgaatt gggtgcgaca ggcaagcggc aaaggcctgg agtgggtggg aagaattagg    960
agcaaatata caattacgc cacctattac gccgactcgg tcaaagatag attcaccatc   1020
agtagagacg atagcaagaa caccgcctat ctgcagatga actcattaaa aacagaagat   1080
acagccgtgt actactgtgt gagacacgga aactttggca atagctatgt ttcatggttc   1140
gcctattggg gccagggaac tctcgttact gtgtctagcg cctccaccaa gggcccaagc   1200
gtctttccct tagcacctc gagcaaatcc actagcgggg gcaccgccgc actcggatgt   1260
ctggtgaagg attattttcc tgaacctgtg accgtaagtt ggaatagcgg cgccctgacc   1320
agcggtgttc atacgttccc cgctgtattg caatccagcg gcctctactc actgagcagt   1380
gtggtgacag tgccatcaag cagccttgga acgcagactt atatatgtaa cgttaaccac   1440
aagccatcta acactaaagt ggacaaaaag gtcgagccta agagctgtga taagacccac   1500
acatgccccc cctgcccagc cccgaggcg ctggtggcc ccagtgtttt cctgttttcct   1560
```

```
cctaagccta aagacaccct gatgatctca aggacaccgg aggtcacctg tgttgtggtg    1620
gacgtgtccc acgaggaccc agaggtcaag tttaactggt acgtggacgg tgtggaagtt    1680
cataacgcaa aaacaaagcc acgcgaggaa cagtacaatt caacatacag agtggtgtct    1740
gtgctgacag tgctgcacca ggattggctg aatgggaaag agtacaagtg caaggtgtcc    1800
aataaagccc tccccgcccc gattgagaag acaattagca agctaaagg acagccaaga     1860 gaacctagag tatacaccct ccctccctgc cgggatgagt tgacaaagaa tcaagtgtct    1920
ttaacctgtc tggttaaagg cttctacccc tcggacatcg ctgtggaatg ggaaagcaat    1980
gggcagcccg aaaacaacta taagaccact cctcccgtcc tggtatcaga tggctccttc    2040
accctgtata gcaaactgac tgtggataaa agcagatggc agcagggaaa cgttttcagc    2100
tgctccgtga tgcacgaggc ccttcataat cattataccc agaaaagcct tagtctgagt    2160
cccggc                                                               2166
```

<210> SEQ ID NO 23
<211> LENGTH: 722
<212> TYPE: PRT
<213> ORGANISM: Artificial Sequence
<220> FEATURE:
<223> OTHER INFORMATION: Anti-CD3 Antibody(E15)

<400> SEQUENCE: 23

```
Met Asp Ser Gln Ala Gln Val Leu Met Leu Leu Leu Leu Trp Val Ser
1               5                   10                  15

Gly Thr Cys Gly Gln Ala Val Val Thr Gln Glu Pro Ser Leu Thr Val
            20                  25                  30

Ser Pro Gly Gly Thr Val Thr Leu Thr Cys Arg Ser Ser Thr Gly Ala
        35                  40                  45

Val Thr Thr Ser Asn Tyr Ala Asn Trp Val Gln Gln Lys Pro Gly Gln
    50                  55                  60

Ala Pro Arg Gly Leu Ile Gly Gly Thr Asn Lys Arg Ala Pro Trp Thr
65                  70                  75                  80

Pro Ala Arg Phe Ser Gly Ser Leu Leu Gly Gly Lys Ala Ala Leu Thr
                85                  90                  95

Leu Ser Gly Ala Gln Pro Glu Asp Glu Ala Glu Tyr Tyr Cys Ala Leu
            100                 105                 110

Trp Tyr Ser Asn Leu Trp Val Phe Gly Gly Gly Thr Lys Leu Thr Val
        115                 120                 125

Leu Gly Gln Pro Lys Ala Asn Pro Thr Val Thr Leu Phe Pro Pro Ser
    130                 135                 140

Ser Glu Glu Leu Gln Ala Asn Lys Ala Thr Leu Val Cys Leu Ile Ser
145                 150                 155                 160

Asp Phe Tyr Pro Gly Ala Val Thr Val Ala Trp Lys Ala Asp Gly Ser
                165                 170                 175

Pro Val Lys Ala Gly Val Glu Thr Thr Lys Pro Ser Lys Gln Ser Asn
            180                 185                 190

Asn Lys Tyr Ala Ala Ser Ser Tyr Leu Ser Leu Thr Pro Glu Gln Trp
        195                 200                 205

Lys Ser His Arg Ser Tyr Ser Cys Gln Val Thr His Glu Gly Ser Thr
    210                 215                 220

Val Glu Lys Thr Val Ala Pro Thr Glu Cys Ser Gly Gly Gly Ser Gly
225                 230                 235                 240

Gly Gly Ser Glu Gly Gly Gly Ser Glu Gly Gly Gly Ser Glu Gly Gly
                245                 250                 255
```

```
Gly Ser Glu Gly Gly Ser Gly Gly Ser Gly Glu Val Gln Leu
            260                 265             270

Val Glu Ser Gly Gly Gly Leu Val Gln Pro Gly Gly Ser Leu Lys Leu
        275                 280                 285

Ser Cys Ala Ala Ser Gly Phe Thr Phe Asn Thr Tyr Ala Met Asn Trp
    290                 295                 300

Val Arg Gln Ala Ser Gly Lys Gly Leu Glu Trp Val Ala Arg Ile Arg
305                 310                 315                 320

Ser Lys Tyr Asn Asn Tyr Ala Thr Tyr Tyr Ala Asp Ser Val Lys Asp
                325                 330                 335

Arg Phe Thr Ile Ser Arg Asp Asp Ser Lys Asn Thr Ala Tyr Leu Gln
        340                 345                 350

Met Asn Ser Leu Lys Thr Glu Asp Thr Ala Val Tyr Tyr Cys Val Arg
    355                 360                 365

His Gly Asn Phe Gly Asn Ser Tyr Val Ser Trp Phe Ala Tyr Trp Gly
370                 375                 380

Gln Gly Thr Leu Val Thr Val Ser Ser Ala Ser Thr Lys Gly Pro Ser
385                 390                 395                 400

Val Phe Pro Leu Ala Pro Ser Ser Lys Ser Thr Ser Gly Gly Thr Ala
                405                 410                 415

Ala Leu Gly Cys Leu Val Lys Asp Tyr Phe Pro Glu Pro Val Thr Val
        420                 425                 430

Ser Trp Asn Ser Gly Ala Leu Thr Ser Gly Val His Thr Phe Pro Ala
    435                 440                 445

Val Leu Gln Ser Ser Gly Leu Tyr Ser Leu Ser Ser Val Val Thr Val
450                 455                 460

Pro Ser Ser Ser Leu Gly Thr Gln Thr Tyr Ile Cys Asn Val Asn His
465                 470                 475                 480

Lys Pro Ser Asn Thr Lys Val Asp Lys Lys Val Glu Pro Lys Ser Cys
                485                 490                 495

Asp Lys Thr His Thr Cys Pro Pro Cys Pro Ala Pro Glu Ala Ala Gly
        500                 505                 510

Gly Pro Ser Val Phe Leu Phe Pro Pro Lys Pro Lys Asp Thr Leu Met
    515                 520                 525

Ile Ser Arg Thr Pro Glu Val Thr Cys Val Val Val Asp Val Ser His
530                 535                 540

Glu Asp Pro Glu Val Lys Phe Asn Trp Tyr Val Asp Gly Val Glu Val
545                 550                 555                 560

His Asn Ala Lys Thr Lys Pro Arg Glu Glu Gln Tyr Asn Ser Thr Tyr
                565                 570                 575

Arg Val Val Ser Val Leu Thr Val Leu His Gln Asp Trp Leu Asn Gly
        580                 585                 590

Lys Glu Tyr Lys Cys Lys Val Ser Asn Lys Ala Leu Pro Ala Pro Ile
    595                 600                 605

Glu Lys Thr Ile Ser Lys Ala Lys Gly Gln Pro Arg Glu Pro Arg Val
610                 615                 620

Tyr Thr Leu Pro Pro Cys Arg Asp Glu Leu Thr Lys Asn Gln Val Ser
625                 630                 635                 640

Leu Thr Cys Leu Val Lys Gly Phe Tyr Pro Ser Asp Ile Ala Val Glu
                645                 650                 655

Trp Glu Ser Asn Gly Gln Pro Glu Asn Asn Tyr Lys Thr Thr Pro Pro
        660                 665                 670
```

```
Val Leu Val Ser Asp Gly Ser Phe Thr Leu Tyr Ser Lys Leu Thr Val
            675                 680                 685

Asp Lys Ser Arg Trp Gln Gln Gly Asn Val Phe Ser Cys Ser Val Met
        690                 695                 700

His Glu Ala Leu His Asn His Tyr Thr Gln Lys Ser Leu Ser Leu Ser
705                 710                 715                 720

Pro Gly

<210> SEQ ID NO 24
<211> LENGTH: 2166
<212> TYPE: DNA
<213> ORGANISM: Artificial Sequence
<220> FEATURE:
<223> OTHER INFORMATION: DNA encoding Anti-CD3 Antibody(E15)

<400> SEQUENCE: 24
```

| | | | | | |
|---|---|---|---|---|---|
| atggatagcc | aggctcaggt | cctaatgcta | ctgctgctgt | gggtgagcgg | tacatgtggc | 60 |
| caagcagttg | taacacaaga | gcctagtctg | accgtctctc | cggcggcac | cgtgactctt | 120 |
| acatgcagaa | gttccaccgg | agccgtcaca | acctcaaatt | acgccaactg | gtccagcag | 180 |
| aaacccgggc | aggcccaag | aggattgatc | ggcggtacta | caagcgagc | accatggacc | 240 |
| cccgccagat | ttagtggcag | ccttctgggc | ggcaaagcag | cactgacctt | atcaggcgcc | 300 |
| cagcctgagg | atgaggccga | gtattattgt | gccctgtggt | acagcaattt | gtgggtattc | 360 |
| ggcggcggga | cgaaactcac | ctgttctcggc | cagccaaagg | ccaaccctac | ggtcactctt | 420 |
| ttcccgccta | gcagtgagga | actgcaggca | acaaggcaa | cactggtgtg | tctgattagc | 480 |
| gactttatc | ctggggcggt | gactgtggcc | tggaaagctg | atggctcccc | agttaaggcc | 540 |
| ggcgtggaaa | ccaccaagcc | cagcaaacag | agcaataata | gtatgccgc | gtcaagctac | 600 |
| ctgagcctta | caccagagca | atggaaaagc | catagatcat | acagctgtca | agtaacacac | 660 |
| gaaggctcca | ccgtggagaa | gacagtggcc | cccactgaat | gctcgggtgg | cggtagtggc | 720 |
| ggaggcagcg | agggcggcgg | aagcgagggc | ggggtagcg | agggtggcgg | cagcgagggc | 780 |
| ggcggcagcg | gaggcggctc | aggcgaagtc | caactggtgg | agtcaggagg | aggcctggtt | 840 |
| cagcccggcg | gcagcctgaa | gctgagctgc | cagcgagcg | gattcacatt | caacacctac | 900 |
| gccatgaact | gggttagaca | ggcctctggg | aaaggattag | agtgggtggc | cagaattaga | 960 |
| agtaagtaca | acaattacgc | tacttattac | gctgactcgg | tgaaagatag | attcacaatc | 1020 |
| agcagagacg | acagtaagaa | tactgcctat | ctgcagatga | acagcttgaa | gactgaagac | 1080 |
| acggctgtgt | attactgcgt | gagacacggc | aactttggga | attcttacgt | gtcttggttt | 1140 |
| gcttattggg | gccagggcac | cttggtgaca | gtcagtagcg | cctccaccaa | gggcccaagc | 1200 |
| gtctttccct | tagcaccctc | gagcaaatcc | actagcgggg | gcaccgccgc | actcggatgt | 1260 |
| ctggtgaagg | attattttcc | tgaacctgtg | accgtaagtt | ggaatagcgg | cgccctgacc | 1320 |
| agcggtgttc | atacgttccc | cgctgtattg | caatccagcg | gcctctactc | actgagcagt | 1380 |
| gtggtgacag | tgccatcaag | cagccttgga | acgcagactt | atatatgtaa | cgttaaccac | 1440 |
| aagccatcta | acactaaagt | ggacaaaaag | gtcgagccta | agagctgtga | taagacccac | 1500 |
| acatgccccc | cctgcccagc | ccccgaggcg | ctggtggcc | ccagtgtttt | cctgtttcct | 1560 |
| cctaagccta | agacaccct | gatgatctca | aggacaccgg | aggtcacctg | tgttgtggtg | 1620 |
| gacgtgtccc | acgaggaccc | agaggtcaag | tttaactggt | acgtggacgg | tgtggaagtt | 1680 |
| cataacgcaa | aaacaaagcc | acgcgaggaa | cagtacaatt | caacatacag | agtggtgtct | 1740 |

```
gtgctgacag tgctgcacca ggattggctg aatgggaaag agtacaagtg caaggtgtcc    1800
aataaagccc tccccgcccc gattgagaag acaattagca aagctaaagg acagccaaga    1860
gaacctagag tatacaccct ccctcccctgc cgggatgagt tgacaaagaa tcaagtgtct   1920
ttaacctgtc tggttaaagg cttctacccc tcggacatcg ctgtggaatg ggaaagcaat    1980
gggcagcccg aaacaacta taagaccact cctcccgtcc tggtatcaga tggctccttc    2040
accctgtata gcaaactgac tgtggataaa agcagatggc agcagggaaa cgttttcagc    2100
tgctccgtga tgcacgaggc ccttcataat cattataccc agaaaagcct tagtctgagt    2160
cccggc                                                               2166
```

<210> SEQ ID NO 25
<211> LENGTH: 11
<212> TYPE: PRT
<213> ORGANISM: Artificial Sequence
<220> FEATURE:
<223> OTHER INFORMATION: Anti-MSLN Antibody LCDR1

<400> SEQUENCE: 25

Arg Ala Ser Gln Asp Val Ser Thr Ala Val Ala
1               5                   10

<210> SEQ ID NO 26
<211> LENGTH: 7
<212> TYPE: PRT
<213> ORGANISM: Artificial Sequence
<220> FEATURE:
<223> OTHER INFORMATION: Anti-MSLN Antibody LCDR2

<400> SEQUENCE: 26

Ser Ala Ser Tyr Arg Tyr Pro
1               5

<210> SEQ ID NO 27
<211> LENGTH: 8
<212> TYPE: PRT
<213> ORGANISM: Artificial Sequence
<220> FEATURE:
<223> OTHER INFORMATION: Anti-MSLN Antibody LCDR3

<400> SEQUENCE: 27

Gln Gln His Tyr Ser Thr Pro Trp
1               5

<210> SEQ ID NO 28
<211> LENGTH: 5
<212> TYPE: PRT
<213> ORGANISM: Artificial Sequence
<220> FEATURE:
<223> OTHER INFORMATION: Anti-MSLN Antibody HCDR1

<400> SEQUENCE: 28

Ser Tyr Phe Ile Gln
1               5

<210> SEQ ID NO 29
<211> LENGTH: 17
<212> TYPE: PRT
<213> ORGANISM: Artificial Sequence
<220> FEATURE:
<223> OTHER INFORMATION: Anti-MSLN Antibody HCDR2

```
<400> SEQUENCE: 29

Trp Ile Phe Pro Gly Ser Gly Asn Thr Lys Tyr Ser Gln Lys Phe Gln
1               5                   10                  15
Gly

<210> SEQ ID NO 30
<211> LENGTH: 10
<212> TYPE: PRT
<213> ORGANISM: Artificial Sequence
<220> FEATURE:
<223> OTHER INFORMATION: Anti-MSLN Antibody HCDR3

<400> SEQUENCE: 30

Ser Gly Gly Tyr Gln Tyr Tyr Phe Asp Tyr
1               5                   10

<210> SEQ ID NO 31
<211> LENGTH: 14
<212> TYPE: PRT
<213> ORGANISM: Artificial Sequence
<220> FEATURE:
<223> OTHER INFORMATION: Anti-CD3 Antibody(A15) LCDR1

<400> SEQUENCE: 31

Arg Ser Ser Thr Gly Ala Val Thr Thr Ser Asn Tyr Ala Asn
1               5                   10

<210> SEQ ID NO 32
<211> LENGTH: 7
<212> TYPE: PRT
<213> ORGANISM: Artificial Sequence
<220> FEATURE:
<223> OTHER INFORMATION: Anti-CD3 Antibody(A15) LCDR2

<400> SEQUENCE: 32

Gly Thr Asn Lys Arg Ala Pro
1               5

<210> SEQ ID NO 33
<211> LENGTH: 9
<212> TYPE: PRT
<213> ORGANISM: Artificial Sequence
<220> FEATURE:
<223> OTHER INFORMATION: Anti-CD3 Antibody(A15) LCDR3

<400> SEQUENCE: 33

Ala Leu Trp Tyr Ser Asn Leu Trp Val
1               5

<210> SEQ ID NO 34
<211> LENGTH: 5
<212> TYPE: PRT
<213> ORGANISM: Artificial Sequence
<220> FEATURE:
<223> OTHER INFORMATION: Anti-CD3 Antibody(A15) HCDR1

<400> SEQUENCE: 34

Thr Tyr Ala Met Asn
1               5

<210> SEQ ID NO 35
<211> LENGTH: 19
<212> TYPE: PRT
<213> ORGANISM: Artificial Sequence
<220> FEATURE:
```

<223> OTHER INFORMATION: Anti-CD3 Antibody(A15) HCDR2

<400> SEQUENCE: 35

Arg Ile Arg Ser Lys Tyr Asn Asn Tyr Ala Thr Tyr Tyr Ala Asp Ser
1               5                   10                  15

Val Lys Asp

<210> SEQ ID NO 36
<211> LENGTH: 14
<212> TYPE: PRT
<213> ORGANISM: Artificial Sequence
<220> FEATURE:
<223> OTHER INFORMATION: Anti-CD3 Antibody(A15) HCDR3

<400> SEQUENCE: 36

His Gly Asn Phe Gly Asn Ser Tyr Val Ser Trp Phe Ala Tyr
1               5                   10

<210> SEQ ID NO 37
<211> LENGTH: 8
<212> TYPE: PRT
<213> ORGANISM: Artificial Sequence
<220> FEATURE:
<223> OTHER INFORMATION: Anti-EGFR Antibody LCDR1

<400> SEQUENCE: 37

Gln Ser Ile Gly Thr Asn Ile His
1               5

<210> SEQ ID NO 38
<211> LENGTH: 7
<212> TYPE: PRT
<213> ORGANISM: Artificial Sequence
<220> FEATURE:
<223> OTHER INFORMATION: Anti-EGFR Antibody LCDR2

<400> SEQUENCE: 38

Tyr Ala Ser Glu Ser Ile Ser
1               5

<210> SEQ ID NO 39
<211> LENGTH: 9
<212> TYPE: PRT
<213> ORGANISM: Artificial Sequence
<220> FEATURE:
<223> OTHER INFORMATION: Anti-EGFR Antibody LCDR3

<400> SEQUENCE: 39

Gln Gln Asn Asn Asn Trp Pro Thr Thr
1               5

<210> SEQ ID NO 40
<211> LENGTH: 5
<212> TYPE: PRT
<213> ORGANISM: Artificial Sequence
<220> FEATURE:
<223> OTHER INFORMATION: Anti-EGFR Antibody HCDR1

<400> SEQUENCE: 40

Asn Tyr Gly Val His
1               5

<210> SEQ ID NO 41
<211> LENGTH: 16
<212> TYPE: PRT
<213> ORGANISM: Artificial Sequence

```
<220> FEATURE:
<223> OTHER INFORMATION: Anti-EGFR Antibody HCDR2

<400> SEQUENCE: 41

Val Ile Trp Ser Gly Gly Asn Thr Asp Tyr Asn Thr Pro Phe Thr Ser
1               5                   10                  15

<210> SEQ ID NO 42
<211> LENGTH: 11
<212> TYPE: PRT
<213> ORGANISM: Artificial Sequence
<220> FEATURE:
<223> OTHER INFORMATION: Anti-EGFR Antibody HCDR3

<400> SEQUENCE: 42

Ala Leu Thr Tyr Tyr Asp Tyr Glu Phe Ala Tyr
1               5                   10

<210> SEQ ID NO 43
<211> LENGTH: 34
<212> TYPE: PRT
<213> ORGANISM: Artificial Sequence
<220> FEATURE:
<223> OTHER INFORMATION: Peptide linker L1, L3, L6

<400> SEQUENCE: 43

Ser Gly Gly Gly Ser Gly Gly Gly Ser Glu Gly Gly Ser Glu Gly
1               5                   10                  15

Gly Gly Ser Glu Gly Gly Gly Ser Glu Gly Gly Gly Ser Gly Gly Gly
            20                  25                  30

Ser Gly

<210> SEQ ID NO 44
<211> LENGTH: 15
<212> TYPE: PRT
<213> ORGANISM: Artificial Sequence
<220> FEATURE:
<223> OTHER INFORMATION: Peptide linker L2

<400> SEQUENCE: 44

Gly Gly Gly Gly Ser Gly Gly Gly Gly Ser Gly Gly Gly Gly Ser
1               5                   10                  15

<210> SEQ ID NO 45
<211> LENGTH: 15
<212> TYPE: PRT
<213> ORGANISM: Artificial Sequence
<220> FEATURE:
<223> OTHER INFORMATION: Peptide linker L4, L5, L7

<400> SEQUENCE: 45

Glu Pro Lys Ser Cys Asp Lys Thr His Thr Cys Pro Pro Cys Pro
1               5                   10                  15

<210> SEQ ID NO 46
<211> LENGTH: 106
<212> TYPE: PRT
<213> ORGANISM: Artificial Sequence
<220> FEATURE:
<223> OTHER INFORMATION: Antibody CL region

<400> SEQUENCE: 46

Thr Val Ala Ala Pro Ser Val Phe Ile Phe Pro Pro Ser Asp Glu Gln
1               5                   10                  15
```

```
Leu Lys Ser Gly Thr Ala Ser Val Val Cys Leu Leu Asn Asn Phe Tyr
            20                  25                  30

Pro Arg Glu Ala Lys Val Gln Trp Lys Val Asp Asn Ala Leu Gln Ser
        35                  40                  45

Gly Asn Ser Gln Glu Ser Val Thr Glu Gln Asp Ser Lys Asp Ser Thr
    50                  55                  60

Tyr Ser Leu Ser Ser Thr Leu Thr Leu Ser Lys Ala Asp Tyr Glu Lys
65                  70                  75                  80

His Lys Val Tyr Ala Cys Glu Val Thr His Gln Gly Leu Ser Ser Pro
                85                  90                  95

Val Thr Lys Ser Phe Asn Arg Gly Glu Cys
            100                 105

<210> SEQ ID NO 47
<211> LENGTH: 98
<212> TYPE: PRT
<213> ORGANISM: Artificial Sequence
<220> FEATURE:
<223> OTHER INFORMATION: Antibody CH1 region

<400> SEQUENCE: 47

Ala Ser Thr Lys Gly Pro Ser Val Phe Pro Leu Ala Pro Ser Ser Lys
1               5                   10                  15

Ser Thr Ser Gly Gly Thr Ala Ala Leu Gly Cys Leu Val Lys Asp Tyr
            20                  25                  30

Phe Pro Glu Pro Val Thr Val Ser Trp Asn Ser Gly Ala Leu Thr Ser
        35                  40                  45

Gly Val His Thr Phe Pro Ala Val Leu Gln Ser Ser Gly Leu Tyr Ser
    50                  55                  60

Leu Ser Ser Val Val Thr Val Pro Ser Ser Ser Leu Gly Thr Gln Thr
65                  70                  75                  80

Tyr Ile Cys Asn Val Asn His Lys Pro Ser Asn Thr Lys Val Asp Lys
                85                  90                  95

Lys Val

<210> SEQ ID NO 48
<211> LENGTH: 216
<212> TYPE: PRT
<213> ORGANISM: Artificial Sequence
<220> FEATURE:
<223> OTHER INFORMATION: Antibody Fc(CH2 + CH3) region

<400> SEQUENCE: 48

Ala Pro Glu Ala Ala Gly Gly Pro Ser Val Phe Leu Phe Pro Pro Lys
1               5                   10                  15

Pro Lys Asp Thr Leu Met Ile Ser Arg Thr Pro Glu Val Thr Cys Val
            20                  25                  30

Val Val Asp Val Ser His Glu Asp Pro Glu Val Lys Phe Asn Trp Tyr
        35                  40                  45

Val Asp Gly Val Glu Val His Asn Ala Lys Thr Lys Pro Arg Glu Glu
    50                  55                  60

Gln Tyr Asn Ser Thr Tyr Arg Val Val Ser Val Leu Thr Val Leu His
65                  70                  75                  80

Gln Asp Trp Leu Asn Gly Lys Glu Tyr Lys Cys Lys Val Ser Asn Lys
                85                  90                  95

Ala Leu Pro Ala Pro Ile Glu Lys Thr Ile Ser Lys Ala Lys Gly Gln
            100                 105                 110
```

```
Pro Arg Glu Pro Gln Val Tyr Thr Leu Pro Pro Ser Arg Asp Glu Leu
        115                 120                 125

Thr Lys Asn Gln Val Ser Leu Thr Cys Leu Val Lys Gly Phe Tyr Pro
    130                 135                 140

Ser Asp Ile Ala Val Glu Trp Glu Ser Asn Gly Gln Pro Glu Asn Asn
145                 150                 155                 160

Tyr Lys Thr Thr Pro Pro Val Leu Asp Ser Asp Gly Ser Phe Phe Leu
                165                 170                 175

Tyr Ser Lys Leu Thr Val Asp Lys Ser Arg Trp Gln Gln Gly Asn Val
            180                 185                 190

Phe Ser Cys Ser Val Met His Glu Ala Leu His Asn His Tyr Thr Gln
        195                 200                 205

Lys Ser Leu Ser Leu Ser Pro Gly
    210                 215
```

FUSION PROTEIN COMPRISING ANTI-MESOTHELIN ANTIBODY, ANTI-CD3 ANTIBODY OR ANTI-EGFR ANTIBODY, BISPECIFIC OR TRISPECIFIC ANTIBODY COMPRISING SAME, AND USES THEREOF

CROSS REFERENCE TO RELATED APPLICATIONS

This application is a National Stage of International Application No. PCT/KR2019/017809 filed Dec. 16, 2019, claiming priority based on U.S. Provisional Patent Application No. 62/826,442 filed Mar. 29, 2019.

SEQUENCE LISTING

The content of the electronically submitted sequence listing, file name: Sequence_Listing_As_Filed.txt; size: 75,947 bytes; and date of creation: Sep. 1, 2021, filed herewith, is incorporated herein by reference in its entirety.

TECHNICAL FIELD

The present invention relates to a fusion protein including an anti-mesothelin antibody, an anti-CD3 antibody, or an anti-EGFR antibody; and a bispecific antibody specific for mesothelin and CD3, and a trispecific antibody specific for mesothelin, CD3, and EGFR; and uses thereof.

BACKGROUND ART

In anticancer treatment, monoclonal antibodies as the first cancer immunotherapy have shown excellent effects not only in solid cancers but also in blood cancers; however, they still have limitations. In this regard, techniques are introduced in which the Fc region of an antibody is engineered to increase an antibody-dependent cytotoxicity (ADCC) effect of the antibody, or in which a bispecific or trispecific antibody is developed so that a single antibody can access multiple targets.

A bispecific antibody is an antibody that can bind to two different antibodies at the same time, and can be engineered so that immune cells such as T cells are toxic only to specific target cells such as cancer cells and are not toxic to other normal cells. Such bispecific antibodies can exhibit maximized cancer therapeutic effects with minimized side effects. Thus, several bispecific antibody formats have been developed and their suitability for T cell-mediated immunotherapy has been reported.

However, there is a problem that upon co-expression during a process of producing a bispecific antibody, mispairing of antibody heavy and light chains of different specificities results in a number of non-functional byproducts. Therefore, to solve this problem, there is a need for development of a technique for producing a desired multi-specific antibody construct in clinically sufficient amount and purity.

DISCLOSURE OF INVENTION

Technical Problem

As a result of conducting intensive studies to solve the problems of existing bispecific antibodies, the present inventors have developed a fusion protein, in which heavy and light chains of antibodies are linked through linkers, and thus are included as a single chain, and a bispecific or trispecific antibody comprising the same; and have found that these fusion proteins and antibodies solve the problem of mispairing and have a high killing effect on tumor cells, thereby completing the present invention.

Accordingly, an object of the present invention is to provide a fusion protein including an anti-mesothelin antibody, an anti-CD3 antibody, or an anti-EGFR antibody, and a bispecific or trispecific antibody comprising the same, and a method for treating cancer using the same.

Solution to Problem

To solve the above-mentioned problem, in an aspect of the present invention, there is provided a first fusion protein in the form of a single chain, including an antibody that specifically binds to mesothelin and an antibody that specifically binds to CD3.

In another aspect of the invention, there is provided a second fusion protein in the form of a single chain, including an antibody that specifically binds to mesothelin.

In yet another aspect of the present invention, there is provided a third fusion protein in the form of a single chain, including an antibody that specifically binds to EGFR.

In still yet another aspect of the present invention, there is provided a bispecific antibody, comprising the first fusion protein and the second fusion protein.

In still yet another aspect of the present invention, there is provided a trispecific antibody, comprising the first fusion protein and the third fusion protein.

In still yet another aspect of the present invention, there is provided a pharmaceutical composition for treating cancer, comprising, as an active ingredient, the fusion protein, the bispecific antibody, or the trispecific antibody.

In still yet another aspect of the present invention, there is provided a use of the fusion protein, the bispecific antibody, or the trispecific antibody.

In still yet another aspect of the present invention, there is provided a method for treating cancer, comprising a step of administering, to an individual, a therapeutically effective amount of the pharmaceutical composition for treating cancer.

Advantageous Effects of Invention

The fusion protein, and the bispecific antibody or the trispecific antibody comprising the same, of the present invention, can be produced in high yield and purity, and can be effectively used for cancer treatment due to their excellent tumor killing and growth inhibitory effects.

BRIEF DESCRIPTION OF DRAWINGS

FIG. 1 illustrates an exemplary schematic diagram of an anti-MSLN/anti-CD3 bispecific antibody (hereinafter referred to as HMI323/HMI323-A15).

FIG. 2 illustrates an exemplary schematic diagram of an anti-EGFR/anti-MSLN/anti-CD3 trispecific antibody (hereinafter referred to as Cetuximab/HMI323-A15).

FIG. 3 illustrates a result obtained by performing size exclusion chromatography on HMI323/HMI323-A15.

FIG. 4 illustrates a result obtained by performing SDS-PAGE on HMI323/HMI323-A15.

FIG. 5 illustrates a result obtained by performing size exclusion chromatography on Cetuximab/HMI323-A15.

FIG. 6 illustrates a result obtained by performing SDS-PAGE on Cetuximab/HMI323-A15.

FIG. 7 illustrates a result obtained by measuring, with fluorescence activated cell sorter (FACS), the binding capacity of HMI323/HMI323-A15 or Cetuximab/HMI323-A15 to H226 cancer cell line.

FIG. 8 illustrates a result obtained by measuring, with FACS, the binding capacity of HMI323/HMI323-A15 or Cetuximab/HMI323-A15 to AsPC-1 cancer cell line.

FIG. 9 illustrates a result obtained by measuring, with FACS, the binding capacity of HMI323/HMI323-A15 or Cetuximab/HMI323-A15 to Jurkat cell line.

FIG. 10 illustrates a result obtained by subjecting a mixture of PBMCs and H226 cancer cell line (at a ratio of PBMC:target cell=10:1) to treatment with HMI323/HMI323-A15 or Cetuximab/HMI323-A15, and then observing cell death after 24 hours.

FIG. 11 illustrates a result obtained by subjecting a mixture of PBMCs and AsPC-1 cancer cell line (at a ratio of PBMC:target cell=10:1) to treatment with HMI323/HMI323-A15 or Cetuximab/HMI323-A15, and then observing cell death after 24 hours.

FIG. 12 illustrates a result obtained by subjecting a mixture of PBMCs and H226 cancer cell line (at a ratio of PBMC:target cell=10:1) to treatment with HMI323/HMI323-A15 or Cetuximab/HMI323-A15, and then observing cell death after 48 hours.

FIG. 13 illustrates a result obtained by subjecting a mixture of PBMCs and AsPC-1 cancer cell line (at a ratio of PBMC:target cell=10:1) to treatment with HMI323/HMI323-A15 or Cetuximab/HMI323-A15, and then observing cell death after 48 hours.

FIG. 14 illustrates a result obtained by subjecting a mixture of PBMCs and H226 cancer cell line (at a ratio of PBMC:target cell=20:1) to treatment with HMI323/HMI323-A15 or Cetuximab/HMI323-A15, and then observing cell death after 48 hours.

FIG. 15 illustrates a result obtained by subjecting a mixture of PBMCs and AsPC-1 cancer cell line (at a ratio of PBMC:target cell=20:1) to treatment with HMI323/HMI323-A15 or Cetuximab/HMI323-A15, and then observing cell death after 48 hours.

FIG. 16 illustrates a result obtained by subjecting a mixture of T cells and H226 cancer cell line (at a ratio of T cell:target cell=5:1) to treatment with HMI323/HMI323-A15 or Cetuximab/HMI323-A15, and then observing cell death after 24 hours.

FIG. 17 illustrates a result obtained by subjecting a mixture of T cells and H226 cancer cell line (at a ratio of T cell:target cell=5:1) to treatment with HMI323/HMI323-A15 or Cetuximab/HMI323-A15, and then observing cell death after 48 hours.

FIG. 18 illustrates a result obtained by subjecting a mixture of T cells and H226 cancer cell line (at a ratio of T cell:target cell=10:1) to treatment with HMI323/HMI323-A15 or Cetuximab/HMI323-A15, and then observing cell death after 24 hours.

FIG. 19 illustrates a result obtained by subjecting a mixture of T cells and H226 cancer cell line (at a ratio of T cell:target cell=10:1) to treatment with HMI323/HMI323-A15 or Cetuximab/HMI323-A15, and then observing cell death after 48 hours.

FIG. 20 illustrates a result obtained by identifying the anticancer effect of HMI323/HMI323-A15 and Cetuximab/HMI323-A15 in a NOG mouse model with H226 xenograft.

FIG. 21 illustrates a result by comparing HMI323/HMI323-A15 and Cetuximab/HMI323-A15 with a control, in terms of tumor suppression effect (%), in a NOG mouse model with H226 xenograft, to identify the anticancer effect of HMI323/HMI323-A15 and Cetuximab/HMI323-A15.

FIG. 22 illustrates results by observing the infiltration of immune T cells into tumor tissue in a NOG mouse model with H226 xenograft to identify the anticancer effect of HMI323/HMI323-A15 and Cetuximab/HMI323-A15.

FIG. 23 illustrates a result by observing the tumor size (mm$^3$) in a NOG mouse model with AsPC-1 xenograft to identify the anticancer effect of HMI323/HMI323-A15 and Cetuximab/HMI323-A15.

FIG. 24 illustrates a result by comparing HMI323/HMI323-A15 and Cetuximab/HMI323-A15 with a control, in terms of tumor suppression effect (%), in a NOG mouse model with AsPC-1 xenograft to identify the anticancer effect of HMI323/HMI323-A15 and Cetuximab/HMI323-A15.

FIG. 25 illustrates results by observing the infiltration of immune T cells into tumor tissue in a NOG mouse model with AsPC-1 xenograft to identify the anticancer effect of HMI323/HMI323-A15 and Cetuximab/HMI323-A15.

FIG. 26 illustrates a result obtained by analyzing the pharmacokinetics (PK) of Cetuximab/HMI323-A15 in mouse serum.

FIG. 27 illustrates a result obtained by analyzing the pharmacokinetics (PK) of HMI323/HMI323-A15 in mouse serum.

BEST MODE FOR CARRYING OUT THE INVENTION

In an aspect of the present invention, there is provided a first fusion protein having Structural Formula 1:

N'-A-B-L1-C-D-L2-E-F-L3-G-H-L4-I-C'     [Structural Formula 1]

wherein N' is the N-terminus of the fusion protein,

C' is the C-terminus of the fusion protein,

A is a light chain variable domain of an antibody that specifically binds to mesothelin, the domain including light chain CDR1 of SEQ ID NO: 25, light chain CDR2 of SEQ ID NO: 26, and light chain CDR3 of SEQ ID NO: 27, B is a light chain constant domain of the antibody, C is a heavy chain variable domain of the antibody that specifically binds to mesothelin, the domain including heavy chain CDR1 of SEQ ID NO: 28, heavy chain CDR2 of SEQ ID NO: 29, and heavy chain CDR3 of SEQ ID NO: 30, D is a CH1 domain in heavy chain constant domains of the antibody, E is a light chain variable domain of an antibody that specifically binds to CD3, the domain including light chain CDR1 of SEQ ID NO: 31, light chain CDR2 of SEQ ID NO: 32, and light chain CDR3 of SEQ ID NO: 33, F is a light chain constant domain of the antibody, G is a heavy chain variable domain of the antibody that specifically binds to CD3, the domain including heavy chain CDR1 of SEQ ID NO: 34, heavy chain CDR2 of SEQ ID NO: 35, and heavy chain CDR3 of SEQ ID NO: 36, H is a CH1 domain in heavy chain constant domains of the antibody, I is an Fc region or a variant thereof, and each of L1, L2, L3, and L4 is a peptide linker.

In the present invention, each of L1, L2, L3, and L4 may be a peptide linker consisting of 1 to 50 amino acids.

In the present invention, each of L1 and L3 may be a peptide linker consisting of the amino acid sequence of SEQ ID NO: 43.

In the present invention, L2 may be a peptide linker consisting of the amino acid sequence of SEQ ID NO: 44.

In the present invention, L4 may be a peptide linker consisting of the amino acid sequence of SEQ ID NO: 45.

In the present invention, L4 may be a hinge region of an antibody.

In the present invention, A may be a light chain variable domain of the antibody that specifically binds to mesothelin, the domain consisting of the amino acid sequence of SEQ ID NO: 7 or consisting of an amino acid sequence that has a homology of at least 95% and preferably at least 99% to the amino acid sequence of SEQ ID NO: 7.

In the present invention, B may be a light chain constant domain of an IgG, IgA, IgM, IgD, or IgE antibody (preferably an antibody that specifically binds to mesothelin), the domain consisting of the amino acid sequence of SEQ ID NO: 46 or consisting of an amino acid sequence that has a homology of at least 95% and preferably at least 99% to the amino acid sequence of SEQ ID NO: 46.

In the present invention, C may be a heavy chain variable domain of the antibody that specifically binds to mesothelin, the domain consisting of the amino acid sequence of SEQ ID NO: 9 or consisting of an amino acid sequence that has a homology of at least 95% and preferably at least 99% to the amino acid sequence of SEQ ID NO: 9.

In the present invention, D may be a CH1 domain in heavy chain constant domains of an IgG, IgA, IgM, IgD, or IgE antibody (preferably an antibody that specifically binds to mesothelin), the domain consisting of the amino acid sequence of SEQ ID NO: 47 or consisting of an amino acid sequence that has a homology of at least 95% and preferably at least 99% to the amino acid sequence of SEQ ID NO: 47.

In the present invention, E may be a light chain variable domain of an antibody that specifically binds to CD3, the domain consisting of the amino acid sequence of SEQ ID NO: 13 or consisting of an amino acid sequence that has a homology of at least 95% and preferably at least 99% to the amino acid sequence of SEQ ID NO: 13.

In the present invention, F may be a light chain constant domain of an IgG, IgA, IgM, IgD, or IgE antibody (preferably an antibody that specifically binds to CD3), the domain consisting of the amino acid sequence of SEQ ID NO: 46 or consisting of an amino acid sequence that has a homology of at least 95% and preferably at least 99% to the amino acid sequence of SEQ ID NO: 46.

In the present invention, G may be a heavy chain variable domain of the antibody that specifically binds to CD3, the domain consisting of the amino acid sequence of SEQ ID NO: 15 or consisting of an amino acid sequence that has a homology of at least 95% and preferably at least 99% to the amino acid sequence of SEQ ID NO: 15.

In the present invention, H may be a CH1 domain in heavy chain constant domains of an IgG, IgA, IgM, IgD, or IgE antibody (preferably an antibody that specifically binds to CD3), the domain consisting of the amino acid sequence of SEQ ID NO: 47 or consisting of an amino acid sequence that has a homology of at least 95% and preferably at least 99% to the amino acid sequence of SEQ ID NO: 47.

In the present invention, I may be an Fc region or a variant thereof, of an IgG, IgA, IgM, IgD, or IgE antibody, the region or variant consisting of the amino acid sequence of SEQ ID NO: 48 or consisting of an amino acid sequence that has a homology of at least 95% and preferably at least 99% to the amino acid sequence of SEQ ID NO: 48. In addition, I may be obtained by substitutions at some amino acids of a CH3 domain in heavy chain constant domains of the antibody. That is, the amino acid sequence of SEQ ID NO: 48 may undergo substitutions (Y119C, K130E, and K179W) to form a knob structure in the CH3 domain in the heavy chain constant domains of the antibody; and the amino acid sequence of SEQ ID NO: 48 may undergo substitutions (Q117R, S124C, D169V, and F175T) to form a hole structure therein.

In the present invention, the first fusion protein may consist of the amino acid sequence of SEQ ID NO: 1 or consist of an amino acid sequence having a homology of at least 90%, at least 95%, and preferably at least 99% to the amino acid sequence of SEQ ID NO: 1.

In an aspect of the present invention, there is provided a second fusion protein having Structural Formula 2:

N'-A-B-L1-C-D-L5-J-C'  [Structural Formula 2]

wherein N' is the N-terminus of the fusion protein,
C' is the C-terminus of the fusion protein,
A is a light chain variable domain of an antibody that specifically binds to mesothelin, the domain including light chain CDR1 of SEQ ID NO: 25, light chain CDR2 of SEQ ID NO: 26, and light chain CDR3 of SEQ ID NO: 27,
B is a light chain constant domain of the antibody,
C is a heavy chain variable domain of the antibody that specifically binds to mesothelin, the domain including heavy chain CDR1 of SEQ ID NO: 28, heavy chain CDR2 of SEQ ID NO: 29, and heavy chain CDR3 of SEQ ID NO: 30,
D is a CH1 domain in heavy chain constant domains of the antibody,
J is an Fc region or a fragment thereof, and
each of L1 and L5 is a peptide linker.

In the present invention, each of L1 and L5 may be a peptide linker consisting of 1 to 50 amino acids.

In the present invention, L1 may be a peptide linker consisting of the amino acid sequence of SEQ ID NO: 43.

In the present invention, L5 may be a peptide linker consisting of the amino acid sequence of SEQ ID NO: 45.

In the present invention, L5 may be a hinge region of an antibody.

In the present invention, the second fusion protein may consist of the amino acid sequence of SEQ ID NO: 3 or consist of an amino acid sequence having a homology of at least 90%, at least 95%, and preferably at least 99% to the amino acid sequence of SEQ ID NO: 3.

J may be an Fc region or a variant thereof, of an IgG, IgA, IgM, IgD, or IgE antibody, the region or variant consisting of the amino acid sequence of SEQ ID NO: 48 or consisting of an amino acid sequence that has a homology of at least 95% and preferably at least 99% to the amino acid sequence of SEQ ID NO: 48. In addition, J may be obtained by substitutions at some amino acids of a CH3 domain in heavy chain constant domains of the antibody. That is, the amino acid sequence of SEQ ID NO: 48 may undergo substitutions (Y119C, K130E, and K179W) to form a knob structure in the CH3 domain in the heavy chain constant domains of the antibody; and the amino acid sequence of SEQ ID NO: 48 may undergo substitutions (Q117R, S124C, D169V, and F175T) to form a hole structure therein.

In an aspect of the present invention, there is provided a third fusion protein having Structural Formula 3:

N'-K-M-L6-N-O-L7-P-C'  [Structural Formula 3]

wherein N' is the N-terminus of the fusion protein,
C' is the C-terminus of the fusion protein,
K is a light chain variable domain of an antibody that specifically binds to EGFR, the domain including light chain CDR1 of SEQ ID NO: 37, light chain CDR2 of SEQ ID NO: 38, and light chain CDR3 of SEQ ID NO: 39,
M is a light chain constant domain of the antibody, N is a heavy chain variable domain of the antibody that specifically binds to EGFR, the domain including heavy chain CDR1 of SEQ ID NO: 40, heavy chain CDR2 of SEQ ID NO: 41, and heavy chain CDR3 of SEQ ID NO: 42, O is a CH1 domain in heavy chain constant domains of the antibody, P is an Fc region or a fragment thereof, and each of L6 and L7 is a peptide linker.

In the present invention, each of L6 and L7 may be a peptide linker consisting of 1 to 50 amino acids.

In the present invention, L6 may be a peptide linker consisting of the amino acid sequence of SEQ ID NO: 43.

In the present invention, L7 may be a peptide linker consisting of the amino acid sequence of SEQ ID NO: 45.

In the present invention, L7 may be a hinge region of an antibody.

In the present invention, the third fusion protein may consist of the amino acid sequence of SEQ ID NO: 5.

In the present invention, K is a light chain variable domain of the antibody that specifically binds to EGFR, the domain consisting of the amino acid sequence of SEQ ID NO: 17 or consisting of an amino acid sequence that has a homology of at least 95% and preferably at least 99% to the amino acid sequence of SEQ ID NO: 17.

In the present invention, M may be a light chain constant domain of an IgG, IgA, IgM, IgD, or IgE antibody (preferably an antibody that specifically binds to EGFR), the domain consisting of the amino acid sequence of SEQ ID NO: 46 or consisting of an amino acid sequence that has a homology of at least 95% and preferably at least 99% to the amino acid sequence of SEQ ID NO: 46.

In the present invention, N is a heavy chain variable domain of the antibody that specifically binds to EGFR, the domain consisting of the amino acid sequence of SEQ ID NO: 19 or consisting of an amino acid sequence that has a homology of at least 95% and preferably at least 99% to the amino acid sequence of SEQ ID NO: 19.

In the present invention, O may be a CH1 domain in heavy chain constant domains of an IgG, IgA, IgM, IgD, or IgE antibody (preferably an antibody that specifically binds to EGFR), the domain consisting of the amino acid sequence of SEQ ID NO: 47 or consisting of an amino acid sequence that has a homology of at least 95% and preferably at least 99% to the amino acid sequence of SEQ ID NO: 47.

J may be an Fc region or a variant thereof, of an IgG, IgA, IgM, IgD, or IgE antibody, the region or variant consisting of the amino acid sequence of SEQ ID NO: 48 or consisting of an amino acid sequence that has a homology of at least 95% and preferably at least 99% to the amino acid sequence of SEQ ID NO: 48. In addition, I may be obtained by substitutions at some amino acids of a CH3 domain in heavy chain constant domains of the IgG, IgA, IgM, IgD, or IgE antibody. That is, the amino acid sequence of SEQ ID NO: 48 may undergo substitutions (Y119C, K130E, and K179W) to form a knob structure in the CH3 domain in the heavy chain constant domains of the antibody; and the amino acid sequence of SEQ ID NO: 48 may undergo substitutions (Q117R, S124C, D169V, and F175T) to form a hole structure therein.

In the present invention, the third fusion protein may consist of the amino acid sequence of SEQ ID NO: 5 or consist of an amino acid sequence having a homology of at least 90%, at least 95%, and preferably at least 99% to the amino acid sequence of SEQ ID NO: 5.

As used herein, the term "mesothelin (MSLN)" is meant to include wild-type MSLN, and variants, isotypes, and paralogs thereof, which are present in animals, preferably humans and monkeys. In addition, the term "human MSLN" refers to human-derived MSLN. Mesothelin is a 40-kDa cell surface glycoprotein that is present on normal mesothelial cells and is overexpressed in several human tumors, including mesothelioma, ovarian adenocarcinoma, and pancreatic adenocarcinoma. Mesothelin has been shown to exert megakaryocyte colony-forming activity in the presence of interleukin-3. Mesothelin is a tumor differentiation antigen that is present at low levels in normal adult tissues, such as mesothelium, and is aberrantly overexpressed in a wide variety of human tumors, including mesothelioma, ovarian cancer, pancreatic cancer, squamous cell carcinoma of the cervix, head and neck, vulva, lung, and esophagus, lung adenocarcinoma, endometrial carcinoma, biphasic synovial sarcoma, desmoplastic small round cell tumor, and gastric adenocarcinoma.

As used herein, the term "CD3" is meant to include wild-type CD3, and variants, isotypes, and paralogs thereof, which are present in animals, preferably humans and monkeys. Also, the term "human CD3" refers to human-derived CD3. CD3, which is an antigen molecule present on the surface of T cells, is associated with T cell antigen receptor, and thus acts as a signaling system, thereby activating T cells.

As used herein, the term "EGFR" refers to a membrane protein that is the epidermal growth factor receptor, and is also called ErbB-1 or HER1. In addition, the term "human EGFR" refers to human-derived EGFR.

As used herein, the term "antibody" refers to an immunoglobulin (Ig) molecule that is immunologically reactive with a particular antigen, that is, a protein molecule acting as a receptor that specifically recognizes an antigen. The antibody is used as a concept encompassing a whole antibody and an antibody fragment.

As used herein, the term "heavy chain" is meant to include both a full-length heavy chain and a fragment thereof, in which the full-length heavy chain includes a variable domain (VH) sufficient to confer specificity for an antigen and three constant domains (CH1, CH2, and CH3).

As used herein, the term "light chain" is meant to include both a full-length light chain and a fragment thereof, in which the full-length light chain includes a variable domain (VL) sufficient to confer specificity for an antigen and a constant domain (CL).

As used herein, the term "CDR" refers to a complementarity determining region that is part of the heavy chain variable domain (VH) and light chain variable domain (VL) of an antibody.

As used herein, the term "Fc" refers to a C-terminal region of an immunoglobulin, this region being one of the functional structural units which consists of only CH2 and CH3 among heavy chain constant domains. Fc has no capacity to bind an antigen. However, Fc exhibits complement-binding activity and the like, and has a constant amino acid sequence.

As used herein, the term "hinge region" refers to a peptide present between CH1 and CH2 of a heavy chain. The hinge region has a highly flexible structure in which one or more cysteine residues are present so that two heavy chains are linked to each other by disulfide bond(s).

In the present invention, the hinge region may include 1 to 3 cysteine residues, for example, 1, 2, or 3 cysteine residues.

In addition, in the present invention, there is provided a polynucleotide encoding the above-described fusion protein.

In the present invention, the DNA encoding the first fusion protein may consist of the nucleotide sequence of SEQ ID NO: 2 or consist of a nucleotide sequence having a homology of at least 80%, preferably at least 90%, more preferably at least 95%, and most preferably at least 99% to the nucleotide sequence of SEQ ID NO: 2.

In the present invention, the DNA encoding the second fusion protein may consist of the nucleotide sequence of SEQ ID NO: 4 or consist of a nucleotide sequence having a homology of at least 80%, preferably at least 90%, more preferably at least 95%, and most preferably at least 99% to the nucleotide sequence of SEQ ID NO: 4.

In the present invention, the DNA encoding the third fusion protein may consist of the nucleotide sequence of SEQ ID NO: 6 or consist of a nucleotide sequence having a homology of at least 80%, preferably at least 90%, more preferably at least 95%, and most preferably at least 99% to the nucleotide sequence of SEQ ID NO: 6.

In addition, in the present invention, there is provided an expression vector, comprising the above-described fusion protein-encoding polynucleotide.

In addition, in the present invention, there is provided a host cell transfected by introduction of the expression vector.

In addition, in the present invention, there is provided a method for producing the fusion protein, comprising a step of culturing the host cell.

In another aspect of the present invention, there is provided a bispecific antibody, comprising the first fusion protein and the second fusion protein.

As used herein, the term "bispecific antibody" refers to a single antibody engineered to recognize two different antigens.

The bispecific antibody of the present invention contains an anti-MSLN antibody and an anti-CD3 antibody at the same time, and thus can specifically bind to MSLN-expressing cancer cells and T cells so that inhibited proliferation or death of the MSLN-expressing cancer cells is caused through induction of immune cell activation.

In the present invention, to provide a single antibody, that is, a bispecific antibody, through binding of the first fusion protein to the second fusion protein, each fusion protein may undergo substitutions at some amino acid residues in the heavy chain constant domain. That is, the Fc regions of the first fusion protein and the second fusion protein may be linked to each other via a disulfide bond or a knob-into-hole structure (with the knob-into-hole structure being preferred) to form a bispecific antibody.

As used herein, the term "knob-into-hole structure" refers to a structure obtained by inducing mutations in the respective CH3 domains of two different Ig heavy chains so that a knob structure is induced in one Ig heavy chain CH3 domain and a hole structure is induced in the other Ig heavy chain CH3 domain, and allowing the two domains to form a heterodimer.

Typically, in amino acid residues that form the knob structure, a hydrophobic amino acid residue having a large side chain is substituted with a hydrophobic amino acid residue having a small side chain; and in amino acid residues that form the hole structure, a hydrophobic amino acid residue having a small side chain is substituted with a hydrophobic amino acid residue having a large side chain. However, the present invention is not limited thereto. In this way, in a case where the respective antibodies are induced to form a knob structure and a hole structure, a heterodimer may be formed more easily than a homodimer.

In the present invention, the bispecific antibody may include a knob modification in I of the first fusion protein and a hole modification in J of the second fusion protein. Alternatively, the bispecific antibody may include a hole modification in I of the first fusion protein and a knob modification in J of the second fusion protein.

In the present invention, the bispecific antibody may be in the form of 2+1 IgGs and may consist of two single chains obtained by linking the heavy and light chains, which constitute the anti-MSLN or anti-CD3 Fab fragment, to each other with a linker so that the respective fragments are expressed as single chains, and linking the anti-MSLN fragment and the anti-CD3 Fab fragment, which are single chains, to each other with a peptide linker.

In another aspect of the present invention, there is provided a trispecific antibody, comprising the first fusion protein and the third fusion protein.

As used herein, the term "trispecific antibody" refers to a single antibody engineered to recognize three different antigens.

The trispecific antibody of the present invention contains anti-EGFR antibody, an anti-MSLN antibody, and an anti-CD3 antibody at the same time, and thus can specifically bind to EGFR- or MSLN-expressing cancer cells and T cells so that inhibited proliferation or death of the EGFR- or MSLN-expressing cancer cells is caused through induction of immune cell activation.

In the present invention, to provide a single antibody, that is, a trispecific antibody, through binding of the first fusion protein to the third fusion protein, each fusion protein may undergo substitutions at some amino acid residues in the heavy chain constant domain. That is, the Fc regions of the first fusion protein and the third fusion protein may be linked to each other via a disulfide bond or a knob-into-hole structure (with the knob-into-hole structure being preferred) to form a trispecific antibody.

In the present invention, the trispecific antibody may include a knob modification in I of the first fusion protein and a hole modification in P of the third fusion protein. Alternatively, the trispecific antibody may include a hole modification in I of the first fusion protein and a knob modification in P of the third fusion protein.

In the present invention, the trispecific antibody may be in the form of 2+1 IgGs and may consist of two single chains obtained by linking the heavy and light chains, which constitute the anti-EGFR Fab fragment, to each other with a linker so that the fragment is expressed as a single chain, linking the heavy and light chains, which constitute the anti-MSLN or anti-CD3 Fab fragment, to each other with a linker so that the respective fragments are expressed as single chains, and linking the anti-MSLN fragment and the anti-CD3 Fab fragment, which are single chains, to each other with a peptide linker.

In yet another aspect of the present invention, there are provided a pharmaceutical composition for treating cancer, comprising, as an active ingredient, the first fusion protein, the second fusion protein, the third fusion protein, the bispecific antibody, or the trispecific antibody; and a method for treating cancer in an individual, comprising a step of administering, to the individual, a therapeutically effective amount of the pharmaceutical composition.

The pharmaceutical composition may further comprise a pharmaceutically acceptable carrier. As the pharmaceutically acceptable carrier, a binder, a glidant, a disintegrant, an excipient, a solubilizer, a dispersant, a stabilizer, a suspending agent, a pigment, a flavor, and the like may be used for oral administration; a buffer, a preserving agent, a pain-relieving agent, a solubilizer, an isotonic agent, a stabilizer, and the like may be used in admixture for injections; and a base, an excipient, a lubricant, a preserving agent, and the like may be used for topical administration.

Preparations of the pharmaceutical composition may be prepared in various ways by being mixed with the pharmaceutically acceptable carrier as described above. For example, for oral administration, the pharmaceutical composition may be formulated in the form of tablets, troches, capsules, elixirs, suspensions, syrups, wafers, or the like. For injections, the pharmaceutical composition may be formulated in the form of unit dosage ampoules or multiple dosage forms.

The pharmaceutical composition may be administered in a pharmaceutically effective amount to treat cancer cells or metastasis thereof or to inhibit cancer growth. The effective amount may vary depending on various factors such as type of cancer, the patient's age, weight, nature and severity of symptoms, type of current therapy, number of treatments, dosage form, and route of administration, and may be easily determined by experts in the corresponding field.

The pharmaceutical composition may be administered together or sequentially with the above-mentioned pharmacological or physiological components, and may also be administered in combination with additional conventional therapeutic agents, in which case the pharmaceutical composition may be administered sequentially or simultaneously with the conventional therapeutic agents. Such administration may be single or multiple administration. Taking all of the above factors into consideration, it is important to administer an amount that is a minimum amount and allows the maximum effect to be obtained without adverse effects, and such an amount may be easily determined by those skilled in the art.

In the present invention, the cancer may include, without limitation, any carcinoma known in the art.

In still yet another aspect of the present invention, there is provided a use of the first fusion protein, the second fusion protein, the third fusion protein, the bispecific antibody, or the trispecific antibody, for the manufacture of a medicament for treating cancer in an individual in need thereof.

MODE FOR THE INVENTION

Hereinafter, preferred examples are provided to help understand the present invention. However, the following examples are merely given for easier understanding of the present invention, and the scope of the present invention is not limited thereto.

Example 1. Production of Anti-MSLN/Anti-CD3 Bispecific Antibody and Anti-EGFR/Anti-MSLN/Anti-CD3 Trispecific Antibody Example 1.1. Production of MSLN-, CD3-, or EGFR-Specific Antibody To select MSLN-specific antibodies, mice were immunized with recombinant human MSLN, and then B cells were extracted therefrom to clone various antibody genes. Using phage display, these genes were used to prepare an antibody library, and cloning of antibodies binding to the recombinant human MSLN was performed. Finally, antibody humanization was performed to obtain HMI323 clone consisting of the amino acid sequence of SEQ ID NO: 1, this amino acid sequence being encoded by a gene consisting of the nucleotide sequence of SEQ ID NO: 4.

To select antibodies specific for human and monkey CD3, the mouse SP34 antibody was humanized, and the antibodies, which bind to CD3 with various affinity, were selected. Among these, Clone A07 consisting of the amino acid sequence of SEQ ID NO: 21, Clone A15 consisting of the amino acid sequence of SEQ ID NO: 11, and Clone E15 consisting of the amino acid sequence of SEQ ID NO: 23 were obtained, and these amino acid sequences are encoded by genes consisting of the nucleotide sequences of SEQ ID NOs: 22, 12, and 24, respectively.

For the EGFR-specific antibody, Cetuximab, which is a therapeutic agent for colorectal cancer, was used. The antibody consists of the amino acid sequence of SEQ ID NO: 5, and this amino acid sequence is encoded by a gene consisting of the nucleotide sequence of SEQ ID NO: 6.

Example 1.2. Transfection of Vector for Antibody Expression

Example 1.2.1. Construction of Vector for Antibody Expression

As illustrated in FIG. 1, vectors were constructed as follows in such a manner that co-expression of anti-MSLN antibody (HMI323) and an antibody obtained by linking anti-CD3 Fab (A15) to anti-MSLN Fab (HMI323) was performed so that a bispecific antibody (HMI323/HMI323-A15) having a knob-into-hole structure is expressed.

Using IN-FUSION® HD (Takara, Mountain View, CA, USA), DNA (SEQ ID NO: 4) for anti-MSLN (HMI323) antibody sequence or DNA (SEQ ID NO: 2) for the antibody sequence obtained by linking anti-CD3 Fab (A15) to anti-MSLN Fab (HMI323) was inserted into each pCI vector (Promega, Madison, WI, USA), and then *E. coli* competent cells were subjected to heat shock transformation therewith at 42° C. for 45 seconds. The transformants were plated on a carbenicillin-containing LB plate and cultured for 14 hours in an incubator at 37° C. After culture, the transformant colonies cultured on the plate were inoculated into 2 ml of carbenicillin-containing LB medium and cultured at 37° C. for 16 hours in a shaking incubator. Then, plasmids were extracted from the cultured transformants, and sequencing thereof showed that the genes for antibody expression were cloned into the vectors.

As illustrated in FIG. 2, vectors were constructed as follows in such a manner that co-expression of anti-EGFR antibody (Cetuximab) and an antibody obtained by linking anti-CD3 Fab (A15) to anti-MSLN Fab (HMI323) was performed so that a trispecific antibody (Cetuximab/HMI323-A15) having a knob-into-hole structure is expressed.

Using IN-FUSION® HD (Takara, Mountain View, CA, USA), DNA (SEQ ID NO: 6) for anti-EGFR (Cetuximab) antibody sequence or DNA (SEQ ID NO: 2) for the antibody sequence obtained by linking anti-CD3 Fab (A15) to anti-MSLN Fab (HMI323) was inserted into each pCI vector (Promega, Madison, WI, USA), and then *E. coli* competent cells were subjected to heat shock transformation therewith at 42° C. for 45 seconds. The transformants were plated on a carbenicillin-containing LB plate and cultured for 14 hours in an incubator at 37° C. After culture, the transformant colonies cultured on the plate were inoculated into 2 ml of carbenicillin-containing LB medium and cultured at 37° C. for 16 hours in a shaking incubator. Then, plasmids were extracted from the cultured transformants, and sequencing thereof showed that the genes for antibody expression were cloned into the vectors.

Example 1.2.2. Transfection of Vector for Antibody Expression into Host Cells 24 hours before, EXPI293F™ cells (Thermo Fisher Scientific) at a density of 2.0×10⁶ cells/ml were passaged with Expi293™ expression medium (Thermo Fisher Scientific) at 125±10 rpm in a shaking incubator at 37° C. and 8% $CO_2$. At the time of transfection, the number of cells and cell viability were measured to identify whether cell viability of 95% or higher is exhibited. The cells were dispensed at 5×10⁸ cells in a 500 mL culture flask, and then Expi293™ expression medium was added to adjust the final volume to 170 mL (based on 200 mL).

Using OPTI-MEM I™ medium (Thermo Fisher Scientific), 200 μg of antibody-expressing vector was mixed therewith to a total of 1,500 μl, and culture was performed for 5 minutes at room temperature. Using OPTI-MEM I™ medium, 540 μl of transfection reagent (EXPIFECTAMINE™ 293 Reagent, Thermo Fisher Scientific) was mixed therewith to a total of 1,500 μl, and culture was performed for 5 minutes at room temperature. The OPTI-MEM I™ media, containing the vector and the transfection reagent, respectively, were mixed gently and allowed to react at room temperature for 20 minutes. Then, the resultant was placed in a flask containing Expi293F™ cells.

Culture was performed for 16 to 20 hours at 125±10 rpm in a shaking incubator at 37° C. and 8% $CO_2$. Then, 1 ml of transfection enhancer I (EXPIFECTAMINE™ 293 Enhancer I, Thermo Fisher Scientific) and 10 ml of transfection enhancer II (EXPIFECTAMINE™ 293 Enhancer II, Thermo Fisher Scientific) were added thereto, and culture was performed for 5 days to obtain candidate antibodies.

Example 2. Purification of Anti-MSLN/Anti-CD3 Bispecific Antibody and Anti-EGFR/Anti-MSLN/Anti-CD3 Trispecific Antibody

Example 2.1. Purification Using Affinity Chromatography

As an experiment to separate only antibodies using specific interaction between Protein A and the antibody, the culture solution was centrifuged at 4000 rpm for 30 minutes and filtered with a 0.22 μm bottle top filter to prepare a supernatant from which cell debris was removed. Then, a column packed with 5 ml of MABSELECT PRISMA™ resin (GE Healthcare) was connected with ÄKTA PRIME-PLUS™ (GE Healthcare) and used. Subsequently, washing with binding buffer (Pierce) was performed, and then the supernatant was loaded at a rate of 5 ml/min. After all of the prepared supernatant was loaded, washing with binding buffer (Pierce) was performed at the same rate to remove non-specific binding.

After washing, while flowing IgG elution buffer (Pierce), a section, in which the UV 280 nm value rose, was collected portionwise by 5 ml in a tube containing 5 ml of binding buffer (Pierce), and the eluate was immediately neutralized. The neutralized eluate was subjected to buffer exchange with PBS using a Zeba spin desalting column (Thermo Fisher Scientific).

Example 2.2. Purification Using Size Exclusion Chromatography (SEC)

As an experiment to separate, from among the separated antibodies, only a target antibody of 200 kDa using a purification method for separation by size, a SUPERDEX® 200 SEC column (GE Healthcare) was connected with ÄKTA PURE™ 150 L equipment (GE Healthcare) and used. A sample loop was filled with the antibody sample, which was subjected to buffer exchange with PBS, and connected with the ÄKTA PURE™ 150 L equipment (GE Healthcare). Then, the process was conducted under a flow rate condition of 1 ml/min, and the elution sample was collected portionwise by 1 ml depending on its peak pattern. The portionwise-collected eluate was subjected to SDS-PAGE (NUPAGE®, Novex 4-12% Bis-Tris Gel, Invitrogen), and then checked by staining with COOMASSIE® Blue. Only the highly pure target antibody of 200 kDa was pooled.

By doing so, the results as shown in Table 1 were obtained.

TABLE 1

| Construct | Yield (mg/L) | Aggregation after SEC (%) | Monomer (%) |
|---|---|---|---|
| HMI323/HMI323-A15 | 3.3 | 30 | 100 |
| Cetuximab/HMI323-A15 | 3.2 | 30 | 100 |

Example 3. Measurement of Affinity of Antibodies to MSLN, CD3, and EGFR

Using the Octet system, affinity of the bispecific antibody (HMI323/HMI323-A15) and the trispecific antibody (Cetuximab/HMI323-A15) to human MSLN, human CD3, and human EGFR, respectively, was measured.

Specifically, recombinant human MSLN, CD3, and EGFR were prepared at 20 μg/ml in 1× kinetic buffer, and plated in 96-well plates at 200 μl/well. The plated MSLN, CD3, and EGFR were immobilized on an Aminopropylsilane (APS) sensor (Cat #18-5045, Fortebio). The bispecific antibody (HMI323/HMI323-A15) and the trispecific antibody (Cetuximab/HMI323-A15) were prepared at 100, 50, 25, 12.5, and 6.25 nM in 10× kinetic buffer, and plated at a concentration of 200 μl/well. The interaction between each antibody and each of the recombinant human MSLN (Table 2), human CD3 (Table 3), and human EGFR (Table 4), which were immobilized on the sensor, was analyzed to calculate the antigen-antibody affinity. The results are as shown in Tables 2 to 4, respectively.

TABLE 2

| Antibody | ka (1/M · s) | kd (1/s) | KD (nM) |
|---|---|---|---|
| HMI323/HMI323-A15 | $9.94 \times 10^4$ | $7.74 \times 10^{-4}$ | 7.79 |
| Cetuximab/HMI323-A15 | $6.20 \times 10^4$ | $1.36 \times 10^{-3}$ | 22.6 |

TABLE 3

| Antibody | ka (1/M · s) | kd (1/s) | KD (nM) |
|---|---|---|---|
| HMI323/HMI323-A15 | $4.61 \times 10^5$ | $2.42 \times 10^{-2}$ | 52.6 |
| Cetuximab/HMI323-A15 | $4.63 \times 10^5$ | $6.25 \times 10^{-3}$ | 13.5 |

TABLE 4

| Antibody | ka (1/M · s) | kd (1/s) | KD (nM) |
|---|---|---|---|
| Cetuximab/HMI323-A15 | $2.08 \times 10^6$ | $2.54 \times 10^{-3}$ | 1.22 |

From the measurement results as shown in Tables 2 to 4, it was found that the bispecific antibody (HMI323/HMI323-A15) and the trispecific antibody (Cetuximab/HMI323-A15) exhibited excellent affinity to human MSLN, human CD3, and human EGFR.

Example 4. Analysis of Affinity of Antibodies to MSLN-, EGFR-, and CD3-Expressing Cells It was identified, using flow cytometry, whether the bispecific antibody (HMI323/HMI323-A15) or the trispecific antibody (Cetuximab/HMI323-A15) exhibits affinity to specific cell lines.

Specifically, tubes were prepared, each tube containing 100 μl of FACS buffer (2% FBS/sheath buffer) to which each of three types of cell line, that is, H226 cancer cell line (ATCC®, CRL-5826™) overexpressing MSLN and EGFR, AsPC-1 cancer cell line (ATCC®, CRL-1682™) overexpressing MSLN and EGFR, and Jurkat E6-1 T cell line (ATCC®, TIB-152™) expressing CD3, was added at a concentration of $0.5 \times 10^6$ cells, and then each tube was treated with 1 μg of primary antibody (HMI323/HMI323-A15 or Cetuximab/HMI323-A15). Then, light was blocked for one and a half hours and incubation was performed at 4° C. Subsequently, 200 μl of FACS buffer was added thereto. Centrifugation was performed at 2,000 rpm for 3 minutes at 4° C., and then the supernatant was removed.

Next, each tube was treated with 0.2 μg of fluorochrome-labeled secondary antibody (PE-labeled anti-human IgG), which is capable of specifically binding to the primary antibody, in 100 μl of FACS buffer. Then, light was blocked for 30 minutes and incubation was performed at 4° C. Subsequently, 200 μl of FACS buffer was added thereto, and centrifugation was performed at 2,000 rpm for 3 minutes at 4° C.; and then the supernatant was removed to obtain a sample.

200 μl of BD CYTOFIX™ was added to the sample so that the cells were suspended, and analysis was performed by BD LSR FORTESSA™. $EC_{50}$ values for binding affinity to specific cells are as shown in Table 5 below.

TABLE 5

| Cell line | HMI323/HMI323-A15 (nM) | Cetuximab/HMI323-A15 (nM) |
|---|---|---|
| H226 | 6.2 | 1.2 |
| AsPC-1 | 4.7 | 0.48 |
| Jurkat | 58 | 113 |

As a result of the analysis, as illustrated in FIGS. 7 to 9, it was found that both the bispecific antibody (HMI323/HMI323-A15) and the trispecific antibody (Cetuximab/HMI323-A15) bound to the three types of cell line. The negative control antibody used as an irrelevant control did not bind to any of the three types of cell line.

Example 5. Evaluation of Cell Killing Efficacy of Antibodies Against Tumor Cell Lines in Presence of PBMCs Example 5.1. Construction of Target Cell Lines Two types of MSLN+ tumor cells (H226, AsPC-1) were transduced with INCUCYTE® NUCLIGHT™ Red Lentivirus Reagent (EF-1 Alpha Promoter, Puromycin selection) and treated with puromycin, so that the target cell lines, which are NUCLIGHT™ Red-transduced tumor cell lines, were finally constructed.

Example 5.2. Preparation of Target Cell Lines

The cells were harvested with 1× trypsin-EDTA solution, and centrifuged at 1,200 rpm for 5 minutes at 4° C. Subsequently, the supernatant was removed and resuspension was performed in cRPMI (RPMI, A10491-01+10% FBS+55 μM β-ME). Then, the number of cells was quantified. The respective cell line suspensions were prepared, added to 96-well plates at 10,000 cells/well, and the plates were incubated in a $CO_2$ incubator at 37° C. for one day to prepare the target cell lines.

Example 5.3. Preparation of Peripheral Blood Mononuclear Cells

Cryopreserved peripheral blood mononuclear cells (PBMCs) were rapidly thawed in a water bath at 37° C., and then transferred to a 50 ml conical tube. Thawing medium (RPMI, 11875-093+10% FBS+55 μM β-ME) was added thereto dropwise, and mixing was performed with shaking. Then, the supernatant was removed by performing centrifugation at 1,200 rpm for 10 minutes at 4° C., and resuspension was performed in cRPMI. Then, the number of cells was quantified.

Example 5.4. Plating of Peripheral Blood Mononuclear Cells and Antibodies

The target cells were plated in wells. 24 hours later, each of the bispecific antibody (HMI323/HMI323-A15) and the trispecific antibody (Cetuximab/HMI323-A15) was diluted with cRPMI, and then diluted 1/5 starting from 20 nM (at a concentration range of 0.26 pM to 20 nM). Then, PBMCs were prepared at a ratio of PBMC:target cell=20:1 or 10:1, suspended in cRPMI, and then added to the wells.

Example 5.5. Real-Time Cell Measurement and Analysis Using IncuCyteS3

Bright field and red fluorescence were measured at 24 hours and 48 hours at 10× magnification using IncuCyteS3 while performing incubation in a $CO_2$ incubator at 37° C. for 2 days. $IC_{50}$ values for PBMC-mediated cell killing by antibodies against MSLN-expressing tumor cells are as shown in Table 6 below, and maximum effects (%) of PBMC-mediated cell killing by antibodies against MSLN-expressing tumor cells are as shown in Table 7 below.

TABLE 6

| PBMC: target cell | Hours | Cancer cell line | $IC_{50}$ value (pM) HMI323/HMI323-A15 | $IC_{50}$ value (pM) Cetuximab/HMI323-A15 |
|---|---|---|---|---|
| 10:1 | 24 hr | H226 | 84.38 | 14.93 |
|  |  | AsPC-1 | 405.8 | 3.845 |
| 10:1 | 48 hr | H226 | 50.31 | 8.913 |
|  |  | AsPC-1 | 143.6 | 1.351 |
| 20:1 | 48 hr | H226 | 15.32 | 3.918 |
|  |  | AsPC-1 | 30.36 | 1.374 |

TABLE 7

| PBMC: target cell | Hours | Cancer cell line | Maximum killing effect (%) | |
|---|---|---|---|---|
| | | | HMI323/ HMI323-A15 | Cetuximab/ HMI323-A15 |
| 10:1 | 24 hr | H226 | 56.57 | 49.67 |
| | | AsPC-1 | 38.3 | 43.8 |
| 10:1 | 48 hr | H226 | 90.66 | 92 |
| | | AsPC-1 | 74.62 | 80.99 |
| 20:1 | 48 hr | H226 | 93.46 | 94.54 |
| | | AsPC-1 | 84.24 | 81.29 |

As a result of the evaluation, as illustrated in FIGS. 10 to 15, it was identified that cell-killing effects of the bispecific antibody (HMI323/HMI323-A15) and the trispecific antibody (Cetuximab/HMI323-A15) against two types of MSLN- and EGFR-expressing cancer cell line (H226, AsPC-1) were exhibited in a dose-dependent manner at a condition of PBMC:target cell=20:1 or 10:1. In addition, the bispecific antibody (irrelevant/CD3) obtained by linking irrelevant Ab to CD3 antibody did not induce cell death.

Example 6. Evaluation of Cell Killing Efficacy of Antibodies Against MSLN+ Tumor Cell Lines in Presence of T Cells

Example 6.1. Construction of Target Cell Lines

Two types of MSLN+ tumor cells (H226, AsPC-1) were transduced with INCUCYTE® NUCLIGHT™ Red Lentivirus Reagent (EF-1 Alpha Promoter, Puromycin selection) and treated with puromycin, so that the target cell lines, which are NUCLIGHT™ Red-transduced tumor cell lines, were finally constructed.

Example 6.2. Preparation of Target Cell Lines

The cells were harvested with 1× trypsin-EDTA solution, and centrifuged at 1,200 rpm for 5 minutes at 4° C. Subsequently, the supernatant was removed and resuspension was performed in cRPMI (RPMI, A10491-01+10% FBS+55 µM β-ME). Then, the number of cells was quantified. The respective cell line suspensions were prepared, added to 96-well plates at 10,000 cells/well, and the plates were incubated in a $CO_2$ incubator at 37° C. for one day to prepare the target cell lines.

Example 6.3. Preparation of Proliferated T Cells

Cryopreserved peripheral blood mononuclear cells (PBMCs) were rapidly thawed in a water bath at 37° C., and then transferred to a 50 ml conical tube. Thawing medium (RPMI, 11875-093+10% FBS+55 µM β-ME) was added thereto dropwise, and mixing was performed with shaking. Then, the supernatant was removed by performing centrifugation at 1,200 rpm for 10 minutes at 4° C., and suspended in MACS medium (PBS+0.5% FBS+2 mM EDTA). CD3 microbeads were added thereto depending on the number of cells, and staining was performed at 4° C. for 15 minutes. Only CD3 T cells were isolated using an LS column. The isolated CD3 T cells were suspended in X-VIVO™. Then, αCD3/28 DYNABEADS®, IL-2 (200 U/ml, PROLEUKIN®), and human plasma (5%) were added thereto, and incubation was performed in an incubator at 37° C. The number of cells was counted 4 days and 7 days after initiation of the incubation, and X-VIVO™, IL-2, and human plasma were additionally added so that the cell concentration reached $1 \times 10^6$ cells/ml.

Example 6.4. Plating of T Cells and Antibodies

The target cells were plated in wells. 24 hours later, each of the bispecific antibody (HMI323/HMI323-A15) and the trispecific antibody (Cetuximab/HMI323-A15) was diluted with cRPMI, and then diluted 1/5 starting from 20 nM (at a concentration range of 0.26 pM to 20 nM). Then, the proliferated T cells were finally prepared at a ratio of T cell:target cell=10:1 or 5:1, suspended in cRPMI, and then added to the wells.

Example 6.5. Real-Time Cell Measurement and Analysis Using IncuCyteS3

Bright field and red fluorescence were measured at 24 hours and 48 hours at 10× magnification using INCUCYTE® S3 (Essenbio) while performing incubation in a $CO_2$ incubator at 37° C. for 2 days. $IC_{50}$ values for T cell-mediated cell killing by antibodies against MSLN-expressing tumor cells are as shown in Table 8 below, and maximum effects (%) of T cell-mediated cell killing by antibodies against MSLN-expressing tumor cells are as shown in Table 9 below.

TABLE 8

| T cell: target cell | Hours | $IC_{50}$ value | |
|---|---|---|---|
| | | HMI323/ HMI323-A15 | Cetuximab/ HMI323-A15 |
| 5:1 | 24 hr | 8.57 | 0.86 |
| | 48 hr | 9.31 | 0.91 |
| 10:1 | 24 hr | 5.57 | 0.50 |
| | 48 hr | 5.78 | 0.51 |

TABLE 9

| T cell: target cell | Hours | Maximum killing effect (%) | |
|---|---|---|---|
| | | HMI323/ HMI323-A15 | Cetuximab/ HMI323-A15 |
| 5:1 | 24 hr | 96.33 | 95.28 |
| | 48 hr | 99.40 | 99.82 |
| 10:1 | 24 hr | 97.71 | 99.07 |
| | 48 hr | 99.52 | 99.95 |

As a result of the evaluation, as illustrated in FIGS. 16 to 19, it was identified that cell-killing effects of the bispecific antibody (HMI323/HMI323-A15) and the trispecific antibody (Cetuximab/HMI323-A15) against two types of MSLN- and EGFR-expressing cancer cell line (H226, AsPC-1) were exhibited in a dose-dependent manner at a condition of T cell:target cell=10:1 or 5:1. In addition, the bispecific antibody (irrelevant/CD3) obtained by linking irrelevant Ab to CD3 antibody did not induce cell death.

Example 7. Analysis of Tumor Growth Inhibition Efficacy of Antibodies in Mice To check whether the bispecific antibody (HMI323/ HMI323-A15) and the trispecific antibody (Cetuximab/ HMI323-A15), which were under development as T-cell engager antibodies, have tumor growth inhibition efficacy, these antibodies were administered to a tumor-implanted mouse model.

Example 7.1. Establishment of Cell Line Xenograft Model

Mice, which were brought into an animal room, had an acclimatization period for about a week before start of the experiment. H226 tumor cell line ($1 \times 10^7$/200 μL PBS) or AsPC-1 tumor cell line ($5 \times 10^6$/200 μL PBS) was injected subcutaneously into the axillary fossa of the mice. On day 5 after injection of the tumor cells, purified and activated human T cells were intraperitoneally injected thereinto at a ratio of T cell:tumor cell=2:1. On day 7 after injection of the tumor cells, the mice were divided into 4 groups (each group containing 5 mice), and then statistical analysis was performed. As a result, it was identified that there was no significant difference in tumor size between the groups.

Example 7.2. Antibody Administration

Starting from day 2 after injection of T cells, PBS or the antibody (HMI323/HMI323-A15 or Cetuximab/HMI323-A15) was intraperitoneally administered at a concentration of 3 mg/kg twice a week (4 times in total).

Example 7.3. Measurement of Tumor Size

From the day of grouping to the end point, the tumor size (tumor volume ($mm^3$)=short axis×long axis×height×0.5) was measured twice a week. The lengths of the short axis, the long axis, and the height were measured by the same test person using a ruler.

Example 7.4. Calculation of Tumor Growth Rate (RTV %), Relative Tumor Growth Rate (T/C %), and Tumor Growth Inhibition Rate (Inhibitory Effect)

The tumor growth rate (relative tumor volume (RTV) %) was calculated using a V1/V0 method. V1 means a volume at a time point when the experimental effect is measured, and V0 means a volume at a time point when the experiment starts. The relative tumor growth rate (T/C %) of each group is a value obtained by dividing the average tumor growth rate of each group by the average tumor growth rate of the PBS group (in which the average tumor growth rate is obtained at a time point when the measurement is performed), and then multiplying the resulting value by 100; and the tumor growth inhibition rate (inhibitory effect) is calculated as 100 minus the relative tumor growth rate. For statistical analysis, one-way ANOVA or two-way ANOVA was used depending on the type of experiment, and a case where the p value is lower than 0.05 was determined to be statistically significant.

Example 7.5. Immunohistochemistry

One week after subjecting the tumor-grown mice to treatment with the antibody (HMI323/HMI323-A15 or Cetuximab/HMI323-A15), tumor samples were removed therefrom and fixed with formalin. Thereafter, the samples were subjected to paraffin infiltration and embedding, and then a microtome was used to obtain paraffin sections. The paraffin sections were deparaffinated, hydrated, and washed; and then stained with human CD3 (anti-CD3, Abcam) or human CD8 (anti-CD8, Abcam). The tissue sections were counterstained with Mayer's hematoxylin (Dako) and observed under an Olympus BX51 microscope.

Example 7.6. End of Experiment and Results

The mice were euthanized by cervical dislocation or $CO_2$. As a result, for a mouse model xenografted with the mesothelin-overexpressing lung adenocarcinoma cell line H226, in a case where the Cetuximab/HMI323-A15 or HMI323/HMI323-A15 antibody was intraperitoneally administered thereto 4 times in total at a concentration of 3 mg/kg, all of the antibody-administered groups showed excellent tumor growth inhibition efficacy as compared with the PBS-administered group (FIGS. 20 and 21).

Immunohistochemical staining showed that infiltration of immune T cells (stained in dark color) into the tumor tissue was higher in the antibody (Cetuximab/HMI323-A15 or HMI323/HMI323-A15)-administered group than in the PBS group (FIG. 22). As shown in Table 10 below, a 100% tumor growth inhibition effect was exhibited from day 20 after tumor xenograft for Cetuximab/HMI323-A15, which is an antibody that binds to mesothelin, EGFR, and CD3, and from day 25 after tumor xenograft for HMI323/HMI323-A15, which is an antibody that binds to mesothelin and CD3.

TABLE 10

| H226 group | Inhibition rate (median) | | | | | | |
|---|---|---|---|---|---|---|---|
| | Day 7 | Day 10 | Day 13 | Day17 | Day 20 | Day 25 | Day 28 |
| HMI323/HMI323-A15 | 0% | −53% | −35% | 74% | 80% | 100% | 100% |
| Cetuximab/HMI323-A15 | 0% | −119% | −40% | 86% | 100% | 100% | 100% |

In addition, for a mouse model xenografted with AsPC-1, which is a pancreatic cancer cell line with a relatively low expression level of mesothelin relative to H226, in a case where the Cetuximab/HMI323-A15 or HMI323/HMI323-A15 antibody was intraperitoneally administered thereto 4 times in total at a concentration of 3 mg/kg, all of the antibody-administered groups similarly showed excellent tumor growth inhibition efficacy as compared with the PBS-administered group (FIGS. 23 and 24).

Immunohistochemical staining also showed that infiltration of immune T cells (stained in dark color) into the tumor tissue was higher in the antibody (Cetuximab/HMI323-A15 or HMI323/HMI323-A15)-administered group than in the PBS group (FIG. 25). As shown in Table 11 below, a 100% tumor growth inhibition effect was exhibited from day 20 after tumor xenograft for Cetuximab/HMI323-A15, which is an antibody that binds to mesothelin, EGFR, and CD3, and from day 28 after tumor xenograft for HMI323/HMI323-A15, which is an antibody that binds to mesothelin and CD3.

TABLE 11

| AsPC-1 groups | Day 7 | Day 10 | Day 13 | Day 17 | Day 20 | Day 25 | Day 28 | Day 32 |
|---|---|---|---|---|---|---|---|---|
| HMI323/HMI323-A15 | 0% | 23% | 58% | 94% | 97% | 97% | 100% | 100% |
| Cetuximab/HMI323-A15 | 0% | 26% | 57% | 95% | 100% | 100% | 100% | 100% |

Inhibition rate (median)

Example 8. PK Analysis of Antibodies in Mice

To obtain pharmacokinetics (PK) data of Cetuximab/HMI323-A15 or HMI323/HMI323-A15, which were under development as T-cell engager antibodies, PK parameters of the antibodies in mouse serum were analyzed.

Example 8.1. Obtaining of Test Solution (Mouse Serum)

The Cetuximab/HMI323-A15 or HMI323/HMI323-A15 antibody was injected into the tail vein of the mice at a concentration of 3 mg/kg. Blood collection from the retro-orbital plexus was performed at 5 minutes, 1 hour, 4 hours, 8 hours, 24 hours, 48 hours, 72 hours, 120 hours, 168 hours, 240 hours, 336 hours, 504 hours, and 672 hours after antibody injection. 100 μL of blood was collected from 3 or more animals in each group. The blood was coagulated for about 20 to 30 minutes at room temperature, and then centrifuged at 10,000 rpm for 10 minutes to separate the serum.

Example 8.2. ELISA Assay

Anti-human Fab (50 ng/100 μL/well) was added to a plate and reaction was allowed to proceed at 4° C. overnight. Then, the remaining solution was completely removed. 1% BSA/PBS solution was added thereto at 200 μL/well and reaction was allowed to proceed at room temperature for 1 hour. Then, the remaining solution was completely removed. The standard solution (standard antibody) was adjusted to 1 μg/mL using 1% serum/1% BSA/PBS solution, and then prepared by being diluted therewith by 1/2. The test solution was prepared by being diluted 100-fold with 1% BSA/PBS solution.

Each 100 μL of the prepared standard solution and test solution was dispensed into two wells for each concentration, and reaction was allowed to proceed at room temperature for one hour. After the reaction, washing was performed 3 times in total by dispensing 300 μL of PBST (0.05% TWEEN® 20) solution per well. Anti-human Fc-HRP was diluted 5000-fold with 1% BSA/PBST solution, and then 100 μL thereof was dispensed into each well. Reaction was allowed to proceed at room temperature for 1 hour. After the reaction, washing was performed 3 times in total by dispensing 300 μL of PBST (0.05% TWEEN® 20) solution per well. A TMB peroxidase substrate solution was brought to room temperature before the experiment, and 100 μL thereof was dispensed into each well. Reaction was allowed to proceed at room temperature for 30 minutes. 100 μL of TMB stop solution was dispensed into each well, gentle shaking was performed for better mixing, and then absorbance was measured at a wavelength of 450 nm.

Cetuximab/HMI323-A15, which is an antibody that binds to mesothelin, EGFR, and CD3, or HMI323/HMI323-A15, which is an antibody that binds to mesothelin and CD3, was injected at a dose of 3 mg/kg into the tail vein of nude mice. Then, the blood was collected at 5 minutes, 1 hour, 4 hours, 8 hours, 24 hours, 48 hours, 72 hours, 96 hours, 168 hours, 240 hours, 336 hours, 504 hours, and 672 hours after injection, and the antibody concentration in mouse serum was quantified by ELISA technique. The results are illustrated in FIGS. 26 and 27.

PK parameters were analyzed based on the ELISA results. As a result, it was identified that the Cetuximab/HMI323-A15 antibody had a half-life of about 207.94 hours, and the HMI323/HMI323-A15 antibody had a half-life of about 202.58 hours (Tables 12 and 13). These half-lives fall within a half-life range for common bispecific antibodies in an IgG form. In addition, the values obtained by extrapolation of the area under the curve (AUC) were 20% or lower, and thus reliability of the calculated PK parameters was ensured.

The PK parameter results for Cetuximab/HMI323-A15 are as shown in Table 12 below, and the PK parameter results for HMI323/HMI323-A15 are as shown in Table 13.

TABLE 12

| Parameter (units) | Parameter value |
|---|---|
| Material | Cetuximab/HMI323-A15 |
| Dose (mg/kg) | 3 |
| $T_{1/2}$ (h) | 207.94 ± 23.91 |
| $C_{max}$ (μg/mL) | 41.40 ± 6.87 |
| $AUC_{0-t}$ (μg · h/mL) | 4512.59 ± 601.50 |
| $AUC_{0-inf}$ (μg · h/mL) | 5071.93 ± 891.25 |
| AUC_% Extrap_obs (%) | 10.48 ± 5.43 |
| CL (mL/hr/kg) | 0.61 ± 0.11 |
| MRT (hr) | 223.19 ± 11.76 |
| Vss (mL/kg) | 180.08 ± 13.15 |

TABLE 13

| Parameter (units) | Parameter value |
|---|---|
| Material | HMI323/HMI323-A15 |
| Dose (mg/kg) | 3 |
| $T_{1/2}$ (h) | 202.58 ± 84.68 |
| $C_{max}$ (μg/mL) | 45.46 ± 5.52 |
| $AUC_{0-t}$ (μg · h/mL) | 4568.32 ± 821.75 |
| $AUC_{0-inf}$ (μg · h/mL) | 5270.89 ± 1719.18 |
| AUC_% Extrap_obs (%) | 10.65 ± 11.09 |
| CL (mL/hr/kg) | 0.61 ± 0.17 |
| MRT (hr) | 210.51 ± 30.99 |
| Vss (mL/kg) | 166.09 ± 19.28 |

The invention claimed is:

1. A multispecific antibody, comprising a first protein and a second protein,
wherein the first protein is the first fusion protein of Structural Formula 1; and
wherein the second protein is a second fusion protein of Structural Formula 2 or a third fusion protein of Structural Formula 3:

N'-A-B-L1-C-D-L2-E-F-L3-G-H-L4-I-C'    [Structural Formula 1]

wherein N' is the N-terminus of the first fusion protein,
C' is the C-terminus of the first fusion protein,
A is a light chain variable domain of an antibody that specifically binds to mesothelin (anti-mesothelin antibody), comprising light chain CDR1 of SEQ ID NO: 25, light chain CDR2 of SEQ ID NO: 26, and light chain CDR3 of SEQ ID NO: 27,
B is a light chain constant domain of the anti-mesothelin antibody,
C is a heavy chain variable domain of the anti-mesothelin antibody, comprising heavy chain CDR1 of SEQ ID NO: 28, heavy chain CDR2 of SEQ ID NO: 29, and heavy chain CDR3 of SEQ ID NO: 30,
D is a CH1 domain in heavy chain constant domains of the anti-mesothelin antibody,
E is a light chain variable domain of an antibody that specifically binds to CD3 (anti-CD3 antibody), comprising light chain CDR1 of SEQ ID NO: 31, light chain CDR2 of SEQ ID NO: 32, and light chain CDR3 of SEQ ID NO: 33,
F is a light chain constant domain of the anti-CD3 antibody,
G is a heavy chain variable domain of the anti-CD3, the domain including heavy chain CDR1 of SEQ ID NO: 34, heavy chain CDR2 of SEQ ID NO: 35, and heavy chain CDR3 of SEQ ID NO: 36,
H is a CH1 domain in heavy chain constant domains of the anti-CD3 antibody,
I is an Fc region or a variant thereof, and
each of L1, L2, L3, and L4 is a peptide linker; and N'-A-B-L1-C-D-L5-J-C'    [Structural Formula 2]

wherein N' is the N-terminus of the second fusion protein,
C' is the C-terminus of the second fusion protein,
A, B, L1, C, and D are the same as defined above with respect to Structural Formula 1;
J is an Fc region or a fragment thereof, and
L5 is a peptide linker; and N'-K-M-L6-N-O-L7-P-C'    [Structural Formula 3]

wherein N' is the N-terminus of the first fusion protein,
C' is the C-terminus of the first fusion protein,
K is a light chain variable domain of an antibody that specifically binds to EGFR (anti-EGFR antibody), comprising light chain CDR1 of SEQ ID NO: 37, light chain CDR2 of SEQ ID NO: 38, and light chain CDR3 of SEQ ID NO: 39,
M is a light chain constant domain of the anti-EGFR antibody,
N is a heavy chain variable domain of the anti-EGFR antibody, comprising heavy chain CDR1 of SEQ ID NO: 40, heavy chain CDR2 of SEQ ID NO: 41, and heavy chain CDR3 of SEQ ID NO: 42,
O is a CH1 domain in heavy chain constant domains of the anti-EGFR antibody,
P is an FC region or a fragment thereof, and
each of L6 and L7 is a peptide linker.

2. The multispecific antibody of claim 1, wherein the multispecific antibody is a bispecific antibody comprising the first fusion protein and the second fusion protein, wherein a knob modification is included in I of the first fusion protein and a hole modification is included in J of the second fusion protein; or a hole modification is included in I of the first fusion protein and a knob modification is included in J of the second fusion protein.

3. The multispecific antibody of claim 1, wherein the multispecific antibody is a trispecific antibody comprising the first fusion protein and the third fusion protein, wherein a knob modification is included in I of the first fusion protein and a hole modification is included in P of the third fusion protein; or a hole modification is included in I of the first fusion protein and a knob modification is included in P of the third fusion protein.

4. A pharmaceutical composition comprising, as an active ingredient, the multispecific antibody of claim 1.

5. A method for treating cancer in a subject in need thereof, comprising administering, to the subject, a therapeutically effective amount of the pharmaceutical composition of claim 4.

* * * * *